United States Patent
Yun et al.

(10) Patent No.: US 12,200,976 B2
(45) Date of Patent: Jan. 14, 2025

(54) DISPLAY DEVICE

(71) Applicant: Samsung Display Co., Ltd., Yongin-si (KR)

(72) Inventors: Hae Ju Yun, Hwaseong-si (KR); Min Seong Yi, Seoul (KR); Jin Yool Kim, Asan-si (KR); Jung Gun Nam, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 433 days.

(21) Appl. No.: 17/449,901

(22) Filed: Oct. 4, 2021

(65) Prior Publication Data
US 2022/0157904 A1 May 19, 2022

(30) Foreign Application Priority Data
Nov. 16, 2020 (KR) .......................... 10-2020-0152506

(51) Int. Cl.
*H10K 59/122* (2023.01)
*H10K 50/844* (2023.01)
*H10K 59/38* (2023.01)

(52) U.S. Cl.
CPC .......... *H10K 59/122* (2023.02); *H10K 50/844* (2023.02); *H10K 59/38* (2023.02)

(58) Field of Classification Search
CPC ........... H10K 59/38; H10K 50/86–868; H10K 59/121
See application file for complete search history.

(56) References Cited

U.S. PATENT DOCUMENTS 10,451,791 B2   10/2019  Yun et al.
2021/0336224 A1  10/2021  Yun
2022/0223648 A1*  7/2022  Akimoto ............... H01L 33/007

FOREIGN PATENT DOCUMENTS

KR    10-2018-0041813 A    4/2018
WO    WO-2020050467 A1 *   3/2020   ......... H01L 25/0753

OTHER PUBLICATIONS

Zhao et al. (Received Apr. 15, 2015; revised manuscript received May 4, 2015; published online May 20, 2015) "Progress and prospects of GaN-based LEDs using nanostructures," Topical Review—III-nitride optoelectronic materials and devices, Chin. Phys. B, vol. 24, No. 6, pp. 068506-1 to 068506-12; PACS: 85.60.Jb, 62.23.St, 78.66.Fd, 81.07.-b; DOI: 10.1088/1674-1056/24/6/068506.

* cited by examiner

*Primary Examiner* — Evan G Clinton
(74) *Attorney, Agent, or Firm* — Lewis Roca Rothgerber Christie LLP

(57) ABSTRACT

A display device includes a base substrate; an outer bank on the base substrate and including an opening defining an emission area; a light-emitting element including at least an active layer and extending in a first direction in the emission area; a color mixing prevention member on the outer bank and having an opening defining a transmitting area; and a color control layer in the opening defined by the color mixing prevention member, wherein the transmitting area includes a first side at one side in the first direction and a second side at an opposite side in the first direction when viewed from top, and wherein a first distance between a first reference line and the first side of the transmitting area is equal to a second distance between the second side of the transmitting area and the first reference line.

21 Claims, 33 Drawing Sheets

DISPLAY DEVICE

CROSS-REFERENCE TO RELATED APPLICATION

This application claims priority to and the benefit of Korean Patent Application No. 10-2020-0152506 filed on Nov. 16, 2020 in the Korean Intellectual Property Office, the disclosure of which is incorporated herein by reference in its entirety.

BACKGROUND

1. Field

The present disclosure relates to a display device.

2. Description of the Related Art

Display devices become more and more important as multimedia technology evolves. Accordingly, a variety of display devices such as organic light-emitting diode (OLED) display devices and liquid-crystal display (LCD) devices are currently used.

Display devices are for displaying images and include a display panel such as a light-emitting display panel or a liquid-crystal display panel. Among them, light-emitting display panel may include light-emitting elements. For example, light-emitting elements may include an organic light-emitting element using an organic material as a luminescent material and an inorganic light-emitting element using an inorganic material as a luminescent material.

SUMMARY

Aspects of embodiments of the present disclosure provide a display device with increased light emission efficiency.

It should be noted that aspects and features of embodiments of the present disclosure are not limited to the above-mentioned aspects and features, and other aspects and features of embodiments of the present disclosure will be apparent to those skilled in the art from the following descriptions.

According to an aspect of embodiments of the present disclosure, there is provided a display device, including: a base substrate; an outer bank on the base substrate and having an opening defining an emission area; a light-emitting element comprising at least an active layer and extending in a first direction in the emission area; an color mixing prevention member on the outer bank and having an opening defining a transmitting area; and a color control layer in the opening defined by the anti-color mixing member, wherein the transmitting area comprises a first side at one side in the first direction and a second side at an opposite side in the first direction when viewed from top, and wherein a first distance between a first reference line passing through a center of the active layer of the light-emitting element in a second direction perpendicular to the first direction and the first side of the transmitting area is equal to a second distance between the second side of the transmitting area and the first reference line.

In an embodiment, the emission area comprises a first side at the one side in the first direction and a second side at the opposite side in the first direction when viewed from the top, and wherein a distance between the first side of the emission area and the first side of the transmitting area is equal to a distance between the second side of the emission area and the second side of the transmitting area.

In an embodiment, a distance between the first side of the emission area and the first reference line is equal to a distance between the second side of the emission area and the first reference line.

In an embodiment, the active layer is located closer to the one side in the first direction from a center of the light-emitting element, and wherein a distance between the first side of the emission area and the light-emitting element is different from a distance between the second side of the emission area and the light-emitting element.

In an embodiment, the emission area comprises a first side at the one side in the first direction and a second side at the opposite side in the first direction when viewed from the top, and wherein a distance between the first side of the emission area and the light-emitting element is equal to a distance between the second side of the emission area and the light-emitting element.

In an embodiment, the active layer is located closer to the one side in the first direction from a center of the light-emitting element, and wherein a distance between the first side of the emission area and the first side of the transmitting area is different from a distance between the second side of the emission area and the second side of the transmitting area.

In an embodiment, the first reference line overlaps with a second reference line that equally divides the transmitting area in the first direction.

According to an aspect of the present disclosure, there is provided a display device, including: a base substrate; an outer bank on the base substrate and having an opening defining an one emission area; first and second light-emitting elements each extending in a first direction in the emission area and comprising at least an active layer; a color mixing prevention member on the outer bank and having an opening defining a transmitting area; and a color control layer in the opening partitioned by the color mixing prevention member, wherein the transmitting area comprises a first side at one side in the first direction and a second side at an opposite side in the first direction when viewed from top, wherein the first light-emitting element is adjacent to the first side of the transmitting area, and the second light-emitting element is adjacent to the second side of the transmitting area, wherein the first light-emitting element and the second light-emitting element are spaced from each other in the first direction, wherein a first reference line of the first light-emitting element passes through a center of the active layer of the first light-emitting element in a second direction perpendicular to the first direction, wherein a first reference line of the second light-emitting element passes through a center of the active layer of the second light-emitting element in the second direction, and wherein a first distance between the first reference line of the first light-emitting element and the first side of the transmitting area is equal to a second distance between the first reference line of the second light-emitting element and the second side of the transmitting area.

In an embodiment, the first light-emitting element and the second light-emitting element are spaced from each other in the first direction.

In an embodiment, the emission area comprises a first side at the one side in the first direction and a second side at the opposite side in the first direction when viewed from the top, and wherein a distance between the first side of the emission area and the first side of the transmitting area is equal to a distance between the second side of the emission area and the second side of the transmitting area.

In an embodiment, a distance between the first side of the emission area and the first reference line of the first light-emitting element is equal to a distance between the second side of the emission area and the first reference line of the second light-emitting element.

In an embodiment, the active layer of the first light-emitting element is located closer to the one side in the first direction with respect to the center of the first light-emitting element, wherein a first reference line of the second light-emitting element passes through a center of the active layer of the second light-emitting element in the second direction, and wherein a first distance between the first reference line of the first light-emitting element and the first side of the transmitting area is equal to a second distance between the first reference line of the second light-emitting element and the second side of the transmitting area.

In an embodiment, the emission area comprises a first side at the one side in the first direction and a second side at the opposite side in the first direction when viewed from the top, and wherein a distance between the first side of the emission area and the first light-emitting element is equal to a distance between the second side of the emission area and the second light-emitting element.

In an embodiment, the active layer of the first light-emitting element is located closer to the one side in the first direction with respect to the center of the first light-emitting element, wherein the active layer of the second light-emitting element is located closer to the one side in the first direction with respect to the center of the second light-emitting element, wherein the active layers of the first and second light-emitting elements face in a same direction, and wherein a distance between the first side of the emission area and the first side of the transmitting area is different from a distance between the second side of the emission area and the second side of the transmitting area.

In an embodiment, the first light-emitting element and the second light-emitting element are spaced from each other in the second direction perpendicular to the first direction.

In an embodiment, each of the first reference line of the first light-emitting element and the first reference line of the second light-emitting element overlaps with a second reference line that equally divides the transmitting area in the first direction.

According to an aspect of the present disclosure, there is provided a display device, including: a base substrate; an outer bank on the base substrate and having an opening defining an one emission area; a light-emitting element extending in a first direction in the emission area and comprising an active layer; a color mixing prevention member on the outer bank and having an opening defining a transmitting area; and a color control layer in the opening partitioned by the color mixing prevention member, wherein a first reference line passing through a center of the active layer in a second direction perpendicular to the first direction overlaps with a second reference line equally dividing the transmitting area in the first direction.

In an embodiment, a distance between a first end of the light-emitting element and the first reference line is different from a distance between a second end of the light-emitting element and the first reference line.

In an embodiment, a third reference line equally dividing the emission area in the first direction overlaps with the second reference line.

In an embodiment, the emission area comprises a first side at one side in the first direction and a second side at an opposite side in the first direction when viewed from top, wherein the first end of the light-emitting element is spaced from and faces the first side of the emission area, wherein the second end of the light-emitting element is spaced from and faces the second side of the emission area, and wherein a distance between the first side of the emission area and the first end of the light-emitting element is different from a distance between the second side of the emission area and the second end of the light-emitting element.

In an embodiment, the emission area comprises a first side at one side in the first direction and a second side at an opposite side in the first direction when viewed from top, wherein the first end of the light-emitting element is spaced from and faces the first side of the emission area, wherein the second end of the light-emitting element is spaced from and faces the second side of the emission area, and wherein a distance between the first side of the emission area and the first end of the light-emitting element is equal to a distance between the second side of the emission area and the second end of the light-emitting element.

In an embodiment, the transmitting area comprises a first side at the one side in the first direction and a second side at the opposite side in the first direction when viewed from the top, and wherein a distance between the first side of the emission area and the first side of the transmitting area is different from a distance between the second side of the emission area and the second side of the transmitting area.

The details of one or more embodiments of the subject matter described in this specification are set forth in the accompanying drawings and the description below.

According to an embodiment of the present disclosure, the light emission efficiency of a display device can be improved by efficiently adjusting the alignment of light-emitting elements of a first display substrate with color control layers of a second display substrate.

It should be noted that aspects and features of embodiments of the present disclosure are not limited to those described above and other aspects and features of embodiments of the present disclosure will be apparent to those skilled in the art from the following descriptions.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
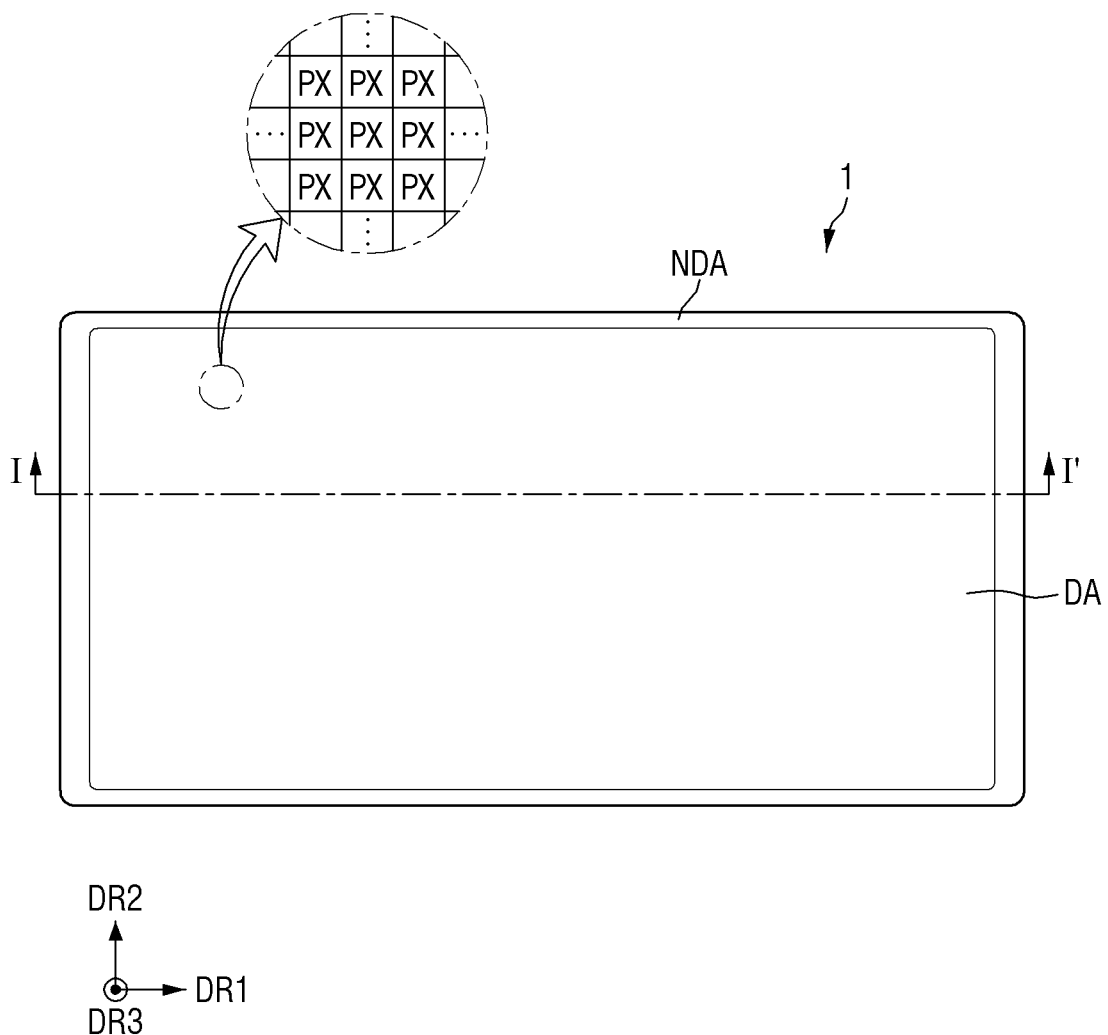
FIG. 1 is a perspective view of a display device according to an embodiment of the present disclosure.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the accompanying drawings. "Reference lines" as used in the present disclosure refer to imaginary lines that do not form any part of a design or structure according to embodiment of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

FIG. 1 is a perspective view of a display device according to an embodiment of the present disclosure.

Referring to FIG. 1, a display device 1 displays a moving image or a still image. The display device 1 may refer to any electronic device that provides a display screen. For example, the display device 1 may include a television set, a laptop computer, a monitor, an electronic billboard, the Internet of Things (IoT) devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 1 includes a display panel for providing a display screen. Examples of the display panel may include an inorganic light-emitting element display panel, an organic light-emitting display panel, a quantum-dot light-emitting display panel, a plasma display panel, a field emission display panel, etc. In the following description, an inorganic light-emitting element display panel is employed as an example of the display panel 10, but the present disclosure is not limited thereto. Any other display panel may be employed as long as the technical idea of the present disclosure can be equally applied.

In the drawings, a first direction DR1, a second direction DR2, and a third direction DR3 are defined. The first direction DR1 may be perpendicular to the second direction DR2 in a plane The third direction DR3 may be perpendicular to the plane where the first direction DR1 and the second direction DR2 are located. The third direction DR3 may be perpendicular to each of the first direction DR1 and the second direction DR2. In the following description of the display device 1 according to the embodiments of the present disclosure, the third direction DR3 refers to the thickness direction of the display device 1.

The display device 1 may have a rectangular shape including longer sides in the first direction DR1 and shorter sides in the second direction DR2 when viewed from the top. Although the corners where the longer sides and the shorter sides of the display device 1 meet may form a right angle, this is merely illustrative. The display device 1 may have rounded corners. The shape of the display device 1 is not limited to that shown but may be modified in a variety of ways. For example, the display device 1 may have other shapes such as a square, a rectangle with rounded corners (vertices), other polygons and a circle.

A display surface of the display device 1 may be located on one side of the display device 1 in the third direction DR3, i.e., the thickness direction. In the following description, the upper portion of the display device 1 refers to a side in the third direction DR3 where images are displayed, and the upper surface of the display device 1 refers to a surface at a side facing in the third direction DR3, unless specifically stated otherwise. In addition, the lower portion of the display device 1 refers to the opposite side in the third direction DR3, and likewise the lower surface of the display device 1 refers to a surface opposite the upper surface of the display device 1 in the third direction DR3. As used herein, the terms "left," "right," "upper" and "lower" sides refer to relative positions when the display device 1 is viewed from the top. For example, the right side refers to one side in the first direction DR1, the left side refers to the other side in the first direction DR1 that is opposite to the right side, the upper side refers to one side in the second direction DR2, and the lower side refers to the other side in the second direction DR2 that is opposite to the upper side.

The display device 1 may include the display area DA and a non-display area NDA surrounding the display area DA along the edge or periphery of the display area DA. In the display area DA images can be displayed. In the non-display area NDA images are not displayed. The display area DA may be referred to as an active area, while the non-display area NDA may be referred to as an inactive area.

The shape of the display area DA may follow the shape of the display device 1. For example, the shape of the display area DA may have a rectangular shape generally similar to the shape of the display device 1 when viewed from the top. The display area DA may generally occupy the center (or the central region) of the display device 1.

The display area DA may include a plurality of pixels PX. The plurality of pixels PX may be arranged in a matrix. The shape of each of the pixels PX may be rectangular or square when viewed from the top. It is, however, to be understood that the present disclosure is not limited thereto. The shape of each of the pixels PX may have a diamond shape having the sides inclined with respect to one direction. The pixels PX may be arranged in stripes or a PENTILE® arrangement structure in the display area DA, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PX is not limited thereto, and the pixels PX may be arranged in the display area DA in various suitable structures and/or manners.

The non-display areas NDA may be disposed around the display area DA. The non-display area NDA may surround the display area DA entirely or partially. According to an embodiment of the present disclosure, the display area DA may have a rectangular shape, and the non-display areas NDA may be disposed to be adjacent to the four sides of the display area DA. The non-display area NDA may form the bezel of the display device 1. Lines, circuit drivers included in the display device 1, or pad areas on which external devices are mounted may be disposed in the non-display areas NDA.

Figure 2:
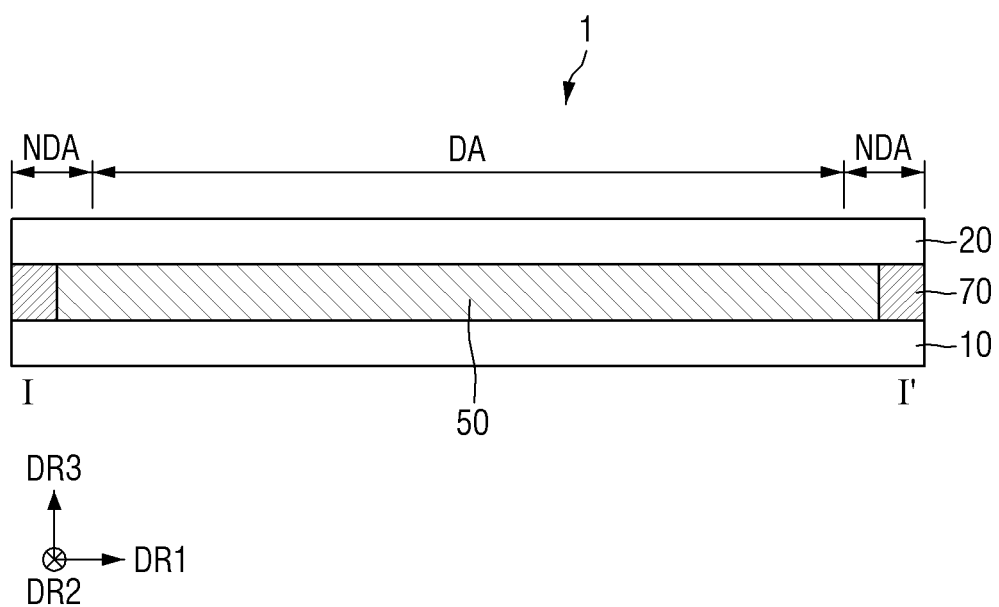
FIG. 2 is a cross-sectional view of an example of a display device, taken along the line I-I' of FIG. 1.

FIG. 2 is a cross-sectional view of an example of a display device, taken along the line I-I' of FIG. 1.

Referring to FIGS. 1 and 2, the display device 1 may include a first display substrate 10 and a second display substrate 20 facing the first display substrate 10. The display device 1 may further include a sealing member 70 that couples the first display substrate 10 with the second display substrate 20, and a filling layer 50 used to fill between the first display substrate 10 and the second display 20. In other words, the first display substrate 10 and the second display substrate 20 are at opposite sides of the filling layer 50.

The first display substrate 10 may output light (e.g., light having a set or predetermined peak wavelength) from a plurality of emission areas in the display area DA. The first display substrate 10 may include elements and circuits for displaying images. For example, the first display substrate 10 may include pixel circuits such as switching elements, and self-light-emitting elements disposed in the display area DA.

For example, the self-light-emitting element may include at least one of an organic light-emitting element, a quantum-dot light-emitting element, an inorganic-based micro light-emitting element (e.g., quantum dot micro LED), and an inorganic-based nano light-emitting element (e.g., quantum dot nano LED). In the following description, the self-light-emitting element is an inorganic material-based light-emitting element as an example.

The sealing member 70 may be disposed in the non-display area NDA. The sealing member 70 may be disposed between the first display substrate 10 and the second display substrate 20 in the non-display area NDA. The sealing member 70 may be disposed in the non-display area NDA along the edges of the first display substrate 10 and the second display substrate 20 to surround the display area DA when viewed from the top. The first display substrate 10 and the second display substrate 20 may be coupled to each other through the sealing member 70. In some embodiments, the sealing member 70 may include an organic material. For example, the sealing member 70 may be made of, but is not limited to, an epoxy resin.

The filling layer 50 may be disposed in the space between the first display substrate 10 and the second display substrate 20 surrounded by the sealing member 70. The space between the first display substrate 10 and the second display substrate 20 may be filled with the filling layer 50. The filling layer 50 may be made of a material that transmits light. In some embodiments, the filling layer 50 may contain an organic material. For example, the filling layer 50 may be made of, but is not limited to, a silicon-based organic material, an epoxy-based organic material, etc.

Although the display device 1 includes the first display substrate 10, the second display substrate 20 facing (or opposite) the first display substrate 10, the filling layer 50 disposed therebetween, and the sealing member 70 in the example shown in FIG. 2, the present disclosure is not limited thereto. In some other embodiments, the second display substrate 20 may be stacked on the first display substrate 10 in a display device, and the filling layer 50 and the sealing member 70 not be used. More detailed description thereon will be made below with reference to the other drawings.

Figure 3:
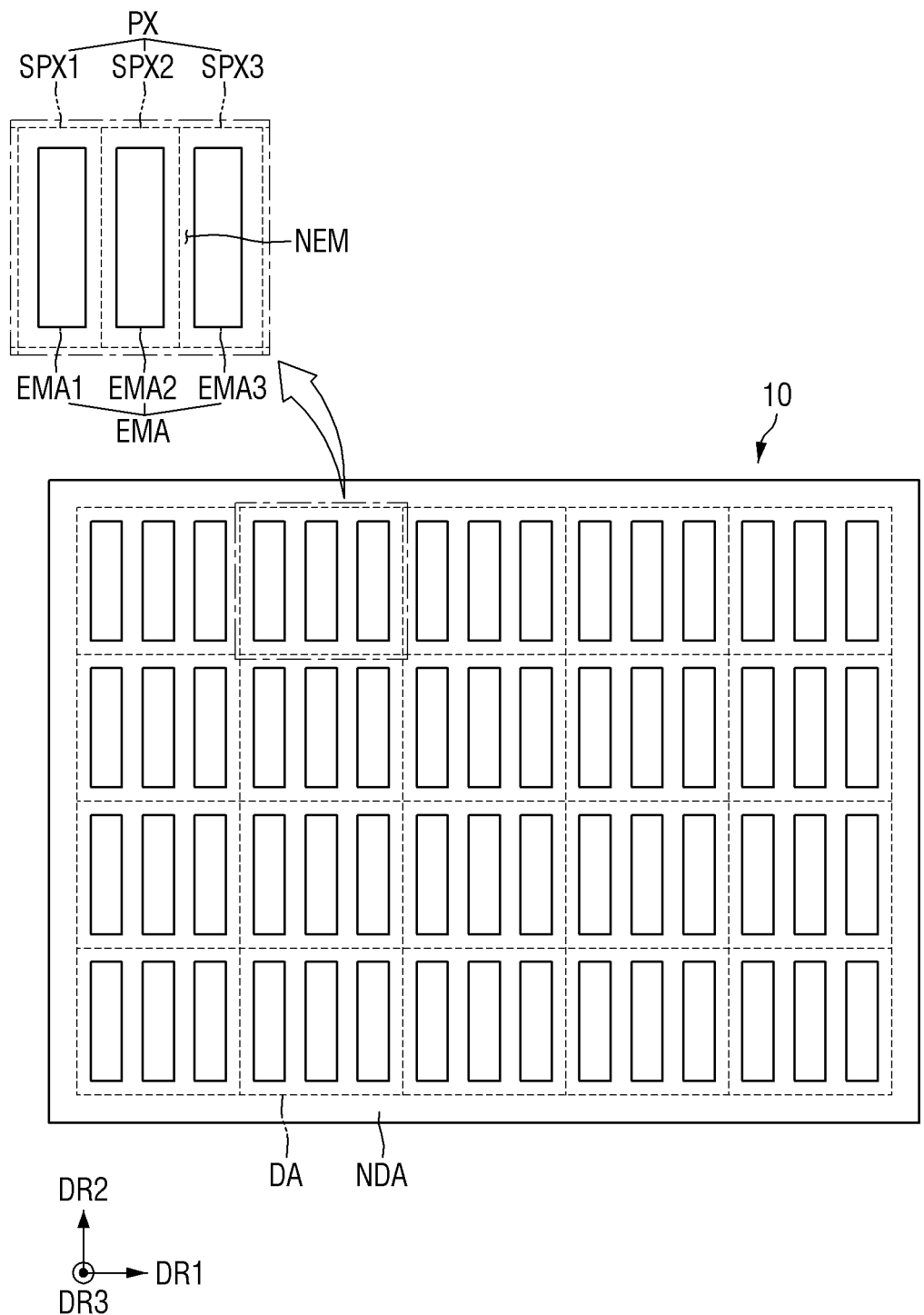
FIG. 3 is a view schematically showing an arrangement of pixels on a first display substrate according to an embodiment.
Figure 4:
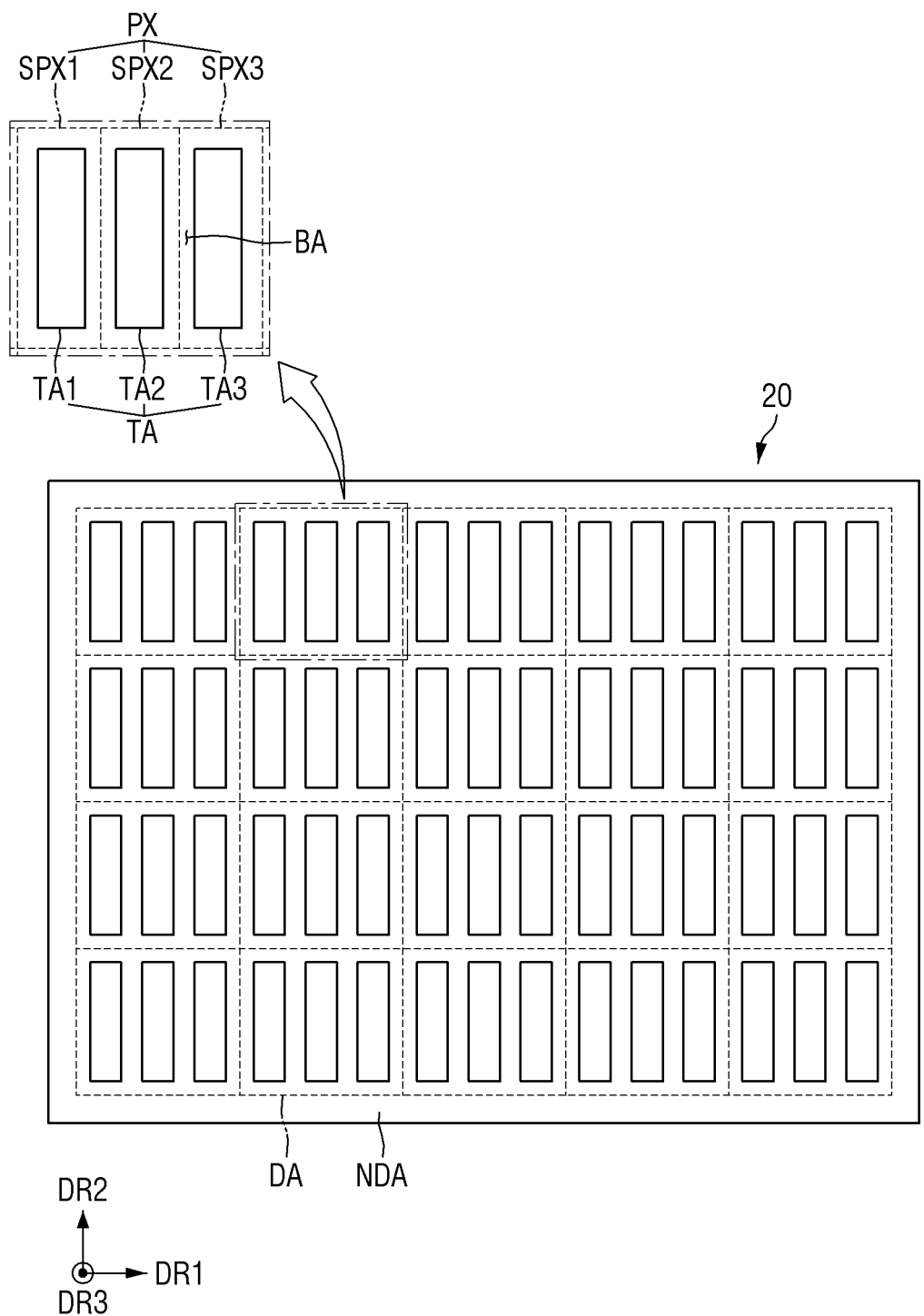
FIG. 4 is a view schematically showing an arrangement of pixels on a second display substrate according to an embodiment.

FIG. 3 is a view schematically showing an arrangement of pixels on a first display substrate according to an embodiment. FIG. 4 is a view schematically showing an arrangement of pixels on a second display substrate according to an embodiment.

Referring to FIGS. 3 and 4, the display area DA of the display device 1 includes a plurality of pixels PX arranged in rows and columns. Each of the pixels PX refers to a repeating minimum unit for displaying images. In order to display full color, each of the pixels PX may include a plurality of sub-pixels SPX: SPX1, SPX2, and SPX3 that emits different colors. The sub-pixels SPX may be sequentially and repeatedly arranged in the order of the first sub-pixel SPX1, the second sub-pixel SPX2, and the third sub-pixel SPX3 in the first direction DR1. According to an embodiment of the present disclosure, each of the pixels PX may include a first sub-pixel SPX1 responsible for emitting light of a first color, a second sub-pixel SPX2 responsible for emitting light of a second color, and a third sub-pixel SPX3 responsible for emitting light of a third color. For example, the first color may be red, the second color may be green, and the third color may be blue.

Referring to FIG. 3, each of the sub-pixels SPX of the first display substrate 10 may include an emission area EMA and a non-emission area NEM around it.

In the emission area EMA, the light generated in the first display substrate 10 exits to the outside of the first display substrate 10. In the non-emissive area NEM, the light generated in the first display substrate 10 does not exit to the outside of the first display substrate 10.

The non-emission area NEM of a sub-pixel SPX meets the non-emission area NEM of an adjacent sub-pixel SPX (regardless of whether the adjacent sub-pixel SPX is in the same pixel PX). The non-emission areas NEM of the adjacent sub-pixels SPX may be connected to each other as one, and further, the non-emission areas NEM of all sub-pixels SPX may be connected to one another as one. It is, however, to be understood that the present disclosure is not limited thereto. The emission areas EMA of the adjacent sub-pixels SPX may be divided by the non-emission areas NEM. The emission area EMA and the non-emission area NEM of each of the sub-pixels SPX may be defined by an opening partitioned by an outer bank OBK (see FIG. 6) disposed in the non-emission area NEM to be described later.

The emission areas EMA: EMA1, EMA2, and EMA3 may include a first emission area EMA1, a second emission area EMA2, and a third emission area EMA3. The first to third emission areas EMA1, EMA2, and EMA3 may be the emission areas EMA of the first to third sub-pixels SPX1, SPX2, and SPX3, respectively. For example, the first emission area EMA1 may be the emission area EMA of the first sub-pixel SPX1, the second emission area EMA2 may be the emission area EMA of the second sub-pixel SPX2, and the third emission area EMA3 may be the emission area EMA of the third sub-pixel SPX3.

Light exiting to the outside of the first display substrate 10 from the first to third emission areas EMA1, EMA2, and EMA3 may have a suitable peak wavelength (e.g., a set or predetermined peak wavelength). For example, the first to third emission areas EMA1, EMA2, and EMA3 may emit blue light. Light exiting from the first to third emission areas EMA1, EMA2, and EMA3 may have a peak wavelength in the range of 440 nm to 480 nm. It is, however, to be understood that the present disclosure is not limited thereto. Lights exiting to the outside from the first to third emission areas EMA1, EMA2, and EMA3 may be different from each other. For example, the first to third emission areas EMA1, EMA2, and EMA3 may emit red light, green light, and blue light, respectively.

The first to third emission areas EMA1, EMA2, and EMA3 may be sequentially and repeatedly arranged along the first direction DR1 in the display area DA of the first display substrate 10. The shape of the first to third emission areas EMA1, EMA2, and EMA3 may be, but is not limited to, a rectangle having the width in the second direction DR2 larger than the width in the first direction DR1.

According to an embodiment of the present disclosure, the width of the first emission area EMA1 in the first direction DR1, the width of the second emission area EMA2 in the first direction DR1, and the width of the third emission area EMA3 in the first direction DR1 may be substantially all equal. It is to be noted that the relationships among the widths of the first to third emission areas EMA1, EMA2, and EMA3 in the first direction DR1 are not limited to the embodiment shown in FIG. 3. For example, the width of the first emission area EMA1 in the first direction DR1, the width of the second emission area EMA2 in the first direction DR1, and the width of the third emission area EMA3 in the first direction DR1 may be different from one another.

Referring to FIG. 4, each of the sub-pixels SPX of the second display substrate 20 may include a transmitting area TA and a blocking area BA around it.

In the transmitting area TA, the light generated in the first display substrate 10 may transmit the second display substrate 20 to exit to the outside of the display device 1. In the blocking area BA, the light exiting from the first display substrate 10 is blocked (e.g., the light is not transmitted to the outside.

The blocking area BA of a sub-pixel SPX meets the blocking area BA of an adjacent sub-pixel SPX (regardless of whether the adjacent sub-pixel SPX is in the same pixel PX). The blocking areas BA of the adjacent sub-pixels SPX may be connected to each other as one, and further, the blocking areas BA of all sub-pixels SPX may be connected to one another as one. It is, however, to be understood that the present disclosure is not limited thereto. The transmitting areas TA of the adjacent sub-pixels SPX may be distinguished by the blocking areas BA. The transmitting area TA and the blocking area BA of each of the sub-pixels SPX may be defined by an opening partitioned by a light-absorbing member UAB (see FIG. 6) disposed in the blocking area BA to be described later.

The transmitting areas TA: TA1, TA2, and TA3 may include a first transmitting area TA1, a second transmitting area TA2, and a third transmitting area TA3. The first to third transmitting areas TA1, TA2, and TA3 may be the transmitting areas TA of the first to third sub-pixels SPX1, SPX2, and SPX3, respectively. For example, the first transmitting area TA1 may be the transmitting area TA of the first sub-pixel SPX1, the second transmitting area TA2 may be the transmitting area TA of the second sub-pixel SPX2, and the third transmitting area TA3 may be the transmitting area TA of the third sub-pixel SPX3.

The light exiting from the first display substrate 10 may pass through the first to third transmitting areas TA1, TA2, and TA3 of the second display substrate 20 to exit to the outside. According to an embodiment of the present disclosure, the light exiting from the first display substrate 10 may be light of the third color, the first transmitting area TA1 may output light of the first color, the second transmitting area TA2 may output light of the second color, and the third transmitting area TA3 may output light of the third color. For example, the first color may be red, the second color may be green, and the third color may be blue.

The first to third transmitting areas TA1, TA2, and TA3 may be sequentially and repeatedly arranged along the first direction DR1 in the display area DA of the second display substrate 20. The shape of the first to third transmitting areas TA1, TA2, and TA3 may be, but is not limited to, a rectangle having the width in the second direction DR2 larger than the width in the first direction DR1.

According to an embodiment of the present disclosure, the width of the first transmitting area TA1 in the first direction DR1, the width of the second transmitting area TA2 in the first direction DR1, and the width of the third transmitting area TA3 in the first direction DR1 may be substantially all equal. It is to be noted that the relationships among the widths of the first to third transmitting areas TA1, TA2, and TA3 in the first direction DR1 are not limited to the embodiment shown in FIG. 4. For example, the width of the first transmitting area TA1 in the first direction DR1, the width of the second transmitting area TA2 in the first direction DR1, and the width of the third transmitting area TA3 in the first direction DR1 may be different from one another.

Although a plurality of sub-pixels SPX included in each pixel PX are arranged in a stripe type in the example shown in FIGS. 3 and 4, the arrangement of the plurality of sub-pixels SPX is not limited thereto. For example, the plurality of sub-pixels SPX included in a pixel PX may include first to fourth sub-pixels emitting lights of first to fourth colors, respectively, and the first and second sub-pixels may be arranged in the first column while the third and fourth sub-pixels may be arranged in the second column, as the PENTILE® matrix. The first color may be red, the second color may be blue, and the third and fourth colors may be green (RGBG matrix). In addition, the plurality of sub-pixels SPX included in a pixel PX may include first to eighth sub-pixels emitting lights of first to eighth colors, respectively. The first and second sub-pixels may be arranged in the first column, the third and fourth sub-pixels may be arranged in the second column, the fifth and sixth sub-pixels may be arranged in the third column, and the seventh and eighth sub-pixels may be arranged in the fourth column, as the PENTILE® matrix. The first and sixth colors may be red, the second and fifth colors may be blue, and the third, fourth, seventh, and eighth colors may be green (RGBG/BGRG arrangement).

Figure 5:
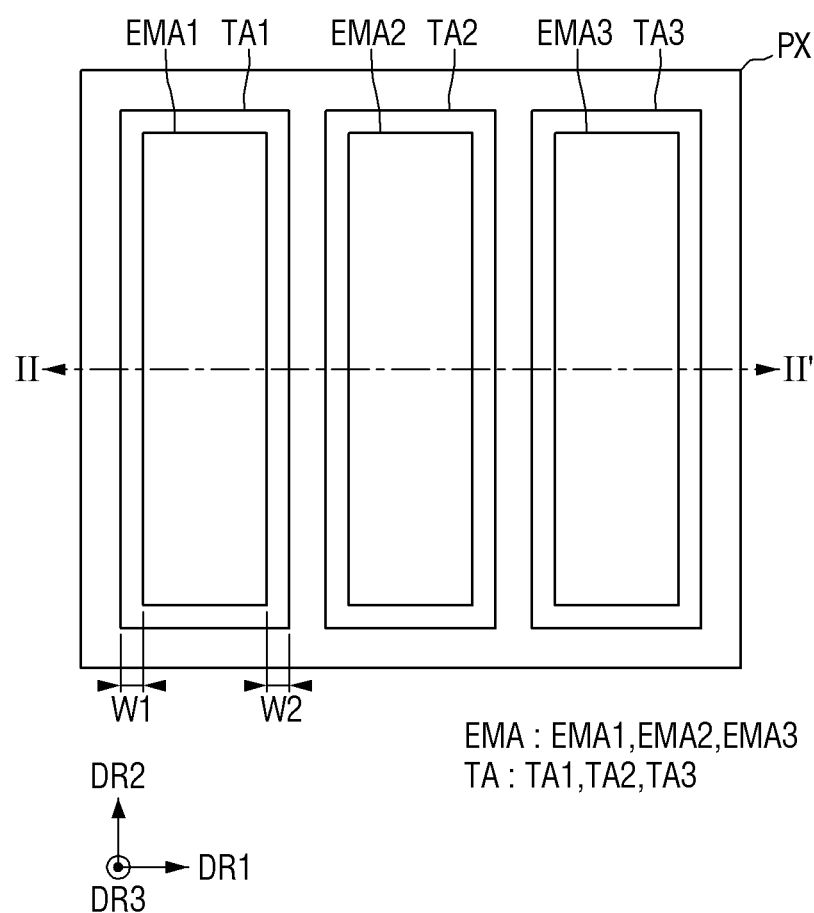
FIG. 5 is a plan view showing a relative arrangement of emission areas and transmitting areas included in one pixel of a display device according to an embodiment.

FIG. 5 is a plan view showing a relative arrangement of emission areas and transmitting areas included in one pixel of a display device according to an embodiment.

Referring to FIGS. 3-5, the transmitting areas TA of each of the sub-pixels SPX may correspond to the emission areas EMA thereof, respectively. For example, the first transmitting area TA1 may correspond to the first emission area EMA1, the second transmitting area TA2 may correspond to the second emission area EMA2, and the third transmitting area TA3 may correspond to the third emission area EMA3. When viewed from the top, the first transmitting area TA1 may overlap the first emission area EMA1 in the third direction DR3 and may have a larger area than the first emission area EMA1. Likewise, when viewed from the top, the second transmitting area TA2 may overlap the second emission area EMA2 in the third direction DR3 and may have a larger area than the second emission area EMA2. In addition, when viewed from the top, the third transmitting area TA3 may overlap the third emission area EMA3 in the third direction DR3 and may have a larger area than the third emission area EMA3. It is, however, to be understood that the present disclosure is not limited thereto. The areas of first to third transmitting areas TA1, TA2 and TA3 may be equal to the areas of the first to third emission areas EMA1, EMA2 and EMA3, respectively, when viewed from the top.

According to an embodiment of the present disclosure, the emission areas EMA of the first display substrate 10 may be disposed at the center (or the central region) of the transmitting areas TA of the second display substrate 20, respectively. In other words, when the emission areas EMA are smaller than the transmitting areas TA, the widths between the sides of the emission areas EMA and the corresponding sides of the transmitting areas TA may be generally uniform along the border when they overlap each other. For example, the width W1 between the left side of the emission area EMA and the left side of the transmitting area TA may be equal to the width W2 between the right side of the emission area EMA and the right side of the transmitting area TA.

Figure 6:
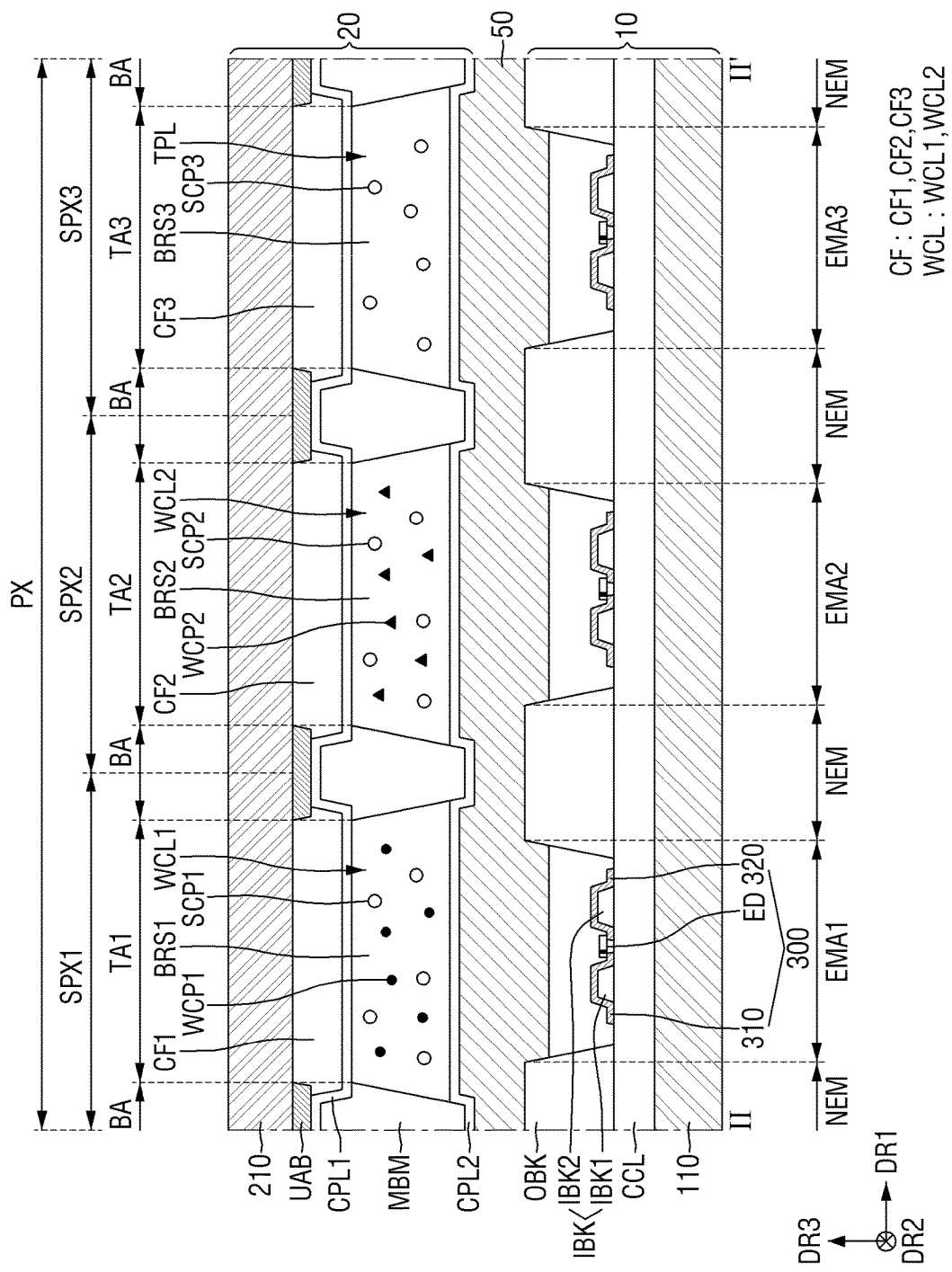
FIG. 6 is a cross-sectional view of the display device of FIG. 5 taken along the line II-II' of FIG. 5.

FIG. 6 is a cross-sectional view of the display device, taken along the line II-II' of FIG. 5.

Referring to FIGS. 5 and 6, the first display substrate 10 may include a first base substrate 110, a circuit layer CCL disposed on the first base substrate 110, and a plurality of light-emitting elements ED, an outer bank OBK, and an electrode layer 300 disposed on the circuit layer CCL.

The cross-sectional structure of the first display substrate 10 will be described from the bottom to the top, i.e., in the third direction DR3 in the drawings. The first base substrate 110 may be an insulating substrate. The first base substrate 110 may include a transparent material. For example, the first base substrate 110 may include a transparent insulating material such as glass and quartz. The first base substrate 110 may be a rigid substrate. The first base substrate 110 is not limited by those listed above. The first base substrate 110 may include plastic such as polyimide (PI) and may have flexible characteristics so that it can be curved, bent, folded or rolled.

The circuit layer CCL for driving the pixel PX (or the sub-pixels SPX) may be disposed on a surface of the first base substrate 110. The circuit layer CCL may be disposed between the plurality of light-emitting elements ED to be described later and the first base substrate 110. The circuit layer CCL will be described in more detail later with reference to FIG. 8.

The outer bank OBK may be disposed along the boundary of each of the sub-pixels SPX on the surface of the circuit layer CCL. The outer bank OBK may include an opening exposing inner banks IBK and the plurality of light-emitting elements ED. As used herein, the expression that "element A is exposed by element B" refers to that element A is disposed at a position where element B has been removed, and does not exclude that element A is covered by another element in actual implementations. Accordingly, the expression that "an outer bank OBK includes an opening exposing inner banks IBK and a plurality of light-emitting element ED" refers to that the inner banks IBK and the plurality of light-emitting element ED are disposed at the position where the outer bank OBK has been removed.

The emission areas EMA: EMA1, EMA2, EMA3 and the non-emission area NEM may be distinguished by the outer bank OBK and its opening. In other words, the outer bank OBK may be disposed along the boundary of each of the sub-pixels SPX to define the emission area EMA and the non-emission area NEM of the first display substrate 10.

The outer bank OBK may have a shape protruding in the third direction DR3 in cross section. The outer bank OBK may have inclined side surfaces. The emission area EMA and the non-emission area NEM of the first display substrate 10 may be defined by the opening partitioned by the inclined side surfaces of the outer bank OBK. The emission area EMA and the non-emission area NEM may be defined based on the upper side of the outer bank OBK in cross section, but the present disclosure is not limited thereto.

The outer bank OBK may be disposed along the boundary of each of the sub-pixels SPX to prevent an ink in which a plurality of light-emitting elements ED is dispersed from overflowing to the adjacent sub-pixels SPX during an inkjet printing process using the ink.

The inner banks IBK, the electrode layer 300, and the plurality of light-emitting elements ED may be disposed in the opening partitioned by the outer bank OBK.

The inner banks IBK may be disposed on the circuit layer CCL exposed by the outer bank OBK. The inner banks IBK may be disposed in each of the first to third emission areas EMA1, EMA2, and EMA3, which are the emission areas EMA of the first to third sub-pixels SPX1, SPX2, and SPX3, respectively. The inner banks IBK may be disposed in the opening defined by the outer bank OBK and may be spaced from the outer bank OBK.

According to an embodiment of the present disclosure, the inner banks IBK may include a first inner bank IBK1 and a second inner bank IBK2. The first inner bank IBK1 and the second inner bank IBK2 may be arranged such that they are spaced from each other along the first direction DR1. Although the inner banks IBK included in one sub-pixel SPX includes two inner banks IBK1 and IBK2 spaced from each other in the drawings, the inner banks IBK may include three or more inner banks IBK.

The electrode layer 300 may be disposed on the inner bank IBK. The electrode layer 300 may include a first electrode 310 and a second electrode 320.

The first electrode 310 may be disposed on the first inner bank IBK1 to cover the first inner bank IBK1. The second electrode 320 may be disposed on the second inner bank IBK2 to cover the second inner bank IBK2. The first electrode 310 and the second electrode 320 may be electrically insulated from each other.

The light-emitting elements ED may be disposed between the first inner bank IBK1 and the second inner bank IBK2. The light-emitting elements ED may be disposed between the first inner bank IBK1 and the second inner bank IBK2 so that their ends are placed on the first electrode 310 and the second electrode 320, respectively. The plurality of light-emitting elements ED may be disposed in the emission area EMA of each of the sub-pixels SPX.

First ends of the light-emitting elements ED may be electrically connected to the first electrode 310, and second ends of the light-emitting elements ED may be electrically connected to the second electrode 320. Each of the plurality of light-emitting elements ED may include an active layer 36 (see FIG. 9) and may emit light when an electric signal is applied through the first electrode 310 and the second electrode 320.

According to an embodiment of the present disclosure, the light-emitting elements ED disposed in each of the first to third emission areas EMA1, EMA2, and EMA3 may include the active layer 36 having the same material to emit light of the same color. In this instance, light emitted from each of the first to third emission areas EMA1, EMA2, and EMA3 may have the same color. For example, the plurality of light-emitting elements ED may emit light of the third color or blue light having a peak wavelength in the range of 440 nm to 480 nm. Each of the first to third emission areas EMA1, EMA2, and EMA3 may emit light of the third color or blue light.

According to some other embodiments, the light-emitting elements ED disposed in each of the first to third emission areas EMA1, EMA2, and EMA3 may include the active layer 36 having different materials to emit light of different colors. In this instance, light emitted from each of the first to third emission areas EMA1, EMA2, and EMA3 may have different colors.

The second display substrate 20 may be disposed above the first display substrate 10 to face the first display substrate 10 (e.g., may be opposite to the first display substrate 10 with respect to the filing layer 50). The second display substrate 20 may include a second base substrate 210, a color filter layer CF, and a color control layer WCL and TPL disposed on the surface of the second base substrate 210 that faces the first base substrate 110.

The cross-sectional structure of the second display substrate 20 will be described from the top to the bottom, i.e., in the opposite direction to the third direction DR3 in the drawings. The second base substrate 210 may be a transparent substrate. The second base substrate 210 may include a transparent insulating material such as glass and quartz. The second base substrate 210 may be a rigid substrate. However, the second base substrate 210 is not limited by those listed above. The second base substrate 210 may include plastic such as polyimide (PI) and may have flexible characteristics so that it can be curved, bent, folded or rolled.

The second base substrate 210 may be of the same type as the first base substrate 110 or may have different material, thickness, transmittance, etc. For example, the second base substrate 210 may have a higher transmittance than the first base substrate 110. The second base substrate 210 may be either thicker or thinner than the first base substrate 110.

The light-absorbing member UAB may be disposed along the boundary of each of the sub-pixels SPX on the surface of the second base substrate 210 that faces the first base substrate 110. The light-absorbing member UAB may overlap the outer bank OBK of the first display substrate 10 in the third direction DR3 and may be disposed in the blocking area BA.

The light-absorbing member UAB may include an opening via which the surface of the second base substrate 210 overlapping the emission area EMA (or the transmitting area TA) is exposed. The transmitting areas TA: TA1, TA2, and TA3 and the blocking area BA may be distinguished by the light-absorbing member UAB and its opening. That is to say, the light-absorbing member UAB may be disposed along the boundary of the sub-pixels SPX to define the transmitting area TA and the blocking area BA of the second display substrate 20.

The light-absorbing member UAB may be disposed on a surface of the second base substrate 210 to have inclined side surfaces. The transmitting area TA and the blocking area BA of the second display substrate 20 may be defined by an opening defined by the inclined side surfaces of the light-absorbing member UAB. The transmitting areas TA and the blocking area BA may be defined based on the upper side of the light-absorbing member UAB in cross section, but the present disclosure is not limited thereto.

The light-absorbing member UAB can not only block emission of light from the display device 1 but also suppress reflection of external light. The light-absorbing member UAB may include an organic material.

According to an embodiment of the present disclosure, the light-absorbing member UAB may include a light-absorbing material that absorbs light in the visible wavelength range. For example, the light-absorbing member UAB may be a kind of light-blocking member.

According to another embodiment, the light-absorbing member UAB may absorb light in a particular wavelength range from among the visible light wavelengths and may transmit light in other wavelength ranges. For example, the light-absorbing member UAB may include the same material as the color filter layer CF to be described later. For example, the light-absorbing member UAB may be made of the same material as a blue third color filter CF3 (see FIG. 6). In some embodiments, the light-absorbing member UAB may be formed integrally with the third color filter CF3.

The color filter layer CF may be disposed on the surface of the second base substrate 210 on which the light-absorbing member UAB is disposed. The color filter layer CF can block light of other colors than the desired color of each of the sub-pixels SPX from exiting to the outside of the display device 1.

The color filter layer CF may be disposed on the surface of the second base substrate 210 exposed through the opening of the light-absorbing member UAB. Furthermore, the color filter layer CF may be partially disposed on the adjacent light-absorbing member UAB.

The color filter layer CF may include a first color filter CF1, a second color filter CF2, and a third color filter CF3.

The first color filter CF1 may be disposed in the first transmitting area TA1 of the first sub-pixel SPX1, the second color filter CF2 may be disposed in the second transmitting area TA2 of the second sub-pixel SPX2, and the third color filter CF3 may be disposed in the third transmitting area TA3 of the third sub-pixel SPX3.

The first to third color filters CF1, CF2, and CF3 may include a colorant such as a dye and a pigment that absorbs wavelengths other than a given color wavelength. The first color filter CF1 may selectively transmit light of the first color (e.g., red light) and may block and absorb light of the second color (e.g., green light) and light of the third color (e.g., blue light). The second color filter CF2 may selectively transmit light of the second color (e.g., green light) and may block and absorb light of the first color (e.g., red light) and light of the third color (e.g., blue light). The third color filter CF3 may selectively transmit light of the third color (e.g., blue light) and may block and absorb light of the first color (e.g., red light) and light of the second color (e.g., green light). For example, the first color filter CF1 may be a red color filter, the second color filter CF2 may be a green color filter, and the third color filter CF3 may be a blue color filter.

Although the adjacent color filters CF are spaced from one another on the light-absorbing member UAB in the example shown in FIG. 6, the present disclosure is not limited thereto. The adjacent color filters CF may partially overlap one another on the light-absorbing member UAB.

A first capping layer CPL1 may be disposed on the color filter layer CF. The first capping layer CPL1 may cover the color filter layer CF. The first capping layer CPL1 can prevent the color filter layer CF from being damaged or contaminated by the permeation of impurities such as moisture and air from the outside. In addition, the first capping layer CPL1 can prevent the colorant of the color filter layer CF from being diffused into other elements.

The first capping layer CPL1 may include an inorganic material. For example, the first capping layer CPL1 may include at least one of: silicon nitride, aluminum nitride, zirconium nitride, titanium nitride, hafnium nitride, tantalum nitride, silicon oxide, aluminum oxide, titanium oxide, tin oxide, and silicon oxynitride.

A color mixing prevention member MBM may be disposed in the blocking area BA on the first capping layer CPL1. The color mixing prevention member MBM may be disposed along the boundary of the sub-pixels SPX on the first capping layer CPL1. The color mixing prevention member MBM may overlap with the outer bank OBK of the first display substrate 10 and the light-absorbing member UAB of the second display substrate 20. The color mixing prevention member MBM may define the transmitting areas TA and the blocking area BA together with the light-absorbing member UAB. The transmitting areas TA and the blocking area BA may be defined based on the upper side of the color mixing prevention member MBM in cross section, but the present disclosure is not limited thereto.

The color mixing prevention member MBM may be made of a material capable of blocking light transmission, and can prevent color mixing that may occur when light intrudes (or leaks) to adjacent sub-pixels SPX.

The color mixing prevention member MBM may include openings exposing the first to third color filters CF1, CF2, and CF3 disposed in the first to third transmitting areas TA1, TA2, and TA3, respectively. Color control layers WCL and TPL, which will be described later, may be disposed in the space exposed by the openings of the color mixing prevention member MBM.

According to an embodiment of the present disclosure, the color control layers WCL and TPL may be formed via an inkjet printing process using the color mixing prevention member MBM as partition walls. The color mixing prevention member MBM may guide an ink composition for forming the color control layers WCL and TPL at desired positions stably. The color mixing prevention member MBM may include, but is not limited to, a photosensitive organic material.

The color control layers WCL and TPL may be disposed in the spaces surrounded by the color mixing prevention member MBM. The color control layers WCL and TPL may include wavelength conversion layers WCL that convert the wavelengths of light incident on the color control layers WCL and TPL, and a transparent pattern TPL that transmits light incident on the color control layer WCL and TPL without changing the wavelength of the light. The wavelength conversion layer WCL or the transparent pattern TPL may be disposed separately in each of the sub-pixels SPX. The wavelength conversion layer WCL or the transparent pattern TPL may overlap with the emission areas EMA and the transmitting areas TA in the thickness direction. The wavelength conversion layer WCL and/or the light transmission pattern TPL disposed adjacent to each other may be spaced from each other by the color mixing prevention member MBM disposed in the blocking area BA.

The wavelength conversion layer WCL and the transparent pattern TPL may be disposed on the first capping layer CPL1. In some embodiments, the wavelength conversion layer WCL and the transparent pattern TPL may be formed by inkjet printing, as described above. It is, however, to be understood that the present disclosure is not limited thereto. The wavelength conversion layer WCL and the transparent pattern TPL may be formed by applying a photosensitive material, exposing it to light, and developing and patterning it. In the following description, it is assumed that the wavelength conversion layer WCL and the transparent pattern TPL are formed by inkjet printing.

The wavelength conversion layer WCL may be disposed in a sub-pixel SPX with a color different from the wavelength of light incident from the first display substrate 10 so as to change the wavelength. The transparent pattern TPL may be disposed in a sub-pixel SPX with a color corresponding to the wavelength of the light incident from the first display substrate 10. According to some embodiments, the light of the third color is incident from each of the sub-pixels SPX of the first display substrate 10, and the wavelength conversion layer WCL is disposed in first sub-pixel SPX1 and the second sub-pixel SPX2 while the transparent pattern TPL is disposed in the third sub-pixel SPX3. As another example, when light having a wavelength different from the colors of the sub-pixels SPX is incident from the sub-pixels SPX of the first display substrate 10, only the wavelength conversion layer WCL may be disposed without the transparent pattern TPL. As another example, when lights having wavelengths corresponding to the colors of the sub-pixels SPX are incident from the sub-pixels SPX of the first display substrate 10, respectively, only the transparent pattern TPL may be disposed without the wavelength conversion layer WCL.

According to an embodiment of the present disclosure, the wavelength conversion layer WCL may include a first wavelength conversion pattern WCL1 disposed in the first sub-pixel SPX1, and a second wavelength conversion pattern WCL2 disposed in the second sub-pixel SPX2.

The first wavelength conversion pattern WCL1 may be disposed in the first transmitting area TA1 partitioned by the color mixing prevention member MBM in the first sub-pixel SPX1. The first wavelength conversion pattern WCL1 may overlap with the first color filter CF1 disposed in the first transmitting area TA1. The first wavelength conversion pattern WCL1 may convert light that has the wavelength of the third color and is incident from the first display substrate 10 into light having the wavelength of the first color different from the third color and then output it. For example, the first wavelength conversion pattern WCL1 may convert blue light incident from the first display substrate 10 into red light and then output it.

The first wavelength conversion pattern WCL1 may include a first base resin BRS1 and first wavelength-converting particles WCP1 dispersed in the first base resin BRS1. The first wavelength conversion pattern WCL1 may further include first scattering particles SCP1 dispersed in the first base resin BRS1.

The second wavelength conversion pattern WCL2 may be disposed in the second transmitting area TA2 partitioned by the color mixing prevention member MBM in the second sub-pixel SPX2. The second wavelength conversion pattern WCL2 may overlap with the second color filter CF2 disposed in the second transmitting area TA2. The second wavelength conversion pattern WCL2 may convert light that has the wavelength of the third color and is incident from the first display substrate 10 into light having the wavelength of the second color different from the third color and then output it. For example, the second wavelength conversion pattern WCL2 may convert blue light incident from the first display substrate 10 into green light and then output it.

The second wavelength conversion pattern WCL2 may include a second base resin BRS2 and second wavelength-converting particles WCP2 dispersed in the second base resin BRS2. The second wavelength conversion pattern WCL2 may further include second scattering particles SCP2 dispersed in the second base resin BRS2.

The transparent pattern TPL may be disposed in the third transmitting area TA3 defined by the color mixing prevention member MBM in the third sub-pixel SPX3. The transparent pattern TPL may overlap with the third color filter CF3 disposed in the third transmitting area TA3. The transparent pattern TPL may output the light of the third color incident from the first display substrate 10 without changing the wavelength of the light. For example, the transparent pattern TPL transmits blue light incident from the first display substrate 10 while maintaining the wavelength.

The transparent pattern TPL may include a third base resin BRS3. The transparent pattern TPL may further include third scattering particles SCP3 dispersed in the third base resin BRS3.

The first to third base resins BRS1, BRS2, and BRS3 may include a transparent organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be made of, but is not limited to, the same material The first to third scattering particles SCP1, SCP2, and SCP3 may have refractive indexes different from those of the first to third base resins BRS1, BRS2, and BRS3. The first to third scattering particles SCP1, SCP2, and SCP3 may include metal oxide particles or organic particles. Examples of the metal oxide may include titanium oxide ($TiO_2$), zirconium oxide ($ZrO_2$), aluminum oxide ($Al_xO_y$), indium oxide ($In_2O_3$), zinc oxide (ZnO), tin oxide ($SnO_2$), etc. Examples of the material of the organic particles may include an acrylic resin, a urethane resin, etc. The first to third scattering particles SCP1, SCP2, and SCP3 may be made of, but is not limited to, the same material.

The first wavelength-converting particles WCP1 may convert the third color into the first color, and the second wavelength-converting particles WCP2 may convert the third color into the second color. For example, the first wavelength-converting material WCP1 may be a material that converts blue light into red light, and the second wavelength-converting material WCP2 may be a material that converts blue light into green light. The first wavelength-converting material WCP1 and the second wavelength-converting material WCP2 may be quantum dots, quantum rods, phosphors, etc. The quantum dots may include Group IV nanocrystals, Group II-VI compound nanocrystals, Group III-V compound nanocrystals, Group IV-VI nanocrystals, or combinations thereof.

The second capping layer CPL2 is disposed on the color control layers WCL and TPL. The second capping layer CPL2 may be made of an inorganic material. The second capping layer CPL2 may include a material selected from among the materials listed above as materials of the first capping layer CPL1. The second capping layer CPL2 and the first capping layer CPL1 may be made of, but is not limited to, the same material.

The second capping layer CPL2 may cover the wavelength conversion patterns WCL1 and WCL2 and the transparent pattern TPL. The second capping layer CPL2 may cover one surface of each of the wavelength conversion patterns WCL1 and WCL2 and the transparent pattern TPL as well as the side surfaces thereof. The second capping layer CPL2 may be in contact with the color mixing prevention member MBM in the space between the adjacent color control layers WCL and TPL. The second capping layer CPL2 may have a shape conforming to a surface level difference formed by the color control layers WCL and TPL.

The filling layer 50 may be interposed between the first display substrate 10 and the second display substrate 20. The space between the first display substrate 10 and the second display substrate 20 may be filled with the filling layer 50, and they may be coupled with each other by the filling layer 50. The filling layer 50 may be disposed between the outer bank OBK of the first display substrate 10 and the second capping layer CPL2 of the second display substrate 20. The filling layer 50 may be made of, but is not limited to, a Si-based organic material, an epoxy-based organic material, etc.

Although the display device 1 includes the first display substrate 10, the second display substrate 20 facing (or opposite) the first display substrate 10, and the filling layer 50 disposed therebetween in the example shown in FIG. 6, the present disclosure is not limited thereto. In some other embodiments, the second display substrate 20 may be stacked on the first display substrate 10 in a display device, and the filling layer 50 and the sealing member 70 may be eliminated. In this instance, a plurality of layers included in the second display substrate 20 (for example, the second capping layer CPL2, the color mixing prevention member MBM, the color control layers WCL and TPL, and the light-absorbing member UAB) may be stacked on the first display substrate 10. Detailed descriptions thereon will be given below with reference to FIGS. 31 and 32.

Figure 7:
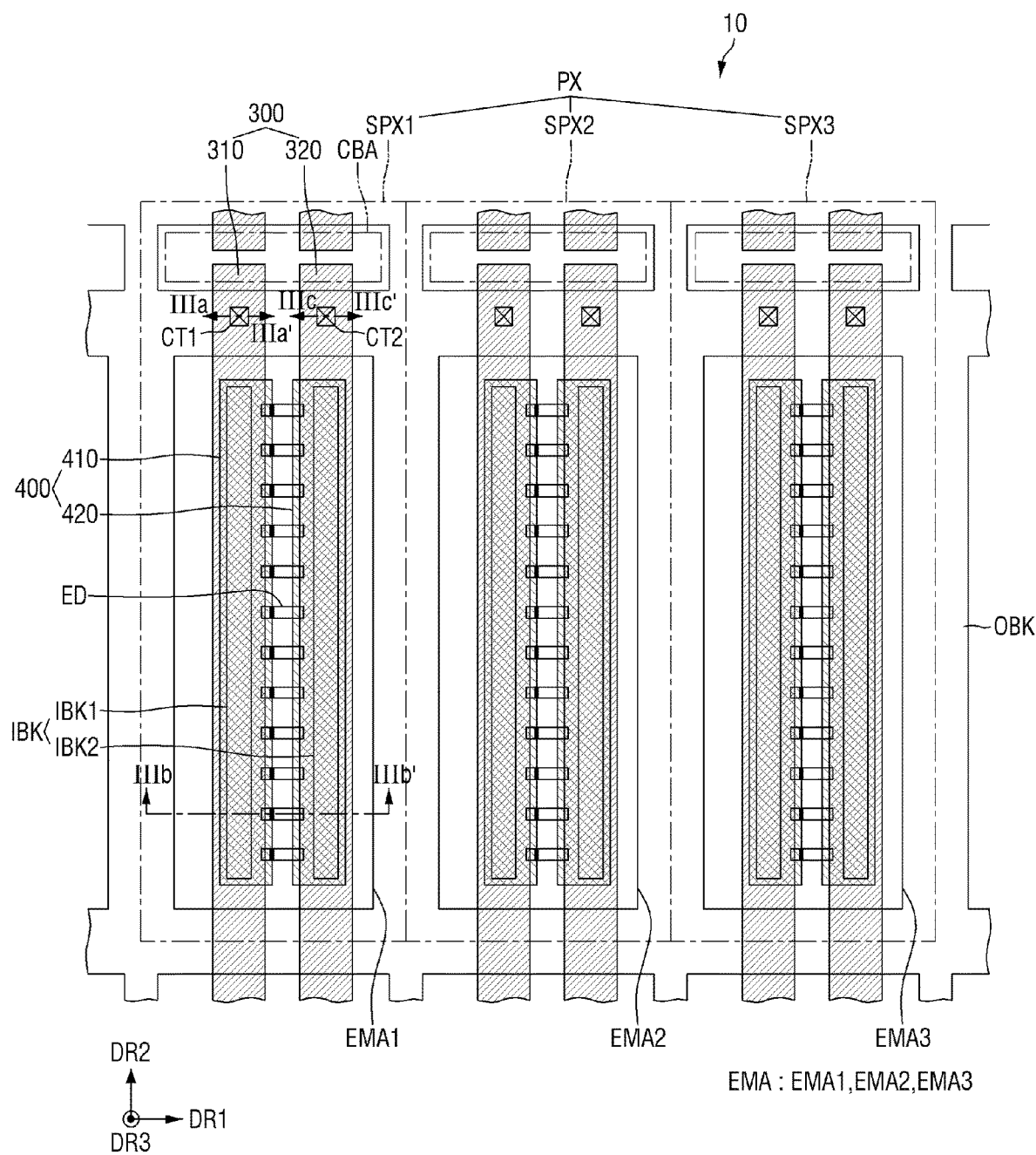
FIG. 7 is a plan view of the first display substrate of FIG. 6.

FIG. 7 is a plan view of the first display substrate of FIG. 6.

Referring to FIG. 7, as described above, the emission area EMA refers to an area in which light generated in the first display substrate 10 exit to the outside of the first display substrate 10, and may include an area in which a plurality of light-emitting elements ED are arranged and a periphery or peripheral area thereof. For example, the emission area EMA may further include an area in which light emitted from the light-emitting elements ED is reflected or refracted by other elements to exit to the outside of the first display substrate 10.

Each of the sub-pixels SPX: SPX1, SPX2, and SPX3 may further include a cut area CBA disposed in the non-emission area NEM. In each of the sub-pixels SPX, the cut area CBA may be disposed on one side of the emission area EMA in the second direction DR2.

A part of each of the first electrode 310 and the second electrode 320 disposed in each of the sub-pixels SPX may be disposed in the cut area CBA. The first electrode 310 and the second electrode 320 disposed in the sub-pixels SPX adjacent to each other in the second direction DR2 may be separated at the cut area CBA. It is, however, to be understood that the present disclosure is not limited thereto. In some other embodiments, the first electrode 310 and the second electrode 320 may not be separated at the cut area CBA of each of the sub-pixels SPX but may be extended beyond the adjacent sub-pixels SPX in the second direction DR2. In still other embodiments, only one of the first electrode 310 and the second electrode 320 may be separated at the cut area CBA of each of the sub-pixels SPX.

Figure 8:
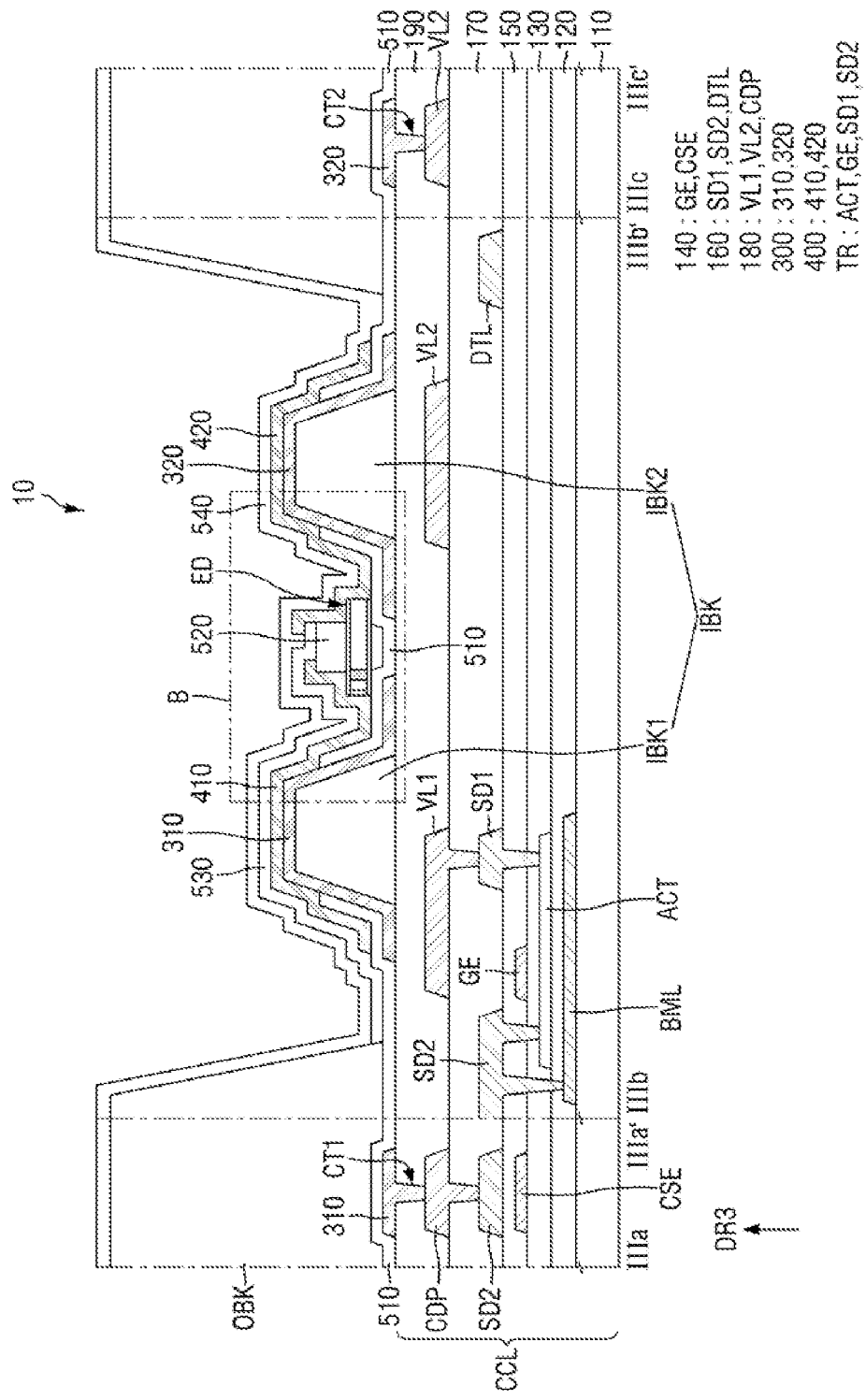
FIG. 8 is a cross-sectional view of the first display substrate of FIG. 6 taken along the lines IIIa-IIIa', IIIb-IIIb', and IIIc-IIIc' of FIG. 7.

FIG. 8 is a cross-sectional view of the first display substrate, taken along the lines IIIa-IIIa', IIIb-IIIb', and IIIc-IIIc' of FIG. 7.

Hereinafter, the structure of the first display substrate 10 will be described in detail with reference to FIGS. 7 and 8.

Referring to FIG. 8, the first display substrate 10 may include a first base substrate 110, a circuit layer CCL disposed on the first base substrate 110, and a light-emitting element layer disposed on the circuit layer CCL.

The circuit layer CCL may include a plurality of transistors, a plurality of conductive layers, a plurality of insulating layers, and a semiconductor layer.

The transistors TR may be disposed on the first base substrate 110 and may form pixel circuits of the respective pixels. For example, the transistors TR may be driving transistors or switching transistors of the pixel circuits. In FIG. 8, only a driving transistor TR is shown.

The transistor TR may include an active material layer ACT, a gate electrode GE, a first source/drain electrode SD1, and a second source/drain electrode SD2.

A bottom metal layer BML may be disposed on the first base substrate 110. The bottom metal layer BML may be disposed under a channel region of the active material layer ACT of the transistor TR of the first display substrate 10 to cover or overlap at least the channel region of the active material layer ACT in the third direction DR3. The bottom metal layer BML may be a light-blocking layer that protects the active material layer ACT of the semiconductor layer from external light. In some embodiments, the bottom metal layer BML may be eliminated.

A buffer layer 120 may be disposed over the bottom metal layer BML. The buffer layer 120 may be disposed to cover the entire surface of the first base substrate 110 on which the bottom metal layer BML is disposed. The buffer layer 120 can protect the transistor TR from moisture permeating through the first base substrate 110 that is vulnerable to moisture permeation. The buffer layer 120 may include a plurality of inorganic layers stacked on one another alternately. For example, the buffer layer 120 may be made up of multiple layers in which inorganic layers including at least one of a silicon oxide (SiOx), a silicon nitride (SiNx) and silicon oxynitride (SiOxNy) are stacked on one another alternately.

The semiconductor layer is disposed on the buffer layer 120. The semiconductor layer may include the active material layer ACT of the transistor TR. The active material layer ACT may be disposed to overlap the bottom metal layer BML in the third direction DR3.

The semiconductor layer may include polycrystalline silicon, an oxide semiconductor, etc. According to an embodiment of the present disclosure, when the semiconductor layer includes polycrystalline silicon, the semiconductor layer may be formed by crystallizing amorphous silicon. In another embodiment, the semiconductor layer may include an oxide semiconductor. For example, the oxide semiconductor may be, but is not limited to, indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

A gate insulator 130 may be disposed over the active material layer ACT. The gate insulator 130 may be disposed on the buffer layer 120 on which the active material layer ACT is disposed. The gate insulator 130 may work as a gate insulating layer of the transistor TR. The gate insulator 130 may be made up of an inorganic layer including an inorganic material, such as silicon oxide (SiOx), silicon nitride (SiNx) and silicon oxynitride (SiOxNy), or may be formed as a stack of such materials.

A gate conductive layer 140 may be disposed on the gate insulator 130. The gate conductive layer 140 may include the gate electrode GE of the transistor TR and a first capacitor electrode CSE of a storage capacitor.

The gate electrode GE may be disposed so that it overlaps the channel region of the active material layer ACT in the thickness direction of the first display substrate 10. The first capacitor electrode CSE may be disposed so that it overlaps the second source/drain electrode SD2 of the transistor TR described later in the thickness direction of the first display substrate 10. The first capacitor electrode CSE may be disposed so that it overlaps the second source/drain electrode SD2 in the third direction DR3, and the storage capacitor may be formed between them. According to some embodiments of the present disclosure, the first capacitor electrode CSE and the gate electrode GE may be formed as a single layer. A part of the single layer may include the gate electrode GE, and another part thereof may include the first capacitor electrode CSE.

The interlayer dielectric layer 150 is disposed on the gate conductive layer 140. The interlayer dielectric layer 150 may be disposed on the gate insulator 130 on which the gate conductive layer 140 is formed. The interlayer dielectric layer 150 may include inorganic insulating materials such as silicon oxide (SiOx), silicon nitride (SiNx), and silicon oxynitride (SiOxNy).

A first data conductive layer 160 is disposed on the interlayer dielectric layer 150. The first data conductive layer 160 may include a first source/drain electrode SD1 and a second source/drain electrode SD2 of the transistor TR and a data line DTL.

The first and second source/drain electrodes SD1 and SD2 may be electrically connected to both end regions of the active material layer ACT (e.g., a doping region of the active material layer ACT) through corresponding contact holes penetrating the interlayer dielectric layer 150 and the gate insulator 130, respectively. In addition, the second source/drain electrode SD2 of the transistor TR may be electrically connected to the bottom metal layer BML through a contact hole penetrating through the interlayer dielectric layer 150, the gate insulator 130, and the buffer layer 120.

The data line DTL may apply a data signal to another transistor included in the first display substrate 10. Although not shown in the drawings, the data line DTL may be connected to a source/drain electrode of another transistor.

A passivation layer 170 is disposed on the first data conductive layer 160. The passivation layer 170 covers and protects the first data conductive layer 160. The passivation layer 170 may include inorganic insulating materials such as silicon oxide (SiOx), silicon nitride (SiNx), and silicon oxynitride (SiOxNy).

A second data conductive layer 180 is disposed on the passivation layer 170. The second data conductive layer 180 may include a first voltage line VL1, a second voltage line VL2, and a first conductive pattern CDP.

A high-level voltage (or a first supply voltage) may be applied to the first voltage line VL1, and a low-level voltage (or a second supply voltage) may be applied to the second voltage line VL2, which is lower than the high-level voltage (the first supply voltage) of the first voltage line VL1. The first voltage line VL1 may be connected to the first source/drain electrode SD1 of the transistor TR through a contact hole penetrating through the passivation layer 170. The second voltage line VL2 may be electrically connected to the second electrode 320 through a second contact hole CT2 to apply the low-level voltage (e.g., the second supply voltage) to the second electrode 320.

The first conductive pattern CDP may be electrically connected to the second source/drain electrode SD2 of the transistor TR through a contact hole penetrating through the passivation layer 170. The first conductive pattern CDP may be electrically connected to the first electrode 310 through a contact hole CT1, to transfer the first supply voltage applied from the first voltage line VL1 to the first electrode 310.

A via layer 190 is disposed over the second data conductive layer 180. The via layer 190 may be disposed on the passivation layer 170 on which the second data conductive layer 180 is disposed. The via layer 190 may provide a flat surface. The via layer 190 may include an organic insulating material, for example, an organic material such as polyimide (PI).

The light-emitting element layer may be disposed on the via layer 190 and may include an outer bank OBK, first and second inner banks IBK1 and IBK2, a plurality of light-emitting elements ED, first and second electrodes 310 and 320, a contact electrode 400, and a plurality of insulating layers 510, 520, 530, and 540.

Referring to FIGS. 7 and 8, the first and second inner banks IBK1 and IBK2 may be disposed in the emission area EMA of each of the sub-pixels SPX.

The first inner bank IBK1 may be disposed on the left side in the emission area EMA when viewed from the top. The first inner bank IBK1 may be spaced from the outer bank OBK that defines the emission area EMA. When viewed from the top, the shape of the first inner bank IBK1 may be extended in the second direction DR2 with the both ends spaced from the outer bank OBK so that the first inner bank IBK1 is not extended to another sub-pixel SPX adjacent thereto in the second direction DR2.

The second inner bank IBK2 may be disposed on the right side in the emission area EMA when viewed from the top. The second inner bank IBK2 may be spaced from the outer bank OBK that defines the emission area EMA. When viewed from the top, the shape of the second inner bank IBK2 may be extended in the second direction DR2 with the both ends spaced from the outer bank OBK so that the second inner bank IBK2 is not extended to another sub-pixel SPX adjacent thereto in the second direction DR2.

The first inner bank IBK1 and the second inner bank IBK2 may be spaced from each other in the first direction DR1 and face each other. In the space between the first inner bank IBK1 and the second inner bank IBK2, a plurality of light-emitting elements ED may be disposed. As described later, the arrangement of the plurality of light-emitting elements ED disposed in the emission area EMA may be adjusted by adjusting the size, shape and/or arrangement of the first inner bank IBK1 and the second inner bank IBK2.

The inner banks IBK may be disposed directly on the via layer 190. The inner banks IBK may have a structure that at least partially protrudes from the upper surface of the via layer 190. The protruding part of each of the inner banks IBK may have inclined side surfaces. As the inner banks IBK includes the inclined side surfaces, the light that is emitted from the light-emitting elements ED and travels toward the side surfaces of the inner banks IBK can be guided toward the upper side (e.g., display side). As described above, the inner banks IBK may provide the space where the light-emitting element ED is disposed and may also work as a reflective partition wall that changes the traveling direction of light emitted from the light-emitting elements ED toward the display side.

Although the side surfaces of the inner banks IBK have an inclined linear shape in the drawings, the present disclosure is not limited thereto. For example, the side surfaces (or outer surfaces) of the inner banks IBK may have a shape of a curved semi-circle or semi-ellipse.

The inner banks IBK may include, but is not limited to, an organic insulating material such as polyimide (PI).

Although two inner banks IBK: IBK1 and IBK2 are disposed in one sub-pixel SPX in the drawings, the number of the inner banks IBK included in one sub-pixel SPX is not limited to two. The number of the inner banks IBK included in one sub-pixel SPX may be altered depending on the number of electrodes included in the sub-pixel SPX.

The first electrode 310 may be disposed on the first inner bank IBK1. The first electrode 310 may overlap with the first inner bank IBK1 in the third direction DR3.

The first electrode 310 may be extended in the second direction DR2 when viewed from the top, and the width of the first electrode 310 in the first direction DR1 may be greater than the width of the first inner bank IBK1 in the first direction DR1 so as to completely cover the first inner bank IBK1. The first electrode 310 may overlap with the first inner bank IBK1 and may be extended in the second direction DR2 to overlap a part of the outer bank OBK.

The second electrode 320 may be disposed on the second inner bank IBK2. The second electrode 320 may overlap with the second inner bank IBK2 in the third direction DR3. The second electrode 320 may be spaced from the first electrode 310 in the first direction DR1.

The second electrode 320 may be extended in the second direction DR2 when viewed from the top, and the width of the second electrode 320 in the first direction DR1 may be greater than the width of the second inner bank IBK2 in the first direction DR1 so as to completely cover the second inner bank IBK2. The second electrode 320 may overlap with the second inner bank IBK2 and may be extended in the second direction DR2 to overlap a part of the outer bank OBK.

The first electrode 310 and the second electrode 320 may be extended in the second direction DR2 in each of the sub-pixels SPXn, and they may be separated from other electrodes 310 and 320 of the adjacent sub-pixels SPX in the second direction DR2 at the cut area CBA of each of the sub-pixels SPX. The first electrode 310 and the second electrode 320 may be formed via a process of disconnecting the electrodes 310 and 320 at the cut area CBA after the process of disposing the light-emitting elements ED during the process of fabricating the first display substrate 10.

Each of the first and second electrodes 310 and 320 may be electrically connected to the light-emitting elements ED. A suitable voltage (e.g., a set or predetermined voltage) may be applied between the first and second electrodes 310 and 320 so that the light-emitting element ED emits light. For example, the plurality of electrodes 310 and 320 may be electrically connected to the light-emitting element ED through contact electrodes 400 to be described later, and electrical signals applied to the first and second electrodes 310 and 320 may be transferred to the light-emitting element ED through the contact electrodes 400.

The first and second electrodes 310 and 320 may be utilized to form an electric field in the sub-pixel SPX to align the light-emitting elements ED. The light-emitting elements ED may be disposed between the first inner bank IBK1 and the second inner bank IBK2 so that their ends are placed on the first electrode 310 and the second electrode 320, respectively, by the electric field formed between the first electrode 310 and the second electrode 320.

The electrode layer 300 (e.g., including the first and second electrodes 310 and 320) may include a transparent conductive material. For example, the electrode layer 300 may include, but is not limited to, a material such as indium tin oxide (ITO), indium zinc oxide (IZO) and indium tin zinc oxide (ITZO). In some embodiments, the electrode layer 300 may include a conductive material having a high reflectivity. For example, the electrode layer 300 may include a metal such as silver (Ag), copper (Cu) and or aluminum (Al) as the material having a high reflectivity. In this instance, the electrode layer 300 may reflect light that is emitted from the light-emitting element ED and travels toward the side surfaces of each of the inner banks IBK1 and IBK2 toward the display side in each of the sub-pixels SPXn. It is, however, to be understood that the present disclosure is not limited thereto. The electrode layer 300 may have a structure in which one or more layers of a transparent conductive material and a metal layer having high reflectivity are stacked, or may be made up of a single layer including them. In an embodiment, the electrode layer 300 may have a stack structure of ITO/silver (Ag)/ITO, ITO/Ag/IZO or ITO/Ag/ITZO/IZO, or may be an alloy including aluminum (Al), nickel (Ni), lanthanum (La), etc.

The first insulating layer 510 may be disposed on the electrode layer 300. The first insulating layer 510 is disposed on the first and second electrodes 310 and 320 such that at least a part of each of the first and second electrodes 310 and 320 is exposed. The first insulating layer 510 may be formed entirely on the via layer 190 including the area between the first electrode 310 and the second electrode 320 such that at least parts of the first electrode 310 and the second electrode 320 overlapping with the first inner bank IBK1 and the second inner bank IBK2, respectively, are exposed.

The first insulating layer 510 can protect the first electrode 310 and the second electrode 320 and insulate them from each other. In addition, the first insulating layer 510 may prevent the light-emitting element ED disposed on the first insulating layer 510 from being in contact with other elements and/or from being damaged.

The outer bank OBK may be disposed on the first insulating layer 510. The height of the outer bank OBK may be greater than the height of the inner bank IBK. As the outer bank OBK has a height greater than that of the inner banks IBK, it is possible to prevent the ink from overflowing to adjacent sub-pixels SPX during the inkjet printing process of the process of fabricating the first display substrate 10, as described above. The outer bank OBK may include, but is not limited to, polyimide (PI).

The plurality of light-emitting elements ED may be disposed in the space between the first inner bank IBK1 and the second inner bank IBK2 in the emission area EMA. The alignment of the plurality of light-emitting elements ED in the emission area EMA may be adjusted using the shape and arrangement of the first inner bank IBK1 and the second inner bank IBK2 so that the amount of light that is emitted from the light-emitting elements ED and is incident on the color control structures WCL and TPL and/or the color filter layer CF is increased. More detailed description thereon will be made below with reference to the other drawings.

The light-emitting element ED may have a shape extended in one direction (e.g., the first direction DR1). The light-emitting elements ED may be spaced from one another along the second direction DR2 in which the first and second electrodes 310 and 320 are extended, and may be aligned substantially parallel to one another when viewed from the top. The distance between the plurality of light-emitting elements ED is not particularly limited.

The direction in which the light-emitting elements ED disposed between the first electrode 310 and the second electrode 320 are extended may be substantially perpendicular to the direction in which the first and second electrodes 310 and 320 or the first and second inner banks IBK1 and IBK2 are extended. For example, the first and second electrodes 310 and 320 may be extended in the second direction DR2 while the light-emitting elements ED disposed between the first electrode 310 and the second electrode 320 may be extended in the first direction DR1. It is, however, to be understood that the present disclosure is not limited thereto. The light-emitting elements ED may be oriented obliquely to the direction in which the first and second electrodes 310 and 320 are extended.

The second insulating layer 520 may be partially disposed on the light-emitting elements ED disposed between the first electrode 310 and the second electrode 320. The second insulating layer 520 may be disposed to partially surround the outer surface of the light-emitting elements ED. The second insulating layer 520 is disposed on the light-emitting elements ED and may expose one end and the opposite end of each of the light-emitting elements ED. The second insulating layer 520 can protect the light-emitting element ED 300 and fix the light-emitting elements ED during the process of fabricating the first display substrate 10 so that the light-emitting elements ED are not lost.

The contact electrodes 400 may include a first contact electrode 410 and a second contact electrode 420. The first contact electrode 410 and the second contact electrode 420 may be spaced from each other and face each other in the first direction DR1. The first contact electrode 410 and the second contact electrode 420 may be electrically insulated from each other.

The first contact electrode 410 may be disposed on the first electrode 310 and may be in contact with a part of the first electrode 310 exposed by the first insulating layer 510. The first contact electrode 410 may be in contact with a first end of the light-emitting element ED exposed by the second insulating layer 520. The first contact electrode 410 may be extended in the second direction DR2 when viewed from the top. The first contact electrode 410 may be in contact with the first electrode 310 exposed by the first insulating layer 510 and the first end of the light-emitting element ED, to connect the first electrode 310 with the first end of the light-emitting element ED.

The third insulating layer 530 is disposed on the first contact electrode 410. The third insulating layer 530 may be disposed to cover the first contact electrode 410 completely and may be disposed to expose a second end of the light-emitting element ED so that the light-emitting element ED comes in contact with the second contact electrode 420. The third insulating layer 530 may electrically insulate the first contact electrode 410 from the second contact electrode 420.

The second contact electrode 420 may be disposed on the second electrode 320 and may be in contact with a part of the second electrode 320 exposed by the first insulating layer 510. The second contact electrode 420 may be in contact with the second end of the light-emitting element ED exposed by the second insulating layer 520 and the third insulating layer 530. The second contact electrode 420 may be extended in the second direction DR2 when viewed from the top. The second contact electrode 420 may be in contact with the first electrode 320 exposed by the first insulating layer 510 and the second end of the light-emitting element ED, to connect the second electrode 320 with the second end of the light-emitting element ED.

The first and second contact electrodes 410 and 420 may include a conductive material. For example, the first and second contact electrodes 410 and 420 may include at least one of ITO, IZO, ITZO, and aluminum (Al). For example, the first and second contact electrodes 410 and 420 may include, but is not limited to, a transparent conductive material.

The fourth insulating layer 540 may be disposed entirely on the first base substrate 110. The fourth insulating layer 540 can protect the elements disposed on the first base substrate 110 against the external environment.

Figure 9:
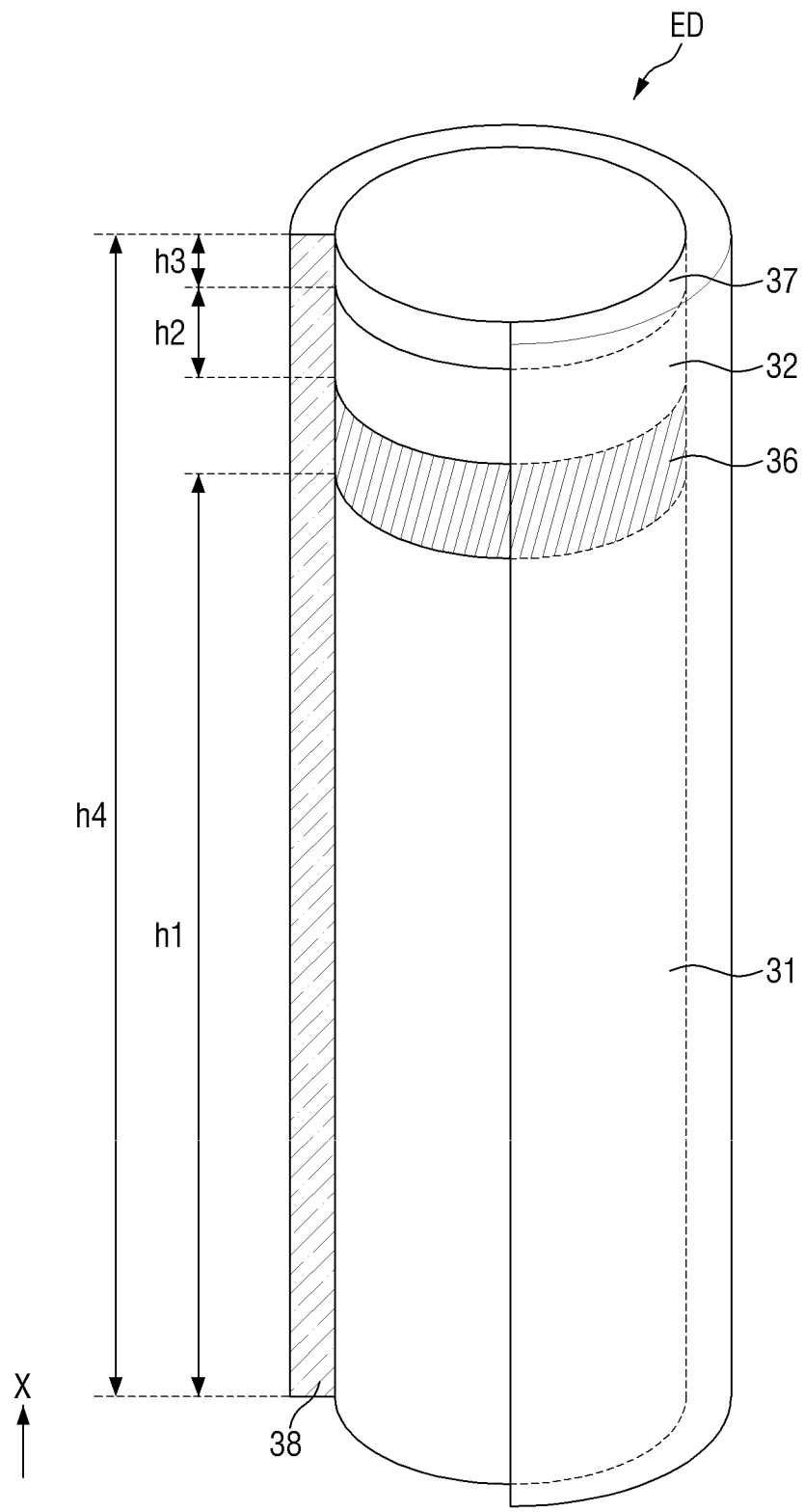
FIG. 9 is a perspective cutaway view showing a light-emitting element according to an embodiment of the present disclosure.

FIG. 9 is a perspective cutaway view showing a light-emitting element according to an embodiment of the present disclosure.

Referring to FIG. 9, the light-emitting element ED is a particulate element, and may have a rod-like or cylindrical shape having a desired aspect ratio (e.g., a set or predetermined aspect ratio). The light-emitting element ED may have a shape extended in the direction X, and the length of the light-emitting element ED may be larger than the diameter of the light-emitting element ED. The aspect ratio may range from, but is not limited to, 1.2:1 to 100:1.

The light-emitting element ED may have a size of a nanometer scale (from 1 nm to 1 µm) to a micrometer scale (from 1 µm to 1 mm). According to an embodiment of the present disclosure, both of the diameter and length of the light-emitting element ED may be in nanometer scales or micrometer scales. In some other embodiments, the diameter of the light-emitting element ED may be in a nanometer scale, while the length of the light-emitting element ED may be in a micrometer scale. In some embodiments, the diameter and/or length of some of the light-emitting elements ED may be in nanometer scales, while the diameter and/or length of some others ones of the light-emitting elements ED may be in micrometer scales.

The light-emitting element ED may be an inorganic light-emitting element. The inorganic light-emitting element may include a plurality of semiconductor layers. For example, the inorganic light-emitting element may include a first conductivity-type (e.g., n-type) semiconductor layer, a second conductivity-type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to an embodiment of the present disclosure, the above-described semiconductor layers may be sequentially stacked along one direction X, which is a longitudinal direction of the light-emitting element ED. The light-emitting element ED may include a first semiconductor layer 31, an active layer 36, and a second semiconductor layer 32 sequentially stacked in the direction X, as shown in FIG. 9. The first semiconductor layer 31, the active layer 36, and the second semiconductor layer 32 may be a first conductivity-type semiconductor layer, an active semiconductor layer, and a second conductivity-type semiconductor layer described above, respectively.

The first semiconductor layer 31 may be doped with a first conductivity-type dopant. The first conductivity-type dopant may be Si, Ge, Sn, etc. According to an embodiment of the present disclosure, the first semiconductor layer 31 may be n-GaN doped with n-type Si. The first semiconductor layer 31 may occupy most of the volume of the light-emitting element ED.

The second semiconductor layer 32 may be spaced from the first semiconductor layer 31 with the active layer 36 therebetween. The second semiconductor layer 32 may be doped with a second conductivity-type dopant such as Mg, Zn, Ca, Se, and Ba. According to an embodiment of the present disclosure, the second semiconductor layer 32 may be p-GaN doped with p-type Mg.

The active layer 36 may include a material having a single or multiple quantum well structure. As described above, the active layer 36 may emit light as electron-hole pairs are combined therein in response to an electrical signal applied through the first semiconductor layer 31 and the second semiconductor layer 32. According to an embodiment of the present disclosure, the active layer 36 includes AlGaInN as the quantum layer and AlInN as the well layer, and, as described above, the active layer 36 may emit blue light having a center wavelength range of 450 nm to 495 nm.

In some embodiments, the active layer 36 may have a structure in which a semiconductor material having a large band gap energy and a semiconductor material having a small band gap energy are alternately stacked on one another, and may include other Group III to Group V semiconductor materials depending on the wavelength range of the emitted light.

The light emitted from the active layer 36 may exit not only through the outer surfaces (e.g., outer peripheral surfaces) of the light-emitting element ED in the longitudinal direction but also through both side surfaces. That is to say, the directions in which the light emitted from the active layer 36 propagates are not limited to one direction.

The light-emitting element ED may further include an element electrode layer 37 disposed on the second semiconductor layer 32. The element electrode layer 37 may be in contact with the second semiconductor layer 32. The element electrode layer 37 may be an ohmic contact electrode but is not limited to it. It may be a schottky contact electrode.

When the both ends of the light-emitting element ED are electrically connected to the contact electrodes 410 and 420 to apply electric signals to the first and second semiconductor layers 31 and 32, the element electrode layer 37 may be disposed between the second semiconductor layer 32 and the contact electrodes 410 and/or 420 to reduce resistance therebetween. The element electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The element electrode layer 37 may include a semiconductor material doped with n-type or p-type impurities.

The light-emitting element ED may further include an insulating film 38 surrounding the outer surfaces (e.g., the outer peripheral surfaces) of the first semiconductor layer 31, the second semiconductor layer 32, the active layer 36 and/or the element electrode layer 37. The insulating film 38 may be disposed to surround at least the outer surface (e.g., the outer peripheral surface) of the active layer 36, and may be extended in the direction X in which the light-emitting element ED is extended. The insulating film 38 can protect the above-described elements (e.g., the first semiconductor layer 31, the second semiconductor layer 32, the active layer 36 and/or the element electrode layer 37 of the light-emitting element ED). The insulating film 38 may be made of materials having insulating properties and may prevent an electrical short-circuit that may occur when the active layer 36 comes in contact with an electrode through which an electric signal is transmitted to the light-emitting element ED. In addition, because the insulating film 38 covers the outer peripheral surface of the active layer 36 and also covers and protects the outer peripheral surfaces of the first and second semiconductor layers 31 and 32, it is possible to prevent or reduce a decrease in luminous efficiency.

According to an embodiment of the present disclosure, the active layer 36 of the light-emitting element ED may be shifted from the central area of the light-emitting element ED in the direction X in which it is extended so that it is located closer to one side in the direction X. As described above, the first semiconductor layer 31 may be formed to occupy most of the light-emitting element ED. For example, the length h1 of the first semiconductor layer 31 in the direction X may be greater than the length h2 of the second semiconductor layer 32 in the direction X and the length h3 of the element electrode layer 37 in the direction X. Moreover, the length h1 of the first semiconductor layer 31 in the direction X may be greater than the sum of the length h2 of the second semiconductor layer 32 in the direction X and the length h3 of the element electrode layer 37 in the direction X. In addition, the length of the first semiconductor layer 31 in the direction X may be greater than ½ of the length h of the light-emitting element ED in the direction X. Accordingly, the active layer 36 disposed between the first semiconductor layer 31 and the second semiconductor layer 32 may be shifted from the center (or the central region) of the light-emitting element ED in the direction X so that it is located closer to the one side in direction X (e.g., the side on which the second semiconductor layer 32 is disposed). Because the active layer 36 is located closer to the one side in the length direction of the light-emitting elements ED, the intensity of light emitted from the active layer 36 through the both ends may be larger at the end to which the active layer 36 is closer than at the opposite end. In other words, because the active layer 36 that emits light is located closer to the one side (e.g., the side in the X-direction that is adjacent to the second semiconductor layer 32), the intensity of light emitted from the light-emitting elements ED may be asymmetric when viewed from the top.

Figure 10:
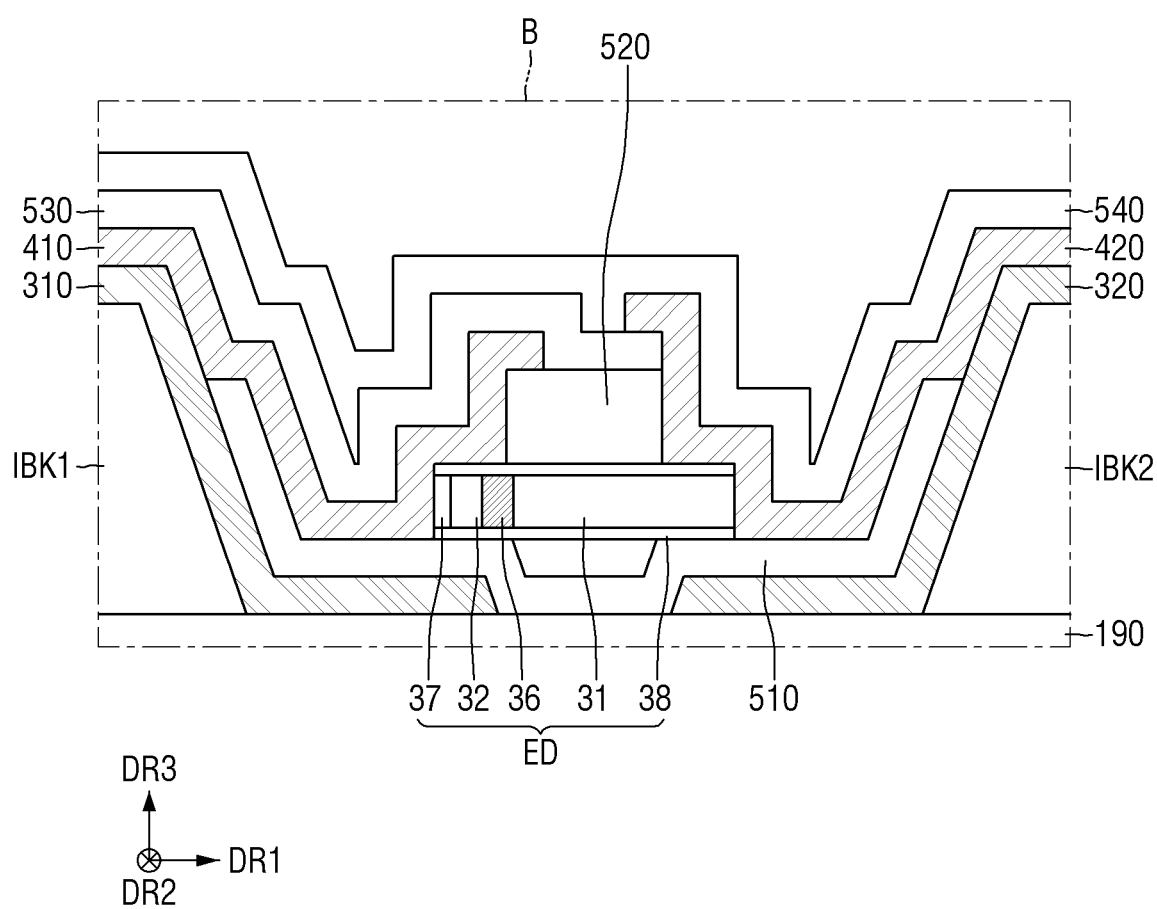
FIG. 10 is an enlarged cross-sectional view showing an example of an area B of FIG. 8.

FIG. 10 is an enlarged cross-sectional view showing an example of an area B of FIG. 8.

Referring to FIG. 10, the light-emitting element ED may be disposed between the first inner bank IBK1 and the second inner bank IBK2 such that the first end of the light-emitting element ED is placed on the first electrode 310 and the second end thereof is placed on the second electrode 320. The first end of the light-emitting element ED may refer to the end where the element electrode layer 37 and/or the second semiconductor layer 32 is located, and the second end of the light-emitting element ED may refer to the end where the first semiconductor layer 31 is located. The direction X in which the light-emitting element ED is extended and the direction in which the semiconductor layers included in the light-emitting element ED are stacked on one another may be parallel to the surface of the first base substrate 110.

The first contact electrode 410 may be in contact with the element electrode layer 37 located at the first end of the light-emitting element ED to be electrically connected to the second semiconductor layer 32. The second contact electrode 420 may be in contact with the first semiconductor layer 31 located at the second end of the light-emitting element ED to be electrically connected to it. That is to say, the first contact electrode 410 may electrically connect the first electrode 310 with the second semiconductor layer 32 of the light-emitting element ED, and the second contact electrode 420 may electrically connect the second electrode 320 with the first semiconductor layer 31 of the light-emitting element ED to apply an electric signal to the light-emitting element ED.

Figure 11:
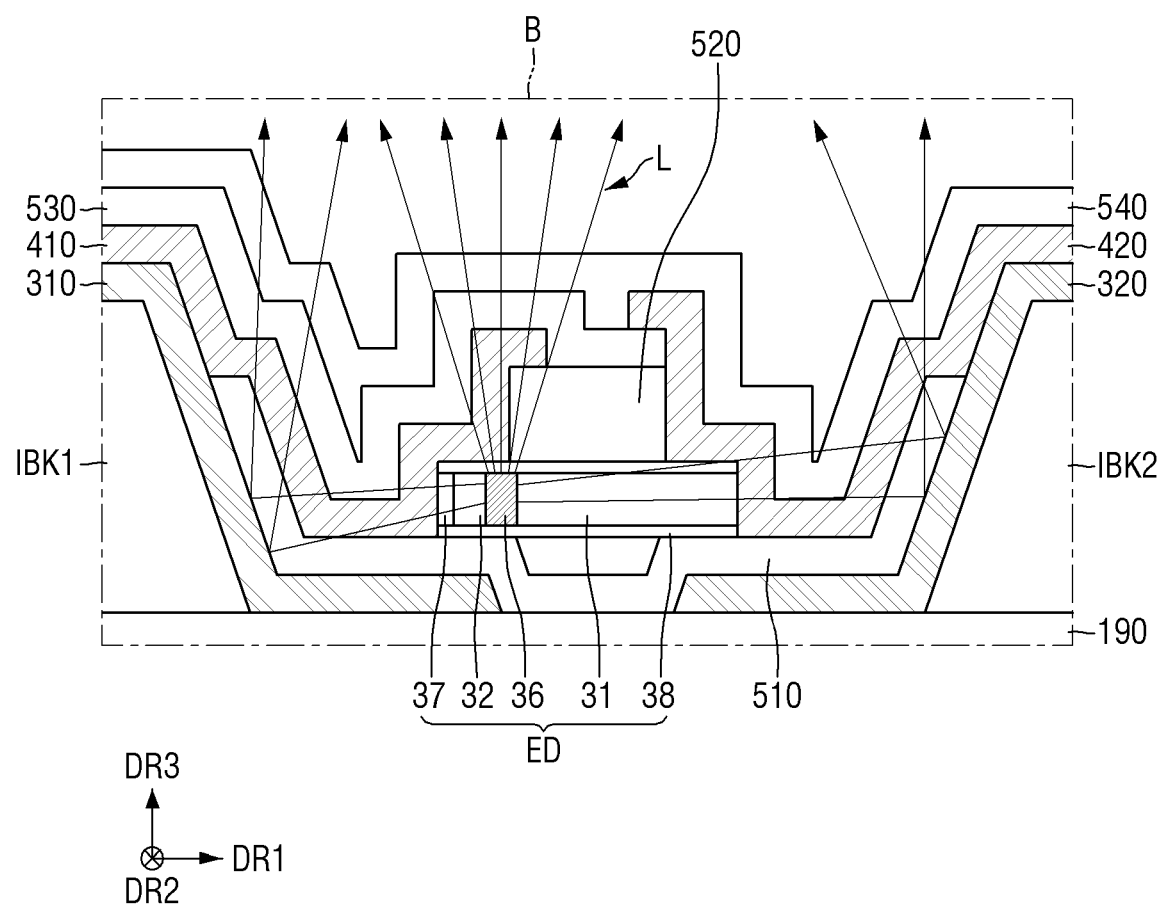
FIG. 11 is an enlarged cross-sectional view showing paths of lights generated from a light-emitting element.

FIG. 11 is an enlarged cross-sectional view showing paths of lights generated from a light-emitting element.

Referring to FIG. 11, the direction in which the light L emitted from the active layer 36 of the light-emitting element ED exits is not limited to one direction, but may exit not only through the both end surfaces of the light-emitting element ED but also through the side surface.

For example, the light L emitted from the active layer 36 of the light-emitting element ED may exit from the light-emitting element ED through an end surface of the light-emitting element ED where the element electrode layer 37 is located. The light L exiting through one end surface of the light-emitting element ED and traveling toward the first inner bank IBK1, the first electrode 310, or the first contact electrode 410 may be reflected by the plurality of elements so that it may travel toward the display side. In addition, the light L exiting through the opposite end surface of the light-emitting element ED and traveling toward the second inner bank IBK2, the second electrode 320, or the second contact electrode 420 may be reflected by the plurality of elements so that it may travel toward the display side. In addition, the light exiting through the side surface of the light-emitting element ED may pass through a plurality of elements disposed above the light-emitting element ED to travel toward the display side.

As described above, the active layer 36 of the light-emitting element ED, where light is generated, may be shifted from the central area of the light-emitting element ED in the direction X in which the light-emitting element ED is extended so that the active layer 36 is located closer to the one side where the second semiconductor layer 32 is disposed. As the active layer 36 is located closer to one of the both ends of the light-emitting element ED, when viewed from the top of the light-emitting element ED, the intensity of the light L exiting from the light-emitting element ED and traveling toward the display side for each azimuth angle may be larger at the one end where the second semiconductor layer 32 is disposed than at the opposite end where the first semiconductor layer 31 is disposed. Therefore, by adjusting the arrangement of the light-emitting element ED in the emission area EMA, the amount of light emitted from the active layer 36 and incident on the upper color control layers WCL and TPL disposed above the light-emitting element ED can be efficiently increased, thereby improving the light out-coupling efficiency.

Figure 12:
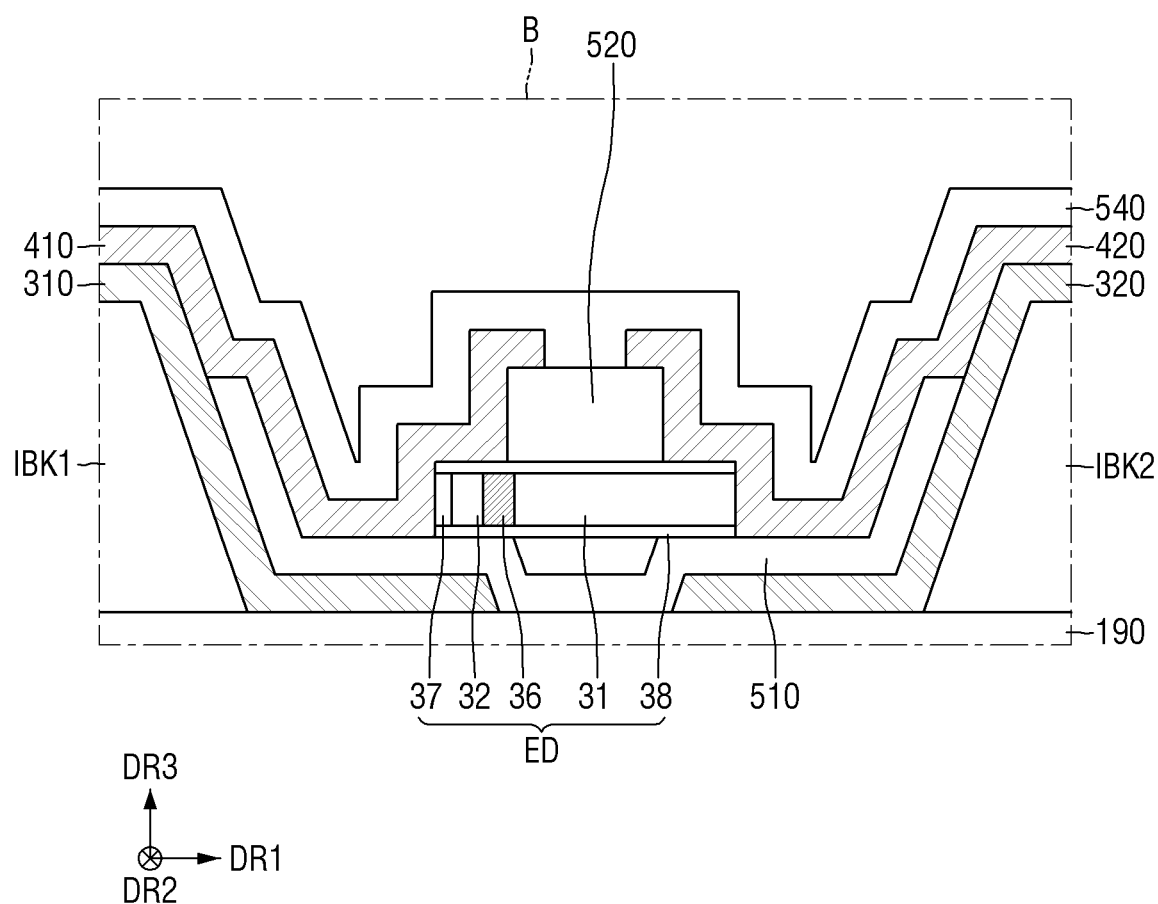
FIG. 12 is an enlarged cross-sectional view showing another example of the area B of FIG. 8.

FIG. 12 is an enlarged cross-sectional view showing another example of the area B of FIG. 8.

The embodiment shown in FIG. 12 is different from the embodiment shown in FIG. 10 in that the third insulating layer 530 is eliminated.

For example, the first and second contact electrodes 410 and 420 may be disposed directly on the second insulating layer 520. The first contact electrode 410 and the second contact electrode 420 may be spaced from each other on the second insulating layer 520 to expose a part of the second insulating layer 520. The exposed part of the second insulating layer 520 between the first and second contact electrodes 410 and 420 may be in contact with the fourth insulating layer 540.

According to this embodiment, even though the third insulating layer 530 is eliminated from the first display substrate 10, the second insulating layer 520 includes an insulating material to fix the light-emitting element ED. The first contact electrode 410 and the second contact electrode 420 may be patterned via a single mask process and formed together. Therefore, no additional mask process is required to form the first and second contact electrodes 410 and 420, and thus the efficiency of the process of fabricating the display device 1 can be improved. This embodiment is identical to the embodiment of FIGS. 10 and 11 except that the third insulating layer 530 is eliminated; and, therefore, the redundant descriptions will be omitted.

Figure 13:
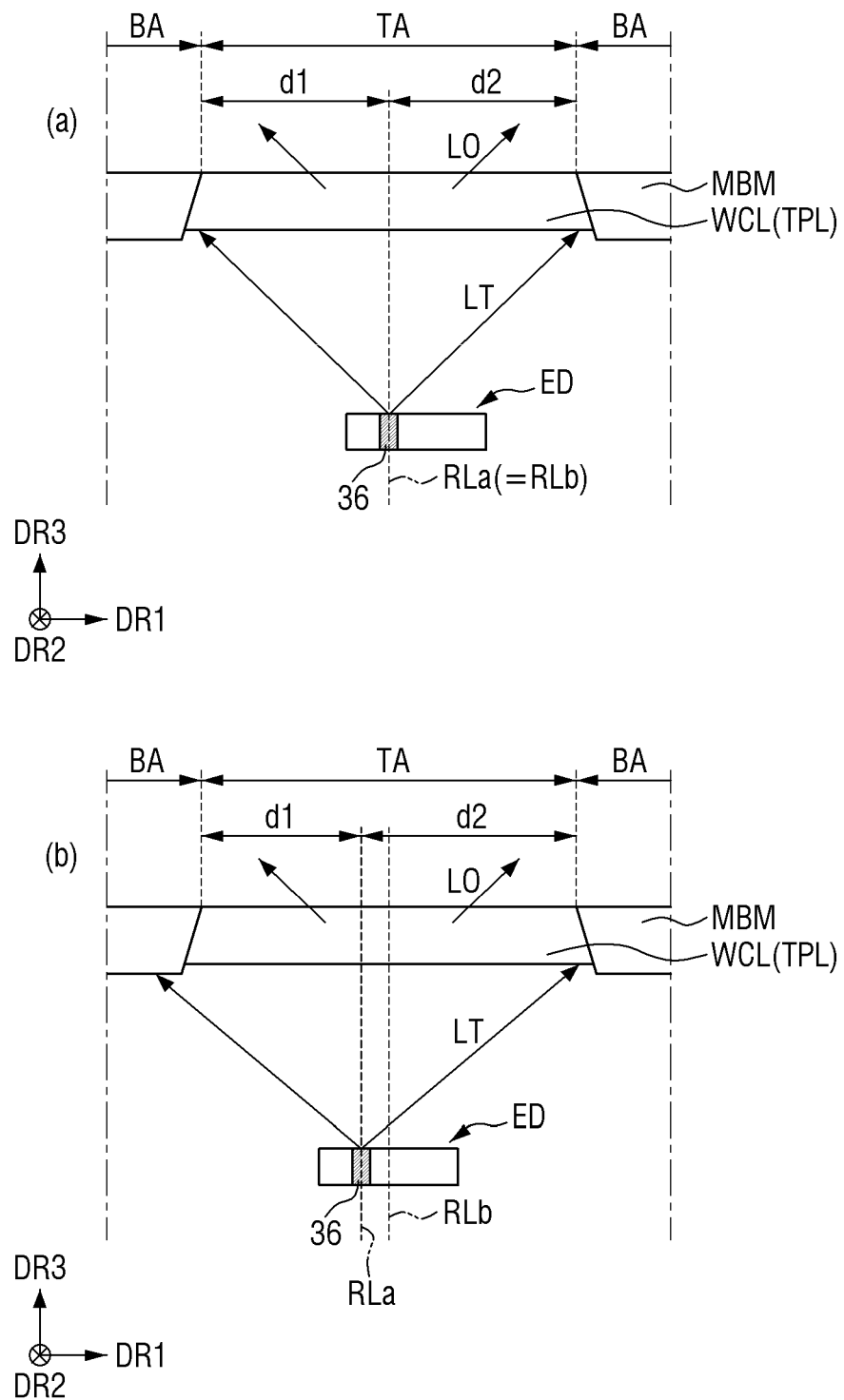
FIG. 13 is a conceptual diagram for illustrating a relative cross-sectional arrangement between an active layer of a light-emitting element and a color control layer according to an embodiment.

FIG. 13 is a conceptual diagram for illustrating a relative cross-sectional arrangement between an active layer of a light-emitting element and a color control layer according to an embodiment.

Referring to FIGS. 6, 11, and 13, the light emitted from the active layer 36 of the light-emitting element ED may travel to the color control layer WCL or TPL disposed thereabove. As described above, the color control layers WCL and TPL may be formed in the opening partitioned by the color mixing prevention member MBM disposed along the boundary of each of the sub-pixels SPX via an inkjet printing process. That is to say, the openings partitioned by the color mixing prevention member MBM may be filled with the color control layers WCL and/or TPL. The opening partitioned by the color mixing prevention member MBM may define the transmitting area TA of each of the sub-pixels SPX.

As described above, the light emitted from the active layer 36 of the light-emitting element ED may not travel in a single particular direction. Light LT emitted from the active layer 36 of the light-emitting element ED and incident on the color control layer WCL or TPL is reflected and/or refracted by the elements of the light-emitting element layer of the first display substrate 10, to travel toward the color control layers WCL or TPL thereabove. For example, the light emitted from the active layer 36 of the light-emitting element ED may be reflected and/or refracted by the above-described first and second electrodes 310 and 320, the first and second contact electrodes 410 and 420, the inner banks IBK, and a plurality of insulating layers 520, 520 and 540 disposed above the light-emitting element ED to travel toward the color control layers WCL and TPL thereabove. As described above, as the active layer 36 of the light-emitting element ED is located closer to the one side in the direction in which the light-emitting element ED is extended, the intensity of the light LT emitted from the active layer 36 and reflected and/or refracted by a plurality of elements and incident on the color control layer WCL or TPL for each azimuth angle when viewed from the top may be formed asymmetrically with respect to the center of the light-emitting element ED. The intensity of light for each azimuth angle when viewed from the top for the light-emitting element ED may be shifted to the side on which the active layer 36 is disposed. Accordingly, by adjusting the relative arrangement of the elements of each of the first display substrate 10 and the second display substrate 20 so that the light LT emitted from the active layer 36 of the light-emitting element ED and incident on the color control layer WCL or TPL thereabove is incident at the central area of the color control layer WCL or TPL, it is possible to improve light emission efficiency of the display device 1.

First and second reference lines RLa and RLb are defined in FIG. 13 for convenience of illustration. The first reference line RLa may be defined as an imaginary line extended in a direction perpendicular to the first direction DR1, in which the light-emitting element ED is extended, passing through the center of the active layer 36 of the light-emitting element ED. The second reference line RLb may be defined as an imaginary line extended in the direction perpendicular to the first direction DR1, in which the light-emitting element ED is extended, passing through the center of the transmitting area TA corresponding to the light-emitting element ED, where the transmitting area TA may be defined by the opening included in the color mixing prevention member MBM. Because the color control layer WCL or TPL is disposed in each opening of the color mixing prevention member MBM defining the transmitting area TA, the second reference line RLb may also be defined as a reference line equally dividing the color control layer WCL or TPL in the direction parallel to the light-emitting element ED, i.e., the first direction DR1.

Each of FIGS. (a) of FIG. 13 and (b) of FIG. 13 shows an example where the light-emitting elements ED are arranged in a single column in the emission area EMA. FIG. (a) of FIG. 13 shows an example where the first reference line RLa of the light-emitting element ED overlaps or coincides with the second reference line RLb of the transmitting area TA in the third direction DR3. FIG. (b) of FIG. 13 shows an example where the first reference line RLa of the light-emitting element ED does not overlap or coincide with the second reference line RLb of the transmitting area TA in the third direction DR3.

Referring to FIG. (a) of FIG. 13, when the light-emitting element ED and the color control layer WCL or TPL are aligned so that the first reference line RLa and the second reference line RLb overlap or coincide with each other, the light LT output from the light-emitting element ED and incident on the color control layer WCL or TPL thereabove may generally be incident on the central areas of the color control layer WCL or TPL. Therefore, by adjusting the alignment of the light-emitting element ED with the color control layer WCL or TPL so that the first reference line RLa coincides with second reference line RLb, the amount of light LT that is emitted from the emission area EMA and is incident on the central area of the transmitting area TA can be increased. As a result, the emission efficiency of the light LO exiting to the outside of the display device 1 through the second display substrate 20 can be improved. The alignment of the light-emitting element ED with the transmitting area TA may be adjusted by the color mixing prevention member MBM defining the transmitting area TA.

In this instance, a first horizontal distance d1 between the edge of the transmitting area TA on one side (left side in the drawing) in the first direction DR1 (the left side of the transmitting area TA in FIG. 14) and the first reference line RLa may be equal to a second horizontal distance d2 between the edge of the transmitting area TA on the opposite side (right side in the drawing) in the first direction DR1 (the right side of the transmitting area TA in FIG. 14) and the first reference line RLa. That is to say, by adjusting the alignment of the light-emitting element ED with the color control layer WCL or TPL so that the distances d1 and d2 from the both edges of the transmitting area TA in the direction parallel to the direction in which the light-emitting element ED is extended to the first reference line RLa are equal to each other, it is possible to reduce the leakage of the light LT emitted from the light-emitting element ED and traveling toward the upper side.

On the other hand, referring to FIG. (b) of FIG. 13, when the light-emitting element ED and the color control layer WCL or TPL are aligned so that the first reference line RLa does not overlap with the second reference line RLb, the light LT emitted from the light-emitting element ED and incident on the color control layer WCL or TPL thereabove may be shifted to one side of the color control layer WCL or TPL in the first direction DR1. For example, if the light-emitting element ED is aligned so that an imaginary line that passes through the center of the light-emitting element ED and is extended in the direction perpendicular to the first direction DR1 in which the light-emitting element ED is extended coincides with the second reference line RLb (i.e., the light-emitting element ED is symmetrical from the both edges of the transmitting area TA), the first reference line RLa may be shifted to the left side from the second reference line RLb. Accordingly, the light LT emitted from the light-emitting element ED and incident on the color control layer WCL or TPL thereabove may be shifted to the side where the active layer 36 is located and may be incident even on the blocking area BA. Accordingly, if the first reference line RLa does not overlap with the second reference line RLb as shown in FIG. (b) of FIG. 13, some of the lights emitted from the light-emitting element ED and incident on the color control layer WCL or TPL may be incident on the peripheral regions of the color control layer WCL or TPL. As a result, the emission efficiency of the display device 1 may be lowered.

Accordingly, when a plurality of light-emitting elements ED is arranged in a single column in the emission area EMA defined by the opening partitioned by the outer bank OBK, by aligning the first display substrate 10 with the second display substrate 20 so that the first reference line RLa of the light-emitting elements ED coincides with the second reference line RLb of the transmitting area TA (or the second reference line of the color control layer WCL or TPL) as shown in FIG. (a) of FIG. 13, the light emitted from the first display substrate 10 may be generally or substantially incident on the central area of the color control layer WCL or TPL of the second display substrate 20. In addition, in this instance, the first horizontal distance d1 between the left side of the transmitting area TA and the first reference line RLa may be equal to the second horizontal distance d2 between the right side of the transmitting area TA and the first reference line RLa. Accordingly, the light emission efficiency of the display device 1 can be improved by adjusting the positional relationship between the transmitting area TA and the light-emitting elements ED.

Figure 14:
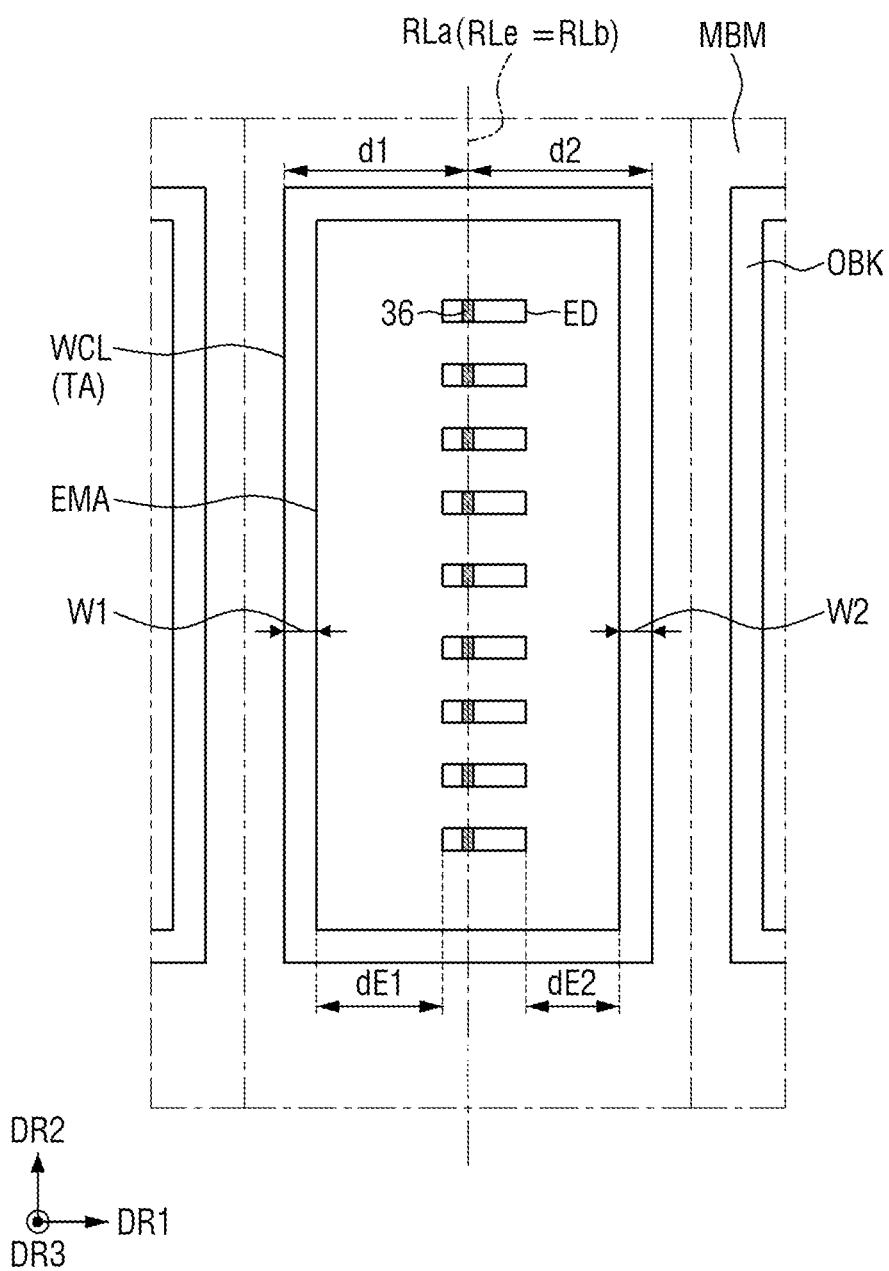
FIG. 14 is a plan view showing a relative arrangement of a transmitting area, an emission area and a plurality of light-emitting elements according to an embodiment of the present disclosure.
Figure 15:
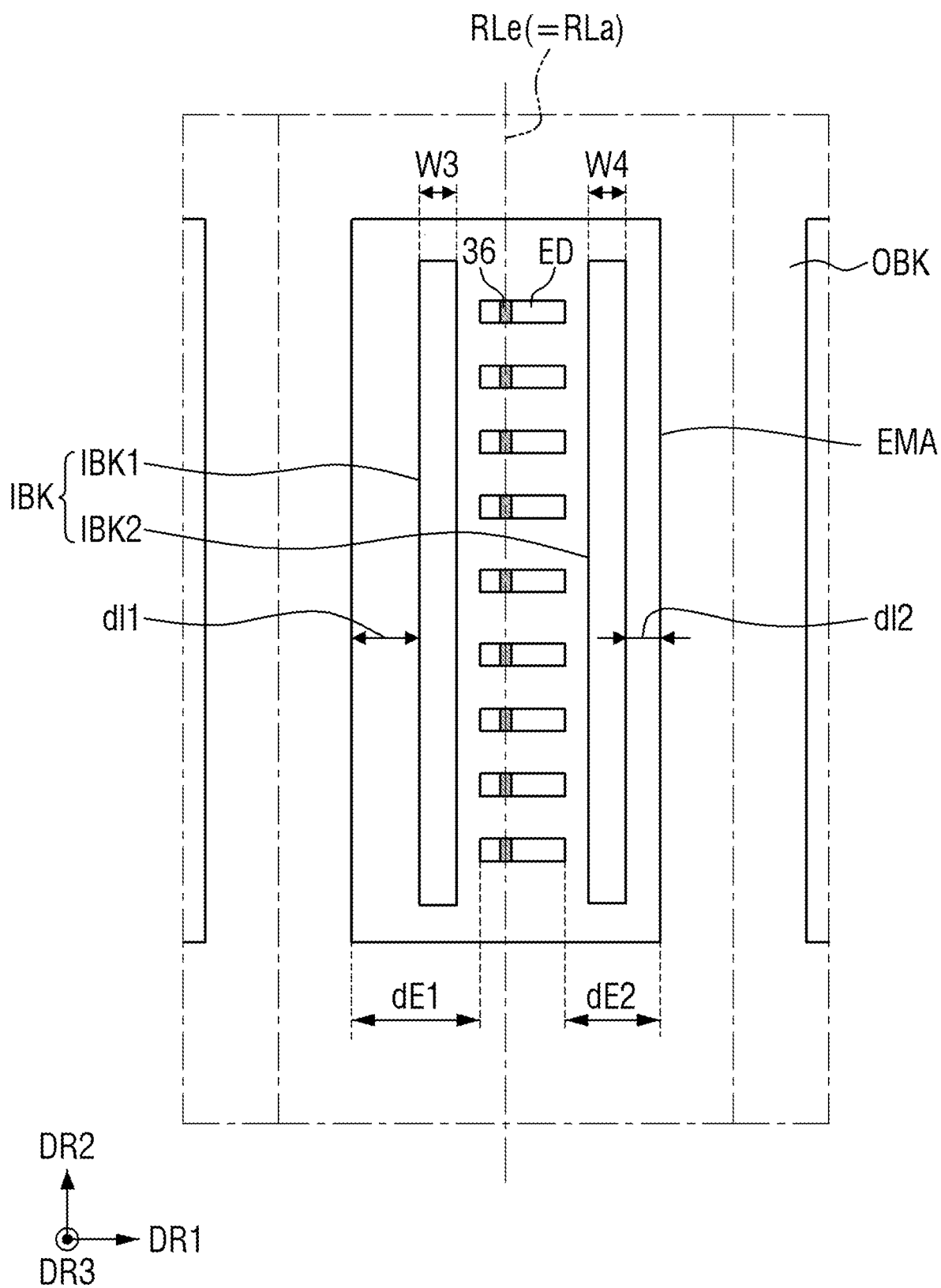
FIG. 15 is a plan view showing a layout of a light-emitting element layer according to an embodiment of the present disclosure.
Figure 16:
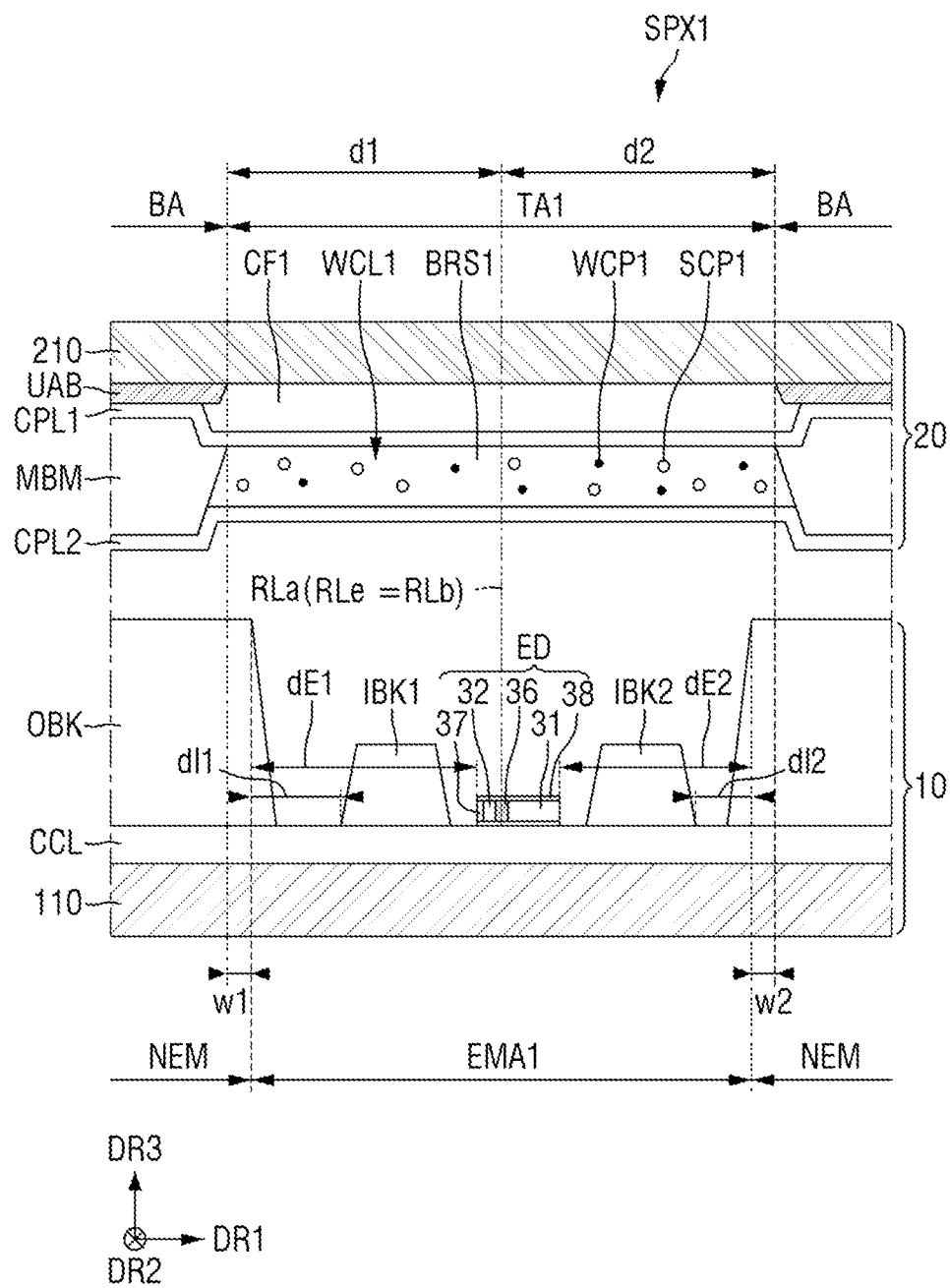
FIG. 16 is a cross-sectional view of a first sub-pixel of the display device according to the embodiment of FIGS. 14 and 15.

FIG. 14 is a plan view showing a relative arrangement of a transmitting area TA, an emission area EMA, and a plurality of light-emitting elements ED according to an embodiment of the present disclosure. FIG. 15 is a plan view showing a layout of a light-emitting element layer according to an embodiment of the present disclosure. FIG. 16 is a cross-sectional view of a first sub-pixel of the display device according to the embodiment of FIGS. 14 and 15.

As described above with reference to FIG. 13, when a plurality of light-emitting elements ED is arranged in a single column in the emission area EMA, the elements of the display device may be aligned so that the first reference line RLa and the second reference line RLb overlap each other in order to increase the amount of light emitted from the light-emitting elements ED and incident on the central area of the color control layers WCL and TPL disposed thereabove.

According to an embodiment of the present disclosure, in order to align the first display substrate 10 with the second display substrate 20 so that the first reference line RLa and the second reference line RLb overlap each other, they may be aligned so that the arrangement of the transmitting area TA and the emission area EMA of each of the sub-pixels SPX is symmetrical as shown in FIG. 14, with the light-emitting elements ED shifted to one side in the first direction DR1 in the emission area EMA when viewed from the top.

According to some other embodiments, in order to align the first display substrate 10 with the second display substrate 20 so that the first reference line RLa and the second reference line RLb overlap each other, they may be aligned so that the arrangement of the light-emitting elements ED is symmetrical in the emission area EMA, while the transmitting area TA and the emission area EMA of each of the sub-pixels SPX are shifted to one side in the first direction DR1 when viewed from the top. More detailed description thereon will be made with reference to FIGS. 25-28.

Referring to FIGS. 14-16, the emission areas EMA of the first display substrate 10 may be disposed at the center (or the central region) of the transmitting areas TA of the second display substrate 20. Therefore, the width W1 between the left side of the transmitting area TA and the left side of the emission area EMA may be equal to the width W2 between the right side of the transmitting area TA and the right side of the emission area EMA.

When the light-emitting elements ED are arranged in a single column in the emission area EMA, the first reference line RLa passing through the center of the active layer 36 of each of the light-emitting elements ED may overlap with the second reference line RLb that equally divides the transmitting area TA in the first direction DR1 parallel to the direction in which the light-emitting elements ED are extended, as described above. As the first reference line RLa overlaps with the second reference line RLb, the first horizontal distance d1 between the left side of the transmitting area TA and the first reference line RLa may be equal to the second horizontal distance d2 between the right side of the transmitting area TA and the first reference line RLa.

As the color control layer WCL or TPL is disposed in the transmitting area TA defined by the opening partitioned by the color mixing prevention member MBM, the first horizontal distance d1 between the left side of the color control layer WCL or TPL disposed in each of the sub-pixels SPX and the first reference line RLa may be equal to the second horizontal distance d2 between the right side of the color control layer WCL or TPL and the first reference line RLa when viewed from the top.

Incidentally, according to this embodiment where the emission area EMA is disposed at the center of the transmitting TA, the first reference line RLa is disposed to overlap with the second reference line RLb, and thus the light-emitting elements ED may be disposed so that the first reference line RLa overlaps a third reference line RLe that equally divides the emission area EMA in the first direction DR1 parallel to the direction in which the light-emitting elements ED are extended in the emission area. As the active layer 36 of each of the light-emitting elements ED is located closer to one side in the direction in which the light-emitting elements ED are extended, the light-emitting elements ED may be aligned so that they are shifted to the one side in the first direction DR1 in the emission area EMA. For example, a distance dE1 between the left side of the emission area EMA and first ends of the light-emitting elements ED may be different from a distance dE2 between the right side of the emission area EMA and second ends of the light-emitting elements ED.

Because the light-emitting elements ED are disposed in the emission area EMA defined by the opening partitioned by the outer bank OBK, the outer bank OBK disposed around each of the sub-pixels SPX and forming the left side of the emission area EMA may face the first ends of the light-emitting elements ED. The distance dE1 between the outer bank OBK forming the left side of the emission area EMA and the first ends of the light-emitting elements ED, and the distance dE1 between the left side of the emission area EMA and the first ends of the light-emitting elements ED may refer to the same distance. Similarly, the distance dE2 between the outer bank OBK forming the right side of the emission area EMA and the second ends of the light-emitting elements ED, and the distance dE2 between the right side of the emission area EMA and the second ends of the light-emitting elements ED may refer to the same distance. Accordingly, the distance dE1 between the outer bank OBK forming the left side of the emission area EMA and the first ends of the light-emitting elements ED may be different from the distance dE2 between the outer bank OBK forming the right side of the emission area EMA and the second ends of the light-emitting elements ED.

In the embodiment where the emission areas EMA are disposed at the center (or the central region) of the transmitting areas TA, respectively, the light-emitting elements ED are aligned in the emission area EMA so that the first horizontal distance d1 between the left side of the transmitting area TA and the first reference line RLa is equal to the second horizontal distance d2 between the right side of the transmitting area TA and the first reference line RLa, and thus the light-emitting elements ED may be shifted so that they are closer to one side in the first direction DR1 in the emission area EMA. It is to be noted that the first reference line RLa and the second reference line RLb overlap each other and the light-emitting elements ED and the color control layers WCL and TPL are aligned so that the first horizontal distance d1 between the left side of the transmitting area TA and the first reference line RLa is equal to the second horizontal distance d2 between the right side of the transmitting area TA and the first reference line RLa, and thus the light emitted from the light-emitting elements ED may be incident on the transmitting area TA thereabove symmetrically. Accordingly, the light emitted from the emission area EMA is generally incident on the center (or the central region) of the transmitting area TA, and thus the area with the maximum amount of light can be aligned with the center of the transmitting area TA when viewed from the top, so that the leakage of light can be reduced. As a result, the emission efficiency of the display device 1 can be improved.

Referring to FIGS. 15 and 16, the first reference line RLa of the light-emitting elements ED overlaps with the third reference line RLe that equally divides the emission area EMA in the first direction DR1 by adjusting the arrangement of the inner banks IBK disposed in the emission area EMA.

The shape of the first inner bank IBK1 may be identical to that of the second inner bank IBK2 when viewed from the top. For example, the width W3 of the first inner bank IBK1 in the first direction DR1 may be equal to the width W4 of the second inner bank IBK2 in the first direction DR1.

When the width W3 of the first inner bank IBK1 in the first direction DR1 is equal to the width W4 of the second inner bank IBK2, in order to dispose the light-emitting elements ED so that the first reference line RLa overlaps with the third reference line RLe, the distance dI1 between the left side of the emission area EMA and the side of the first inner bank IBK1 facing it may be different from the distance dI2 between the right side of the emission area EMA and the side of the second inner bank IBK2 facing it. Alternatively, the distance dI1 between the outer bank OBK extended in the second direction DR2 on the left side of the emission area EMA to partition the emission area EMA and the first inner bank IBK1 may be different from the distance dI2 between the outer bank OBK extended in the second direction DR2 on the right side of the emission area EMA to partition the emission area EMA and the second inner bank IBK2. In an embodiment, the distance dI1 between the left side of the emission area EMA and the first inner bank IBK1 may be greater than the distance dI2 between the right side of the emission area EMA and the second inner bank IBK2.

Figure 17:
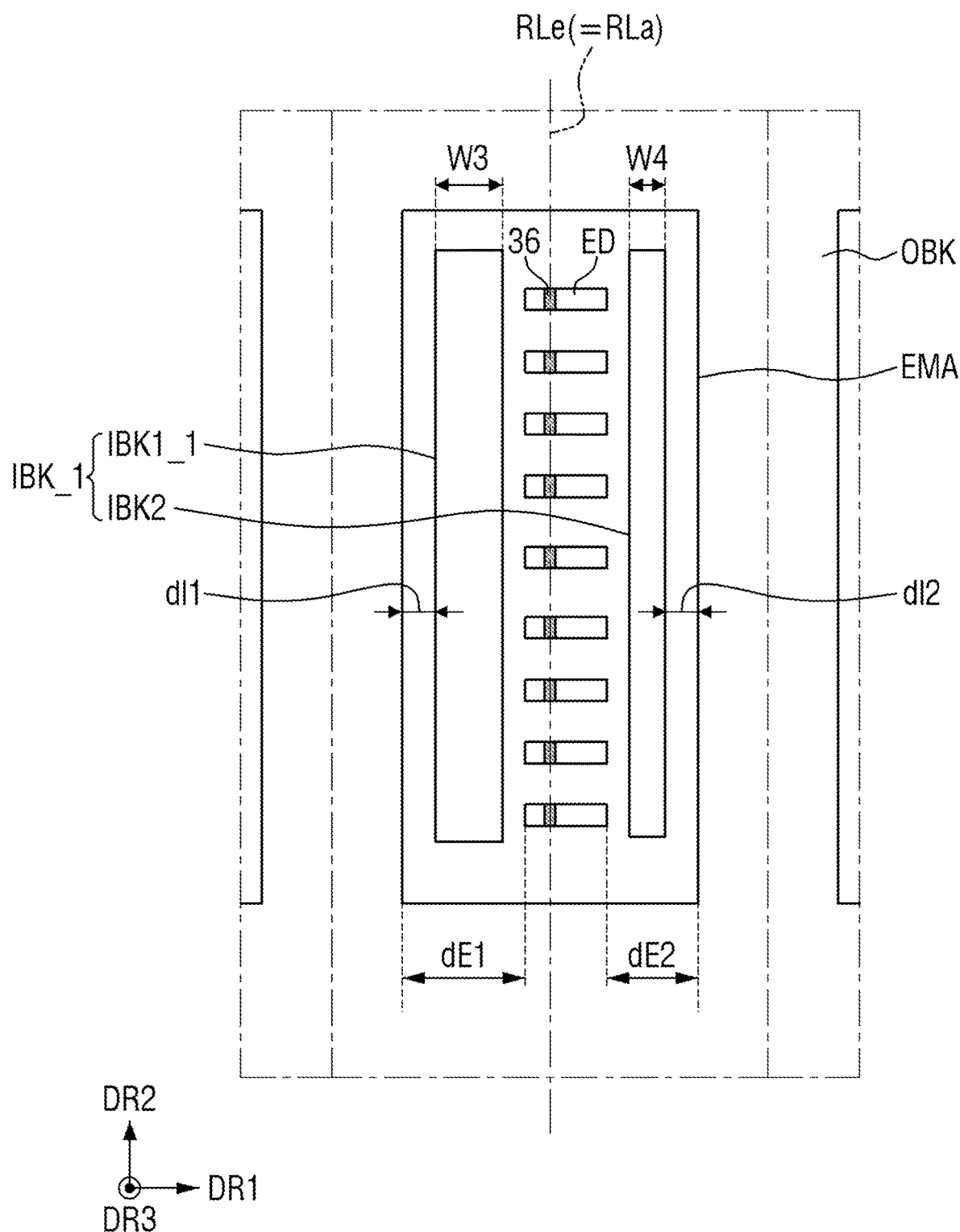
FIG. 17 is a plan view showing a layout of a light-emitting element layer according to another embodiment of the present disclosure.

FIG. 17 is a plan view showing a layout of a light-emitting element layer according to another embodiment of the present disclosure.

Referring to FIG. 17, a first reference line RLa of light-emitting elements ED overlaps with a third reference line RLe that equally divides the emission area EMA in the first direction DR1 by adjusting the shape of the inner banks IBK disposed in the emission area EMA.

For example, the shape of a first inner bank IBK1_1 may not be identical to that of a second inner bank IBK2 when viewed from the top. In other words, the width W3 of the first inner bank IBK1_1 in the first direction DR1 may be different from the width W4 of the second inner bank IBK2 in the first direction DR1. For example, the width W3 of the first inner bank IBK1_1 in the first direction DR1 may be greater than the width W4 of the second inner bank IBK2 in the first direction DR1.

In order to dispose the light-emitting elements ED so that the first reference line RLa overlaps with the third reference line RLe, the distance dI1 between the left side of the emission area EMA and the side of the first inner bank IBK1_1 facing it may be equal to the distance dI2 between the right side of the emission area EMA and the side of the second inner bank IBK2 facing it while the width W3 of the first inner bank IBK1_1 in the first direction DR1 may be greater than the width W4 of the second inner bank IBK2 in the first direction DR1. The distance dI1 between the outer bank OBK extended in the second direction DR2 on the left side of the emission area EMA to partition the emission area EMA and the first inner bank IBK1_1 may be equal to the distance dI2 between the outer bank OBK extended in the second direction DR2 on the right side of the emission area EMA to partition the emission area EMA and the second inner bank IBK2. In an embodiment, the width W3 of the first inner bank IBK1_1 may be greater than the width W4 of the second inner bank IBK2, and the inner banks IBK may be arranged so that the distance dI1 between the left side of the emission area EMA and the first inner bank IBK1_1 is equal to the distance dI2 between the right side of the emission area EMA and the second inner bank IBK2 disposed on the right side of the emission area EMA, such that the first and third reference lines RLa and RLe overlap each other.

Hereinafter, other embodiments of the present disclosure will be described. In the following description, the same or similar elements will be denoted by the same or similar reference numerals, and redundant descriptions will be omitted or briefly described. Descriptions will be made focusing on differences from the above embodiment.

Figure 18:
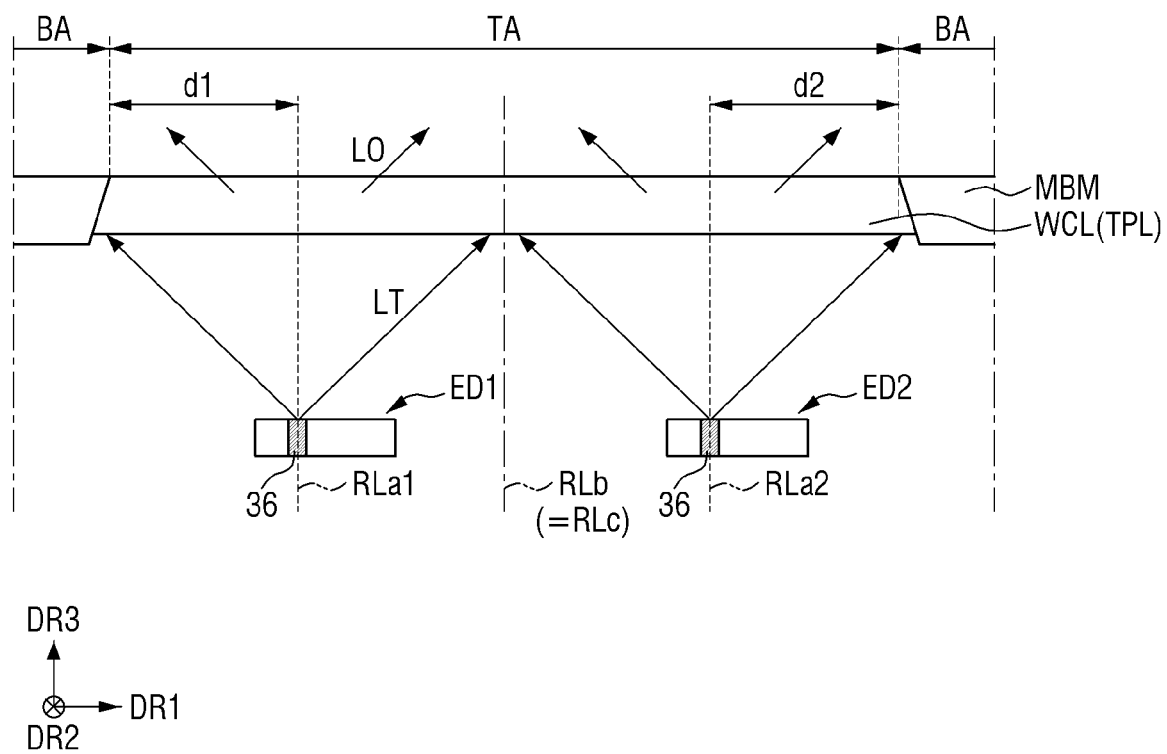
FIG. 18 is a conceptual diagram for illustrating a relative cross-sectional arrangement between active layers of a plurality of light-emitting elements and a color control layer according to an embodiment.

FIG. 18 is a conceptual diagram for illustrating a relative cross-sectional arrangement between active layers of a plurality of light-emitting elements and a color control layer according to an embodiment.

The diagram shown in FIG. 18 is different from that of FIG. 13 in that light-emitting elements ED are arranged in a plurality of columns in each of the sub-pixels SPX.

According to this embodiment, the light-emitting elements ED disposed in each of the sub-pixels SPX may include first light-emitting elements ED1 and second light-emitting elements ED2. The first light-emitting elements ED1 and the second light-emitting elements ED2 may be spaced from each other in the first direction DR1. As shown in the drawing, the active layer 36 of the first light-emitting element ED1 and the active layer 36 of the second light-emitting element ED2 may be shifted to the same side in the direction in which the first and second light-emitting elements ED1 and ED2 are extended.

According to this embodiment, a center line between a first reference line RLa1 of the first light-emitting element ED1 and a second reference line RLa2 of the second light-emitting element ED2 is defined as a fourth reference line RLc. When the first and second light-emitting elements ED1 and ED2 are aligned with the color control layer WCL or TPL so that the fourth reference line RLc overlaps or coincides with the second reference line RLb, lights LT emitted from the first and second light-emitting elements ED1 and ED2 and incident on the color control layer WCL or TPL may be incident generally on the central area of the color control layer WCL or TPL.

When the first and second light-emitting elements ED1 and ED2 are aligned with the color control layer WCL or TPL so that the fourth reference line RLc overlaps or coincides with the second reference line RLb, a first horizontal distance d1 between the edge on one side (the left side in the drawing) of the transmitting area TA in the first direction DR1 (the left side of the transmitting area TA in FIG. 18) and the first reference line RLa1 of the first light-emitting element ED1 may be equal to a second horizontal distance d2 between the edge on the opposite side (the right side in the drawing) of the transmitting area TA in the first direction DR1 (the right side of the transmitting area TA in FIG. 18) and the first reference line RLa2 of the second light-emitting element ED2. That is to say, by adjusting the alignment of the first and second light-emitting elements ED1 and ED2 with the color control layer WCL or TPL so that the distances d1 and d2 from the both edges of the transmitting area TA in the direction parallel to the direction in which the first and second light-emitting elements ED1 and ED2 disposed at the outermost positions are extended to the first reference lines RLa1 and RLa2 are equal to each other, it is possible to reduce the leakage of the light LT emitted from the first and second light-emitting elements ED1 and ED2 and traveling toward the upper side.

Figure 19:
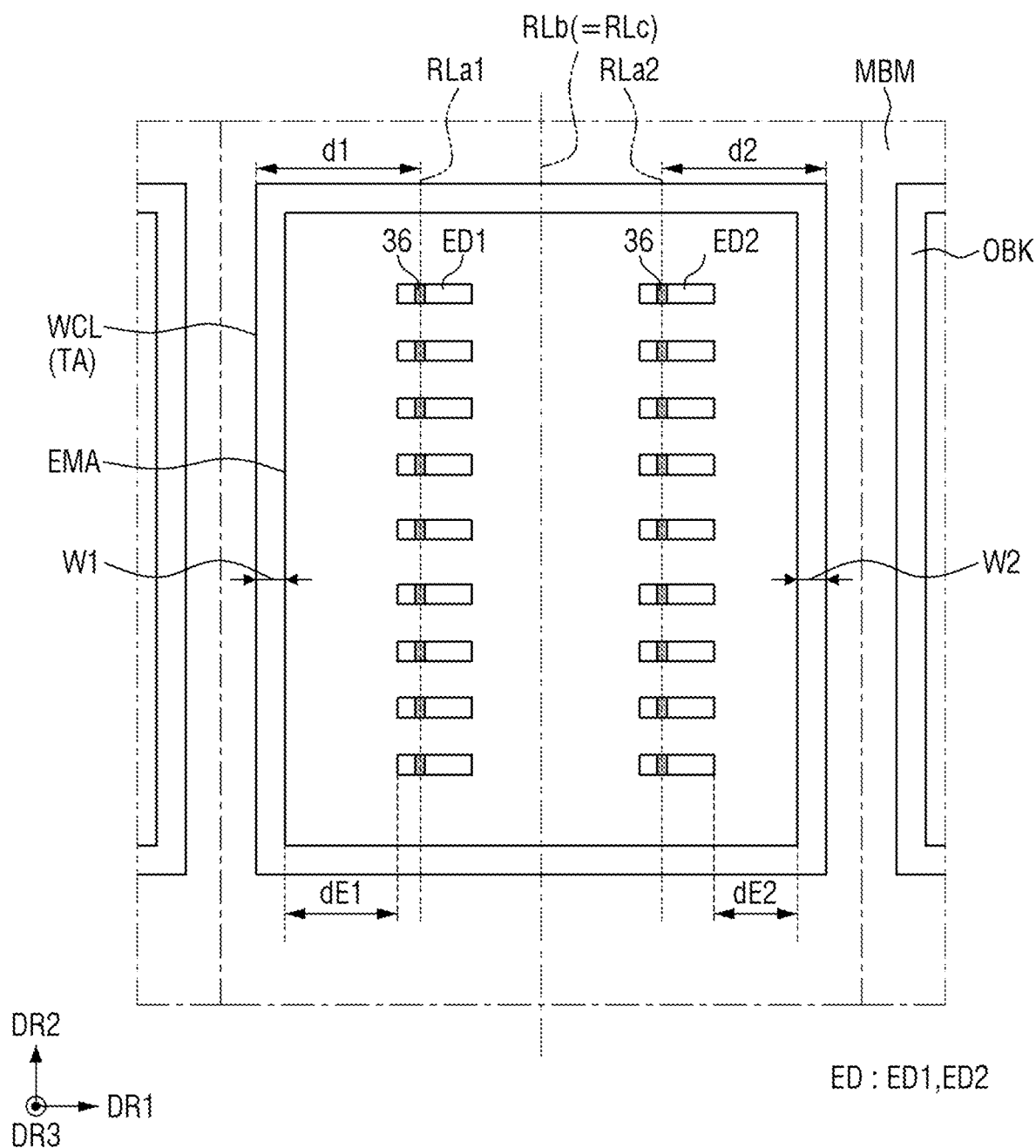
FIG. 19 is a plan view showing a layout of a light-emitting element layer according to another embodiment of the present disclosure.
Figure 20:
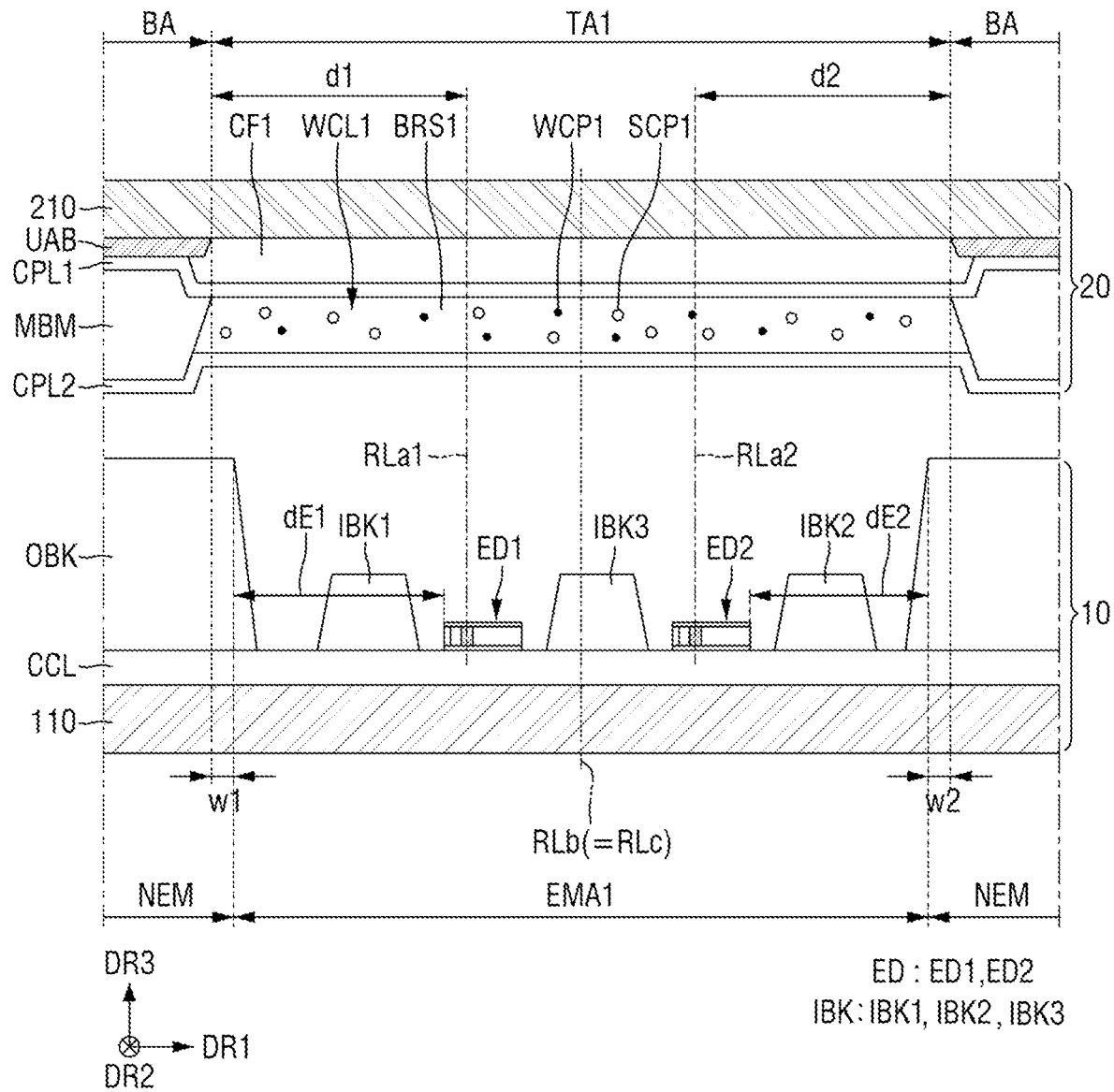
FIG. 20 is a cross-sectional view of the display device according to the embodiment of FIG. 19.

FIG. 19 is a plan view showing a layout of a light-emitting element layer according to another embodiment of the present disclosure. FIG. 20 is a cross-sectional view of the display device according to the embodiment of FIG. 19.

As described above with reference to FIG. 18, when a plurality of light-emitting elements ED is arranged in a plurality of columns in the emission area EMA, the elements of the display device may be aligned so that the fourth reference line RLc, which is the center line between the first reference lines RLa1 and RLa2 of the first and second light-emitting elements ED1 and ED2 disposed at the outermost positions overlaps with the second reference line RLb in order to increase the amount of light emitted from the light-emitting elements ED and incident on the central area of the color control layers WCL and TPL disposed thereabove.

Referring to FIGS. 19-20, according to this embodiment, the emission areas EMA of the first display substrate 10 may be disposed at the center of the transmitting areas TA of the second display substrate 20, respectively. Therefore, the width W1 between the left side of the transmitting area TA and the left side of the emission area EMA may be equal to the width W2 between the right side of the transmitting area TA and the right side of the emission area EMA.

The light-emitting elements ED may include first light-emitting elements ED1 and second light-emitting elements ED2. The first light-emitting elements ED1 may be disposed on the left side in the emission area EMA when viewed from the top, and the second light-emitting elements ED2 may be spaced from the first light-emitting elements ED1 in the first direction DR1 and disposed on the right side in the emission area EMA when viewed from the top. The first light-emitting elements ED1 and the second light-emitting elements ED2 may be spaced from the outer bank OBK in the first direction DR1.

When the first and second light-emitting elements ED1 and ED2 are arranged in two columns in the emission area EMA, the fourth reference line RLc, which is the center line between the first reference line RLa1 passing through the center of the active layer 36 of the first light-emitting element ED1 and the first reference line RLa2 passing through the center of the active layer 36 of the second light-emitting element ED2 may overlap with the second reference line RLb that equally divides the transmitting area TA in the first direction DR1 parallel to the direction in which the light-emitting elements ED are extended, as described above. As the fourth reference line RLc overlaps with the second reference line RLb, the first horizontal distance d1 between the left side of the transmitting area TA and the first reference line RLa1 of the first light-emitting element ED1 disposed adjacent to the left side of the transmitting area TA may be equal to the second horizontal distance d2 between the right side of the transmitting area TA and the first reference line RLa2 of the second light-emitting element ED2 disposed adjacent to the right side of the transmitting area TA.

As the color control layer WCL or TPL is disposed in the transmitting area TA defined by the opening partitioned by the color mixing prevention member MBM, the first horizontal distance d1 between the left side of the color control layer WCL or TPL disposed in each of the sub-pixels SPX and the first reference line RLa1 of the first light-emitting element ED1 may be equal to the second horizontal distance d2 between the right side of the color control layer WCL or TPL and the first reference line RLa2 of the second light-emitting element ED2 when viewed from the top.

According to this embodiment where the emission area EMA is located at the center of the transmitting area TA, the first and second light-emitting elements ED1 and ED2 are aligned with the transmitting area TA so that the first horizontal distance d1 between the first reference line RLa1 of the first light-emitting element ED1 and the left side of the transmitting area TA is equal to the second horizontal distance d2 between the first reference line RLa2 of the second light-emitting element ED2 and the right side of the transmitting area TA. Accordingly, the active layers 36 of the first and second light-emitting elements ED1 and ED2 are located closer to the one side in the direction in which the first and second light-emitting elements ED1 and ED2 are extended, so that the first and second light-emitting elements ED1 and ED2 may be aligned in the emission area EMA asymmetrically in the first direction DR1. For example, a distance dE1 between the first ends of the first light-emitting elements ED1 facing the left side of the emission area EMA and the left side of the emission area EMA may be different from a distance dE2 between the second ends of the second light-emitting elements ED2 facing the right side of the emission area EMA and the right side of the emission area EMA Because the light-emitting elements ED1 and ED2 are disposed in the emission area EMA defined by the opening partitioned by the outer bank OBK, the outer bank OBK disposed at the border of each of the sub-pixels SPX and forming the left side of the emission area EMA may be spaced from and face the first ends of the first light-emitting elements ED1 disposed adjacent to the outer bank OBK forming the left side of the outer bank OBK and the emission area EMA. The distance dE1 between the outer bank OBK forming the left side of the emission area EMA and the first ends of the first light-emitting elements ED1, and the distance dE1 between the left side of the emission area EMA and the first ends of the first light-emitting elements ED1 facing it may refer to the same distance. Similarly, the outer bank OBK forming the right side of the emission area EMA may be spaced from and face the second ends of the second light-emitting elements ED2 disposed adjacent to the outer bank OBK forming the right side of the emission area EMA. The distance dE2 between the outer bank OBK forming the right side of the emission area EMA and the second ends of the second light-emitting elements ED2 may refer to the same distance. Accordingly, the distance dE1 between the outer bank OBK forming the left side of the emission area EMA and the first ends of the first light-emitting elements ED1 may be different from the distance dE2 between the outer bank OBK forming the right side of the emission area EMA and the second ends of the second light-emitting elements ED2.

In the embodiment where the emission areas EMA are disposed at the center (or the central area) of the transmitting areas TA, the first and second light-emitting elements ED1 and ED2 are aligned in the emission area EMA so that the first horizontal distance d1 between the left side of the transmitting area TA and the first reference line RLa1 of the first light-emitting element ED1 is equal to the second horizontal distance d2 between the right side of the transmitting area TA and the first reference line RLa2 of the second light-emitting elements ED2, and thus the first and second light-emitting elements ED1 and ED2 may be shifted so that they are closer to one side in the first direction DR1 in the emission area EMA. It is to be noted that the fourth reference line RLc and the second reference line RLb overlap each other and the first and second light-emitting elements ED1 and ED2 and the color control layers WCL and TPL are aligned so that the first horizontal distance d1 between the left side of the transmitting area TA and the first reference line RLa1 of the first light-emitting elements ED1 is equal to the second horizontal distance d2 between the right side of the transmitting area TA and the first reference line RLa2 of the second light-emitting elements ED2, and thus the light emitted from the light-emitting elements ED1 and ED2 may be incident on the transmitting area TA thereabove symmetrically. Accordingly, the light emitted from the emission area EMA is generally incident on the center (or the central region) of the transmitting area TA, and thus the area with the maximum amount of light can be aligned with the center of the transmitting area TA when viewed from the top, so that the leakage of light can be reduced. As a result, the emission efficiency of the display device 1 can be improved.

The alignment of the first light-emitting elements ED1 and the second light-emitting elements ED2 in the emission area EMA may be adjusted by the arrangement of the inner banks IBK as shown in FIG. 20.

For example, the inner banks IBK may include first to third inner banks IBK1, IBK2, and IBK3. The first to third inner banks IBK1, IBK2, and IBK3 may have the same width in the first direction DR1. The first inner bank IBK1 may be disposed adjacent to the outer bank OBK on the left side of the emission area EMA, and the second inner bank IBK2 may be disposed adjacent to the outer bank OBK on the right side of the emission area EMA. The third inner bank IBK3 may be disposed between the first inner bank IBK1 and the second inner bank IBK2 and may be spaced from each of the first inner bank IBK1 and the second inner bank IBK2. The first light-emitting elements ED1 may be disposed in the space between the first inner bank IBK1 and the third inner bank IBK3, and the second light-emitting elements ED2 may be disposed in the space between the second inner bank IBK2 and the third inner bank IBK3.

In order to align the first and second light-emitting elements ED1 and ED2 in the emission area EMA so that the first horizontal distance d1 between the left side of the transmitting area TA and the first reference line RLa1 of the first light-emitting elements ED1 is equal to the second horizontal distance d2 between the right side of the transmitting area TA and the first reference line RLa2 of the second light-emitting elements ED2, the distance between the first inner bank IBK1 and the outer bank OBK adjacent to the first inner bank IBK1 may be different from the distance between the second inner bank IBK2 and the outer bank OBK adjacent to the second inner bank IBK2.

Figure 21:
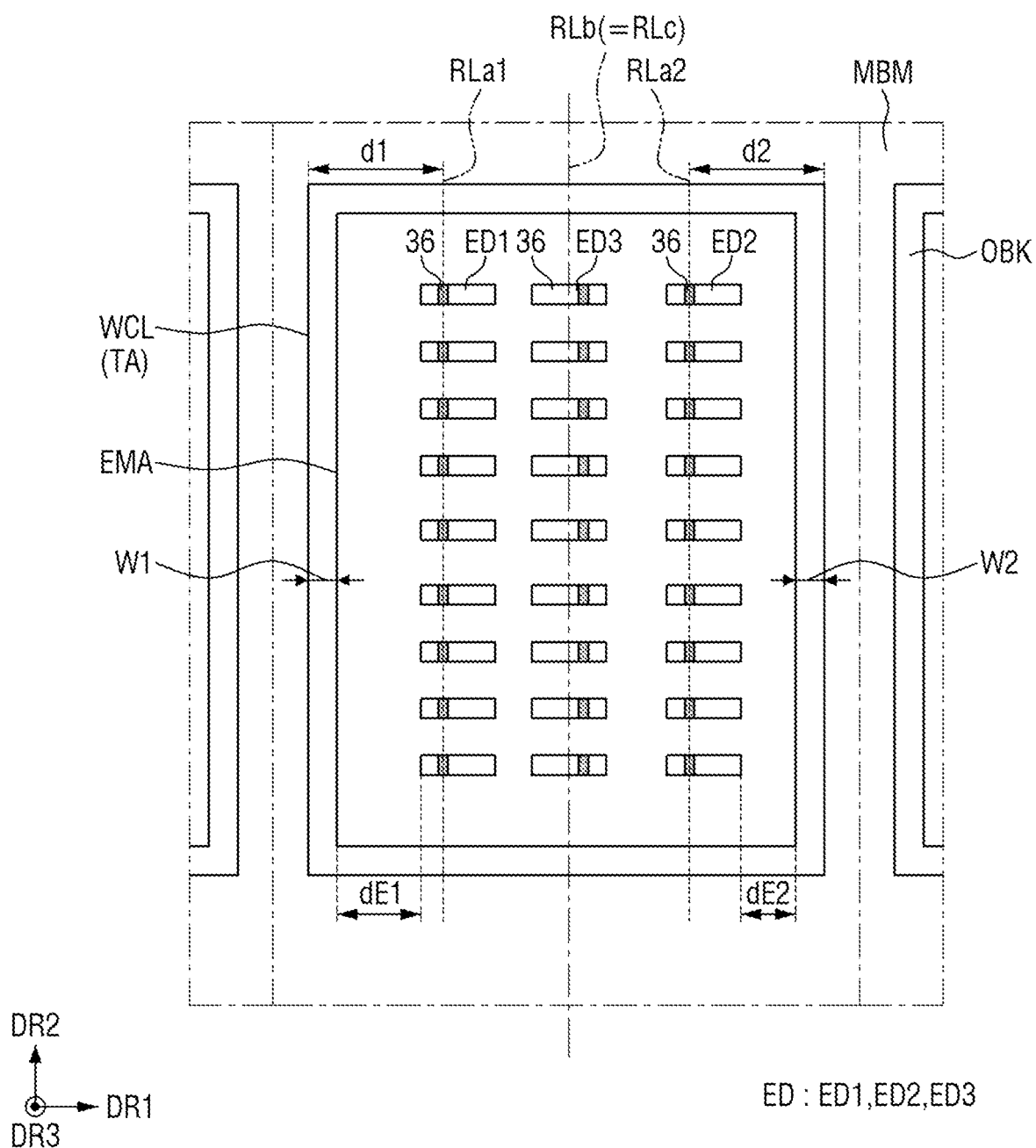
FIG. 21 is a plan view showing the layout of a light-emitting element layer according to yet another embodiment of the present disclosure.
Figure 22:
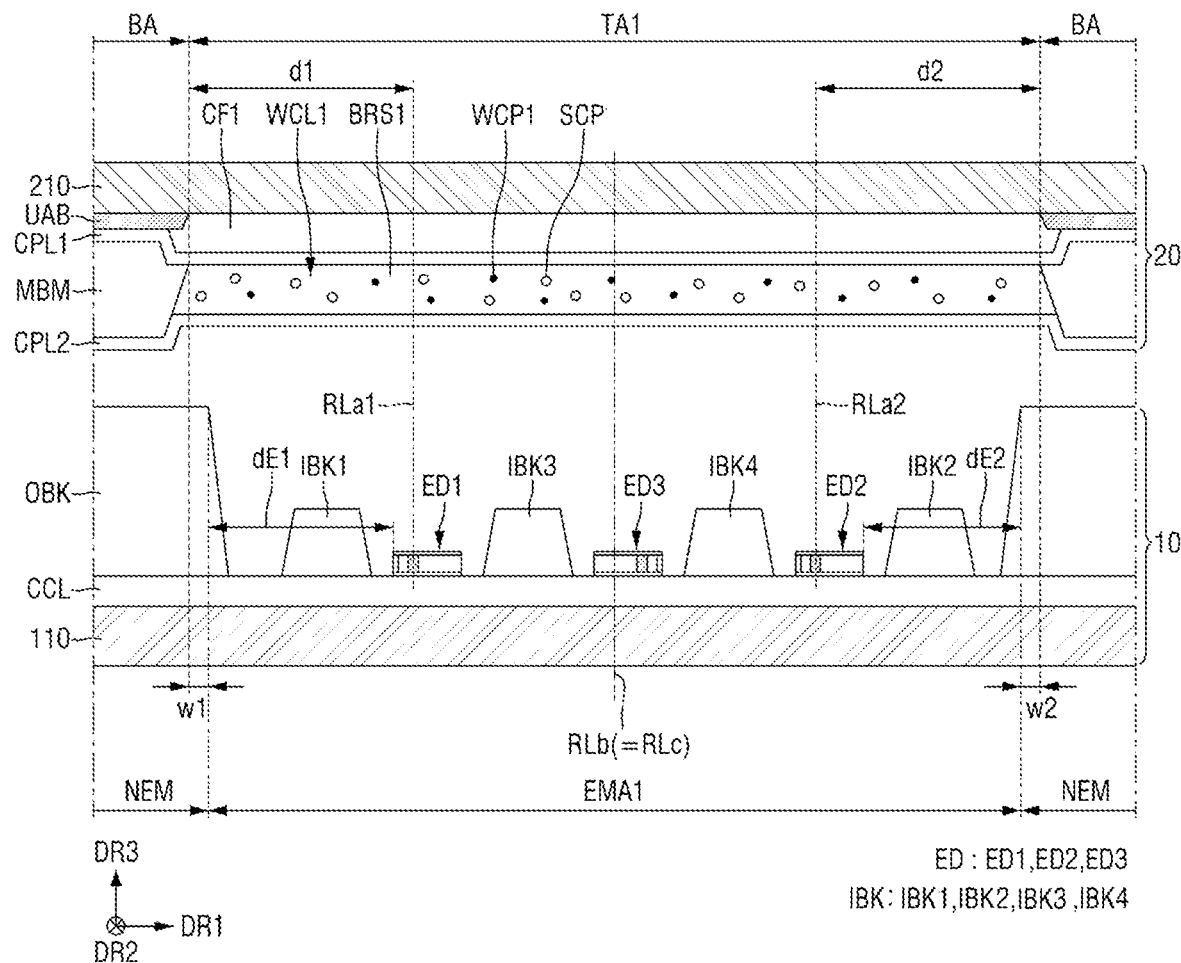
FIG. 22 is a cross-sectional view of the display device according to the embodiment of FIG. 21.

FIG. 21 is a plan view showing the layout of a light-emitting element layer according to yet another embodiment of the present disclosure. FIG. 22 is a cross-sectional view of the display device according to the embodiment of FIG. 21.

A display device according to the embodiment of FIGS. 21 and 22 is different from the embodiment of FIGS. 19 and 20 in that a plurality of light-emitting elements ED disposed in the emission area EMA of each of the sub-pixels SPX comprises first to third light-emitting elements ED1, ED2, and ED3 disposed in first to third columns, respectively.

Even when the first to third light-emitting elements ED1, ED2, and ED3 are arranged in the first to third columns, respectively, in the emission area EMA, in order to increase the amount of light emitted from the light-emitting elements ED and incident on the central areas of the color control layer WCL or TPL, the elements of the display device may be aligned so that the fourth reference line RLc, which is the center line between the first reference lines RLa1 and RLa2 of the first and second light-emitting elements ED1 and ED2 disposed at the outermost positions, overlaps with the second reference line RLb.

For example, according to this embodiment, the light-emitting elements ED may include first light-emitting elements ED1 to third light-emitting elements ED3. The first light-emitting elements ED1 may be disposed on the left side in the emission area EMA when viewed from the top, the second light-emitting elements ED2 may be spaced from the first light-emitting elements ED1 in the first direction DR1 and disposed on the right side in the emission area EMA when viewed from the top, and the third light-emitting elements ED3 may be disposed between the first light-emitting elements ED1 and the second light-emitting elements ED2 in the emission area EMA and spaced from each of the first light-emitting elements ED1 and the second light-emitting elements ED2 in the first direction DR1 when viewed from the top. The first light-emitting elements ED1 and the second light-emitting elements ED2 may be spaced from the outer bank OBK in the first direction DR1, and may be located at the outermost positions in the emission area EMA.

According to this embodiment, the first to third light-emitting elements ED1, ED2, and ED3 may be disposed between a plurality of inner banks IBK. For example, the inner banks IBK may further include a fourth inner bank IBK4, compared to the embodiment of FIG. 20. The fourth inner bank IBK4 may be disposed between the second inner bank IBK2 and the third inner bank IBK3. The third light-emitting element ED3 may be disposed between the third inner bank IBK3 and the fourth inner bank IBK4.

Regardless of whether the active layer 36 of each of the third light-emitting elements ED3 is shifted to which side in the first direction DR1, when the first and second light-emitting elements ED1 and ED2 and the color control layer WCL or TPL are aligned so that the fourth reference line RLc, which is the center line between the first reference lines RLa1 and RLa2 of the first and second light-emitting elements ED1 and ED2 disposed at the outermost positions in the first direction DR1 in the emission area EMA, overlaps with the second reference line RLb, light emitted from the first to third light-emitting elements ED1, ED2, and ED3 and incident on the color control layer WCL or TPL thereabove may be incident generally on the central area of the color control layer WCL or TPL.

Figure 23:
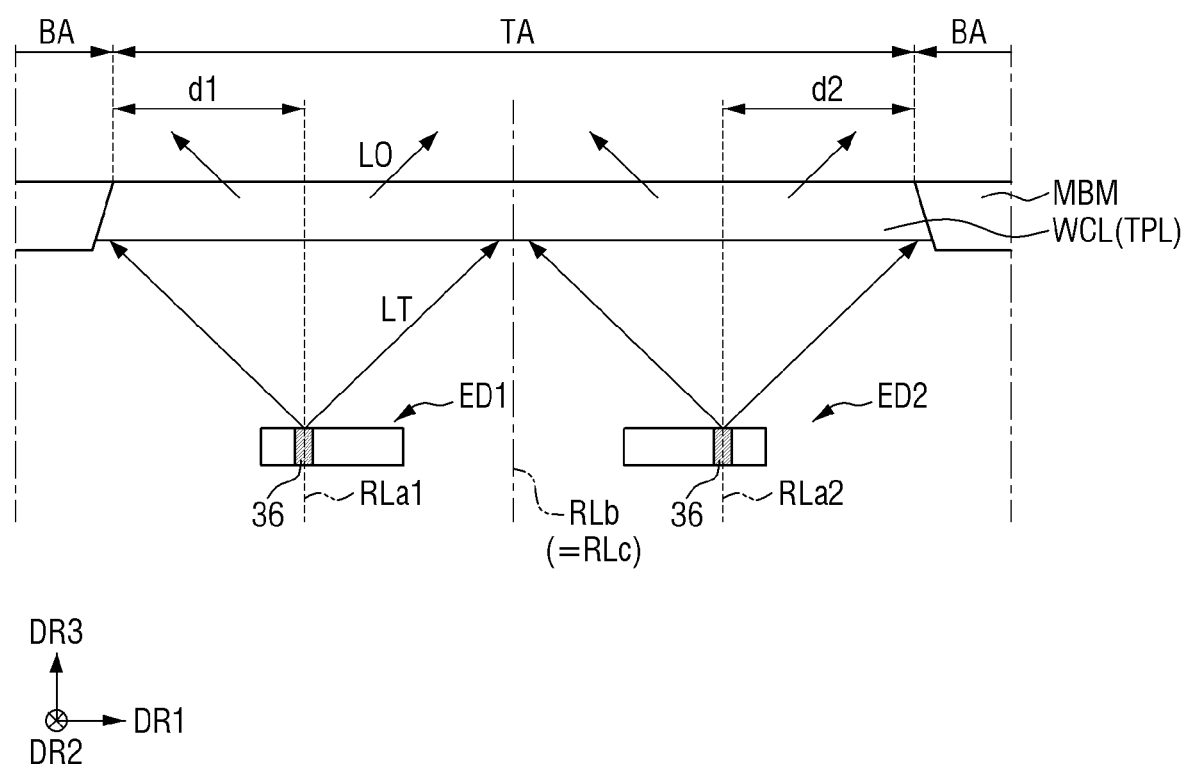
FIG. 23 is a conceptual diagram for illustrating a relative cross-sectional arrangement between active layers of a plurality of light-emitting elements and a color control layer according to another embodiment.
Figure 24:
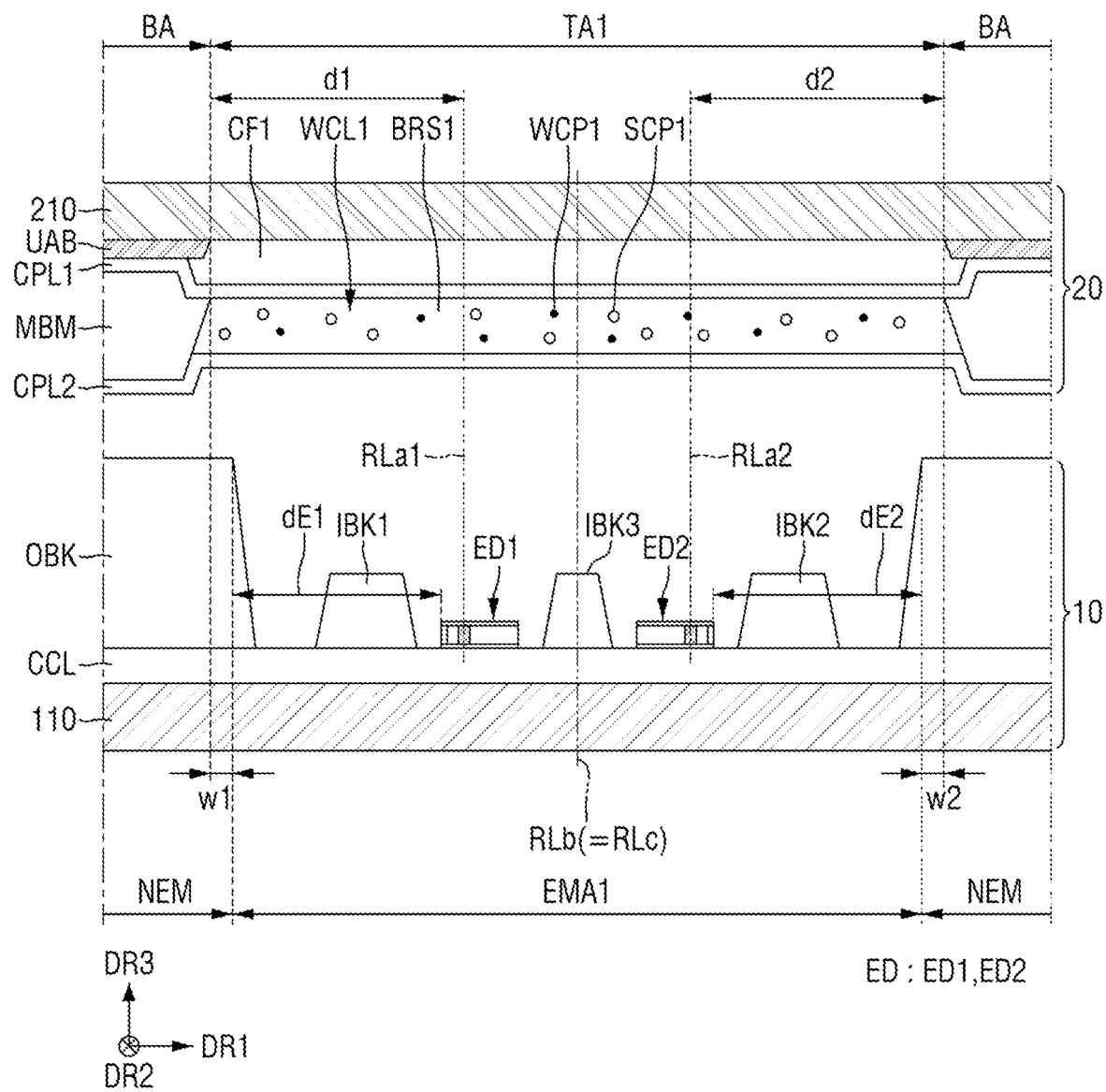
FIG. 24 is a cross-sectional view of the display device according to the embodiment of FIG. 23.

FIG. 23 is a conceptual diagram for illustrating a relative cross-sectional arrangement between active layers of a plurality of light-emitting elements and a color control layer according to another embodiment. FIG. 24 is a cross-sectional view of the display device according to the embodiment of FIG. 23.

A display device according to the embodiment of FIGS. 23 and 24 is different from the display device according to the embodiment of FIGS. 18 and 20 in that active layers 36 of first and second light-emitting elements ED1 and ED2 disposed in the emission area EMA face in the opposite directions.

For example, as shown in the drawing, the active layer 36 of the first light-emitting element ED1 and the active layer 36 of the second light-emitting element ED2 may be shifted to the opposite sides in the direction in which the first and second light-emitting elements ED1 and ED2 are extended.

According to this embodiment, a center line between a first reference line RLa1 of the first light-emitting element ED1 and a second reference line RLa2 of the second light-emitting element ED2 is defined as a fourth reference line RLc. When the first and second light-emitting elements ED1 and ED2 are aligned with the color control layer WCL or TPL so that the fourth reference line RLc overlaps or coincides with the second reference line RLb, lights LT emitted from the first and second light-emitting elements ED1 and ED2 and incident on the color control layer WCL or TPL may be incident generally on the central area of the color control layer WCL or TPL.

When the first and second light-emitting elements ED1 and ED2 are aligned with the color control layer WCL or TPL so that the fourth reference line RLc overlaps or coincides with the second reference line RLb, a first horizontal distance d1 between the edge on one side (the left side in the drawing) of the transmitting area TA in the first direction DR1 (the left side of the transmitting area TA in FIG. 24) and the first reference line RLa1 of the first light-emitting element ED1 may be equal to a second horizontal distance d2 between the edge on the opposite side (the right side in the drawing) of the transmitting area TA in the first direction DR1 (the right side of the transmitting area TA in FIG. 24) and the first reference line RLa2 of the second light-emitting element ED2.

According to this embodiment, although the active layers 36 of the first and second light-emitting elements ED1 and ED2 face in the opposite directions, the first horizontal distance d1 between the left side of the transmitting area TA and the first reference line RLa1 of the first light-emitting elements ED1 is equal to the second horizontal distance d2 between the right side of the transmitting TA and the first reference line RLa2 of the second light-emitting elements ED2, and thus the light LT emitted from the first and second light-emitting elements ED1 and ED2 and traveling to the upper side may be incident symmetrically with respect to the transmitting area TA.

Figure 25:
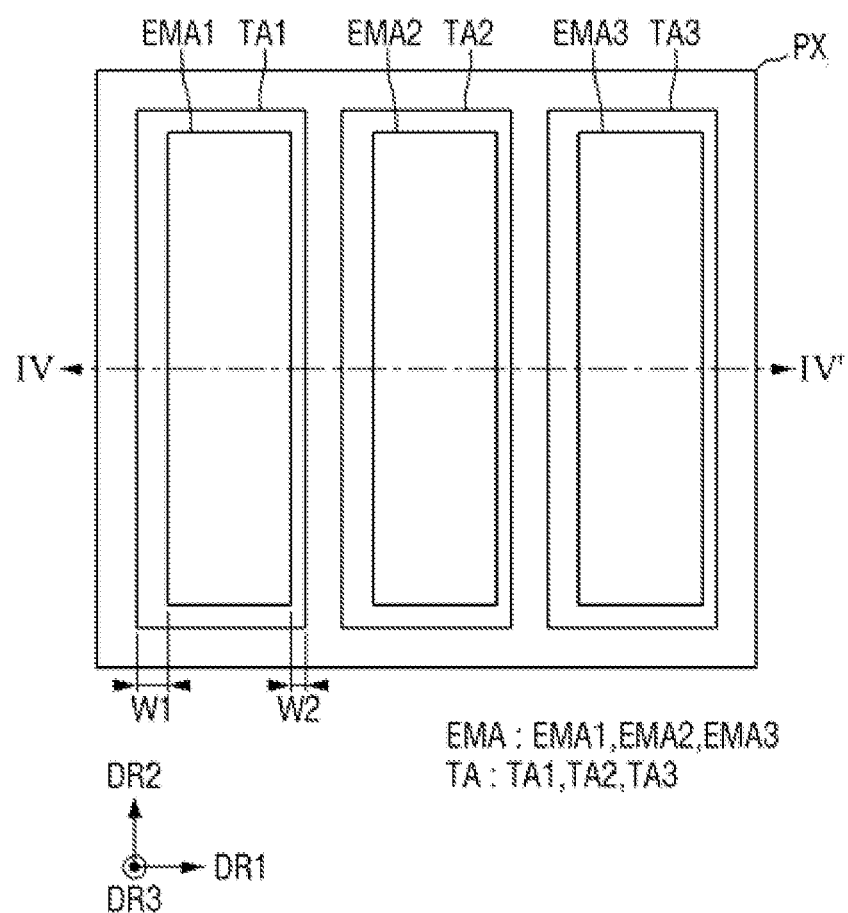
FIG. 25 is a plan view showing a relative arrangement of emission areas and transmitting areas included in one pixel of a display device according to another embodiment.
Figure 26:
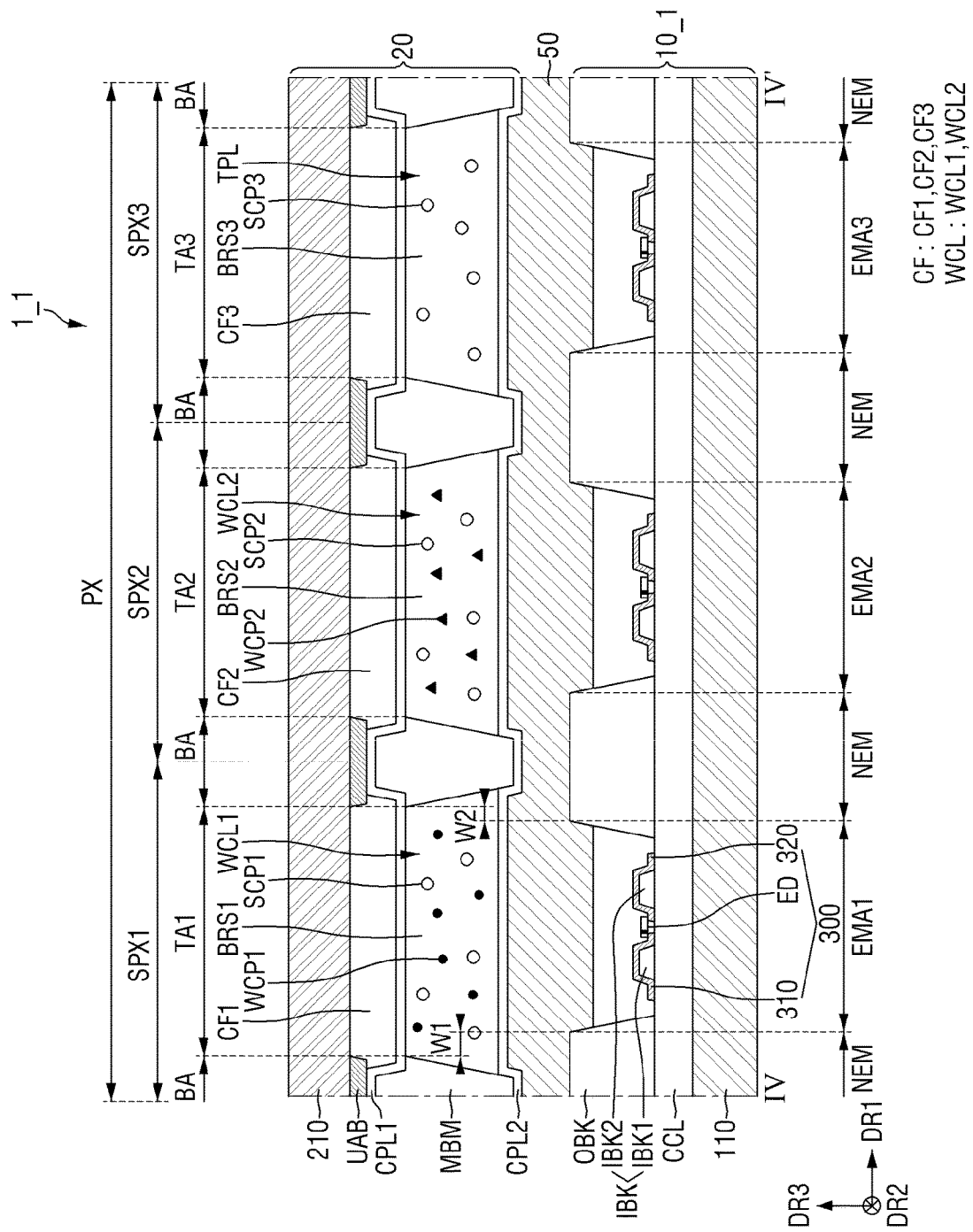
FIG. 26 is a cross-sectional view of a display device, taken along line IV-IV' of FIG. 25.
Figure 27:
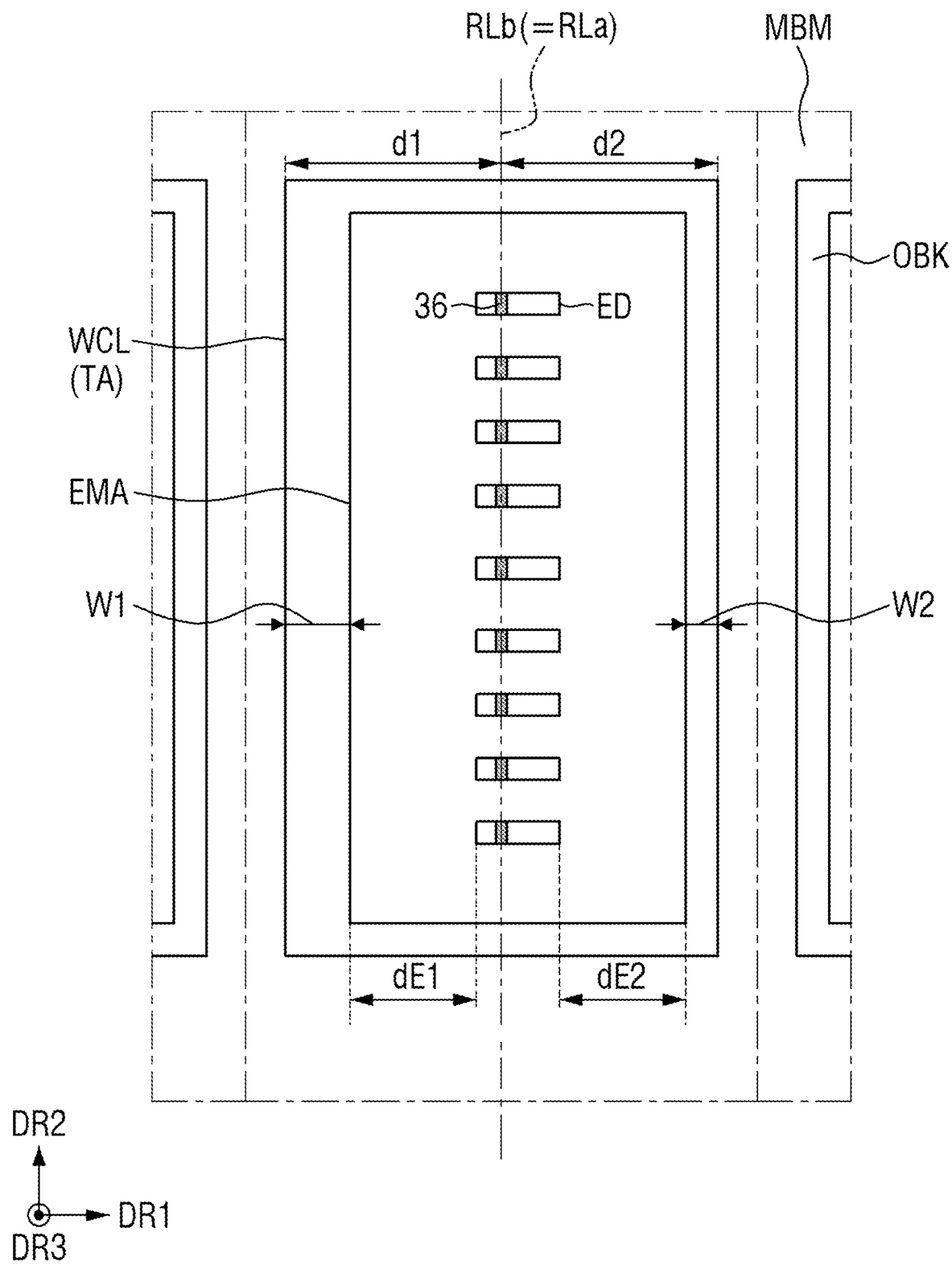
FIG. 27 is a plan view showing a relative arrangement of a transmitting area, an emission area and a plurality of light-emitting elements according to the embodiment of FIG. 25.
Figure 28:
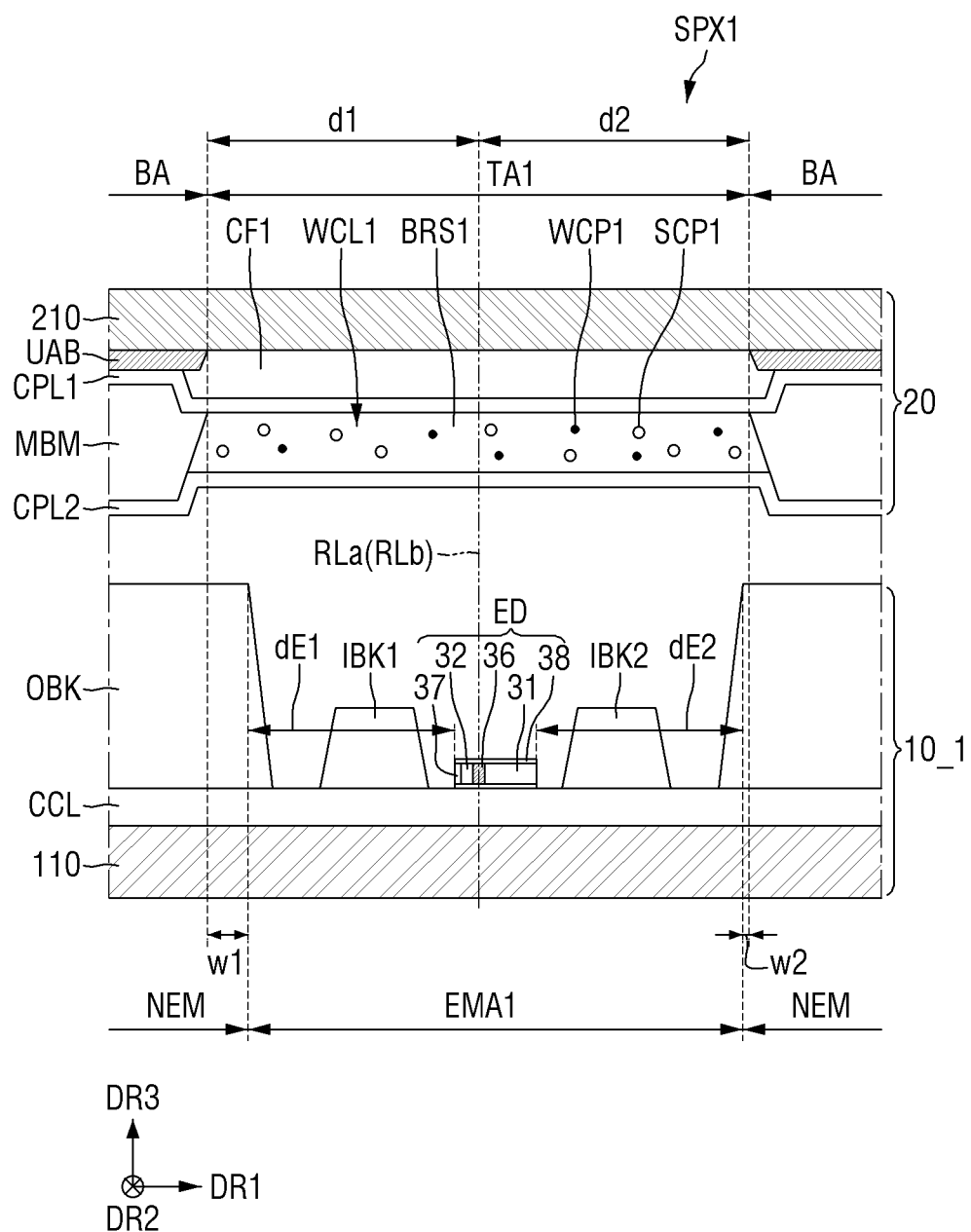
FIG. 28 is a cross-sectional view of a first sub-pixel of the display device according to the embodiment of FIG. 25.

FIG. 25 is a plan view showing a relative arrangement of emission areas and transmitting areas included in one pixel of a display device according to another embodiment. FIG. 26 is a cross-sectional view of a display device, taken along the line IV-IV' of FIG. 25. FIG. 27 is a plan view showing a relative arrangement of a transmitting area TA, an emission area EMA, and a plurality of light-emitting elements LD according to the embodiment of FIG. 25. FIG. 28 is a cross-sectional view of a first sub-pixel SPX1 of the display device according to the embodiment of FIG. 25.

As described above with reference to FIG. (a) of FIG. 13, when a plurality of light-emitting elements ED is arranged in a single column in the emission area EMA, the elements of the display device may be align so that the first reference line RLa and the second reference line RLb overlap each other in order to increase the amount of light emitted from the light-emitting elements ED and incident on the central area of the color control layers WCL and TPL disposed thereabove.

As described above, in order to align the first display substrate 10_1 with the second display substrate 20 so that the first reference line RLa and the second reference line RLb overlap each other, they may be aligned so that the arrangement of the light-emitting elements ED is symmetrical in the emission area EMA, while the transmitting area TA and the emission area EMA of each of the sub-pixels SPX are shifted to one side in the first direction DR1 when viewed from the top.

Hereinafter, an embodiment will be described with reference to FIGS. 25-28, in which a first reference line RLa and a second reference line RLb overlap each other by aligning a transmitting area TA with an emission area EMA shifted to one side in the first direction DR1 in each of the sub-pixels SPX while light-emitting elements ED are arranged symmetrically in the emission area EMA when viewed from the top.

A display device 10_1 according to the embodiment of FIGS. 25 and 26 is different from the display device according to the embodiment of FIGS. 5 and 6 in that emission areas EMA of a first display substrate 10_1 in a pixel PX are shifted to one side in the first direction DR1 from the center of transmitting areas TA of a second display substrate 20, respectively.

For example, the emission areas EMA of the first display substrate 10_1 may overlap the transmitting areas TA of the second display substrate 20 in the thickness direction DR3, respectively, and may be shifted so that they are located closer to one side. The first direction DR1 in which the emission area EMA is shifted in the transmitting area TA may be parallel to the direction in which the light-emitting elements ED disposed in the first display substrate 10 are extended. When the emission areas EMA are smaller than the transmitting areas TA, the distances between the sides of the emission areas EMA and the corresponding sides of the transmitting areas TA may not be uniform along the border when they overlap each other. The width W1 between the left side of the emission area EMA and the left side of the transmitting area TA may be different from the width W2 between the right side of the emission area EMA and the right side of the transmitting area TA. For example, the width W1 between the left side of the emission area EMA and the left side of the transmitting area TA may be greater than the width W2 between the right side of the emission area EMA and the right side of the transmitting area TA.

According to this embodiment of FIGS. 26-28, in which the light-emitting elements ED are arranged in a single column in the emission area EMA so that they are symmetrical, the emission areas EMA of each of the sub-pixels SPX may be aligned with the respective transmitting areas TA such that they are shifted to on side in the first direction DR1 so that the first reference line RLa and the second reference line RLb overlap each other.

According to this embodiment, the light-emitting elements ED may be arranged in the emission area EMA such that they are symmetrical in the first direction DR1 so that the distance dE1 between the left side of the emission area EMA and first ends of the light-emitting elements ED facing it may be equal to the distance dE2 between the right side of the emission area EMA and second ends of the light-emitting elements ED facing it.

Because the light-emitting elements ED are disposed in the emission area EMA defined by the opening partitioned by the outer bank OBK, the outer bank OBK disposed around each of the sub-pixels SPX and forming the left side of the emission area EMA may face the first ends of the light-emitting elements ED. The distance dE1 between the outer bank OBK forming the left side of the emission area EMA and the first ends of the light-emitting elements ED, and the distance dE1 between the left side of the emission area EMA and the first ends of the light-emitting elements ED may refer to the same distance. Similarly, the distance dE2 between the outer bank OBK forming the right side of the emission area EMA and the second ends of the light-emitting elements ED, and the distance dE2 between the right side of the emission area EMA and the second ends of the light-emitting elements ED may refer to the same distance. Accordingly, the distance dE1 between the outer bank OBK forming the left side of the emission area EMA and the first ends of the light-emitting elements ED may be equal to the distance dE2 between the outer bank OBK forming the right side of the emission area EMA and the second ends of the light-emitting elements ED.

As the light-emitting elements ED are arranged symmetrically in the emission area EMA in the first direction DR1, the first reference line RLa of the light-emitting elements ED may be shifted to one side (for example, the end of the light-emitting element ED where the active layer 36 is located) from the center line that equally divides the emission area EMA in the first direction DR1. Accordingly, in order to dispose the first display substrate 10_1 and the second display substrate 20 so that the first horizontal distance d1 between the first reference line RLa and the left side of the transmitting area TA is equal to the second horizontal distance d2 between the first reference line RLa and the right side of the transmitting area TA and thus the first reference line RLa overlaps with the second reference line RLb, the emission area EMA may be aligned so that it is shifted in the first direction DR1 from the transmitting area TA.

In the described embodiment where the light-emitting elements ED are arranged symmetrically in the first direction DR1 in the emission areas EMA, by adjusting the alignment of the emission areas EMA of the first distance substrate 10_1 with the transmitting areas TA of the second display substrate 20 so that the first horizontal distance d1 between the left side of the transmitting area TA and the first reference line RLa is equal to the second horizontal distance d2 between the right side of the transmitting area TA and the first reference line RLa, the emission areas EMA may be shifted to one side in the transmitting areas TA. It is to be noted that the first reference line RLa and the second reference line RLb overlap each other and the light-emitting elements ED and the color control layers WCL and TPL are aligned so that the first horizontal distance d1 between the left side of the transmitting area TA and the first reference line RLa is equal to the second horizontal distance d2 between the right side of the transmitting area TA and the first reference line RLa, and thus the light emitted from the light-emitting elements ED may be incident on the transmitting area TA thereabove symmetrically. Accordingly, the light emitted from the emission area EMA is generally incident on the center of the transmitting area TA, and thus the area with the maximum amount of light can be aligned with the center of the transmitting area TA when viewed from the top, so that the leakage of light can be reduced. As a result, the emission efficiency of the display device 1_1 can be improved.

Figure 29:
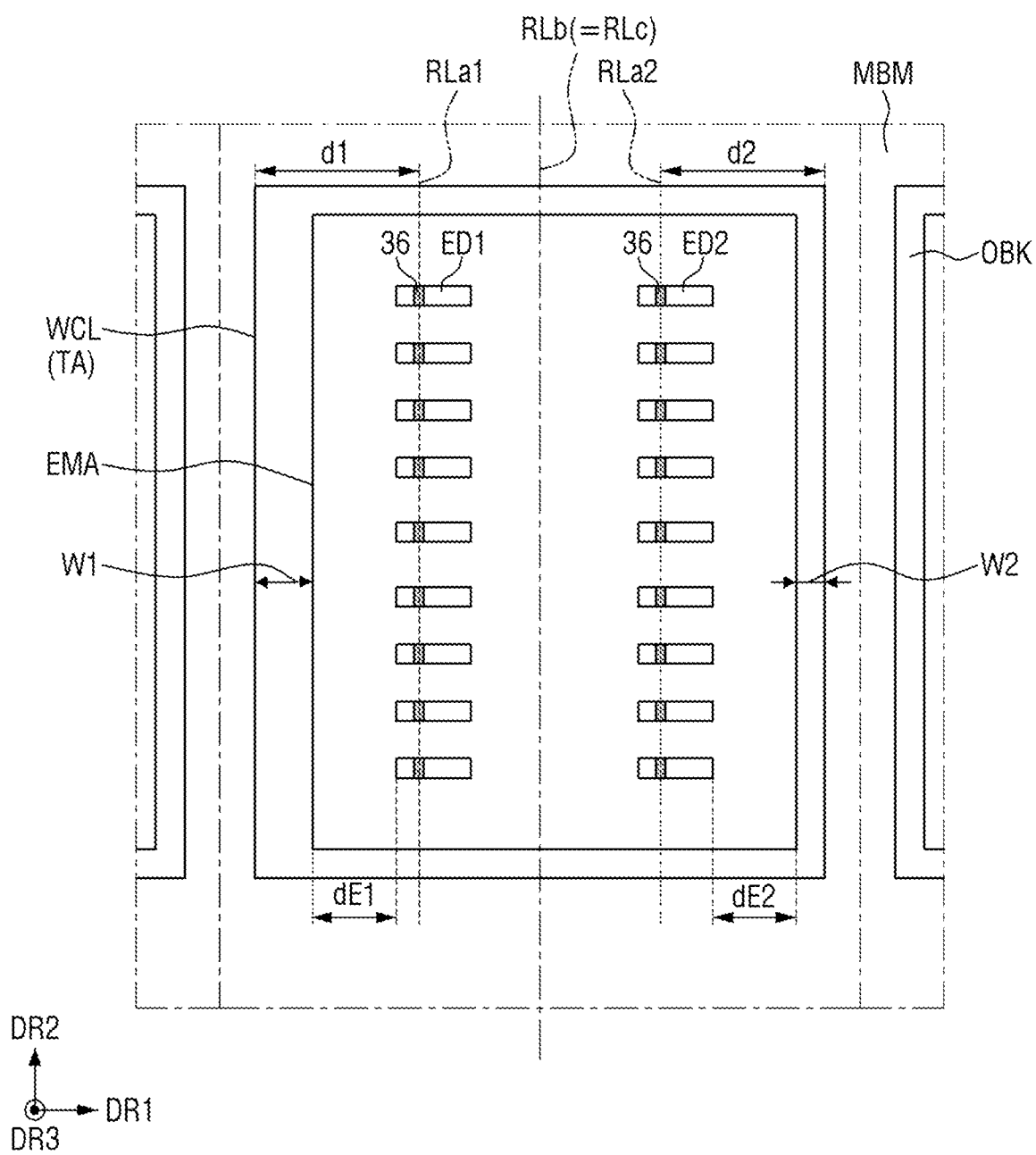
FIG. 29 is a plan view showing a layout of a light-emitting element layer according to another embodiment of the present disclosure.
Figure 30:
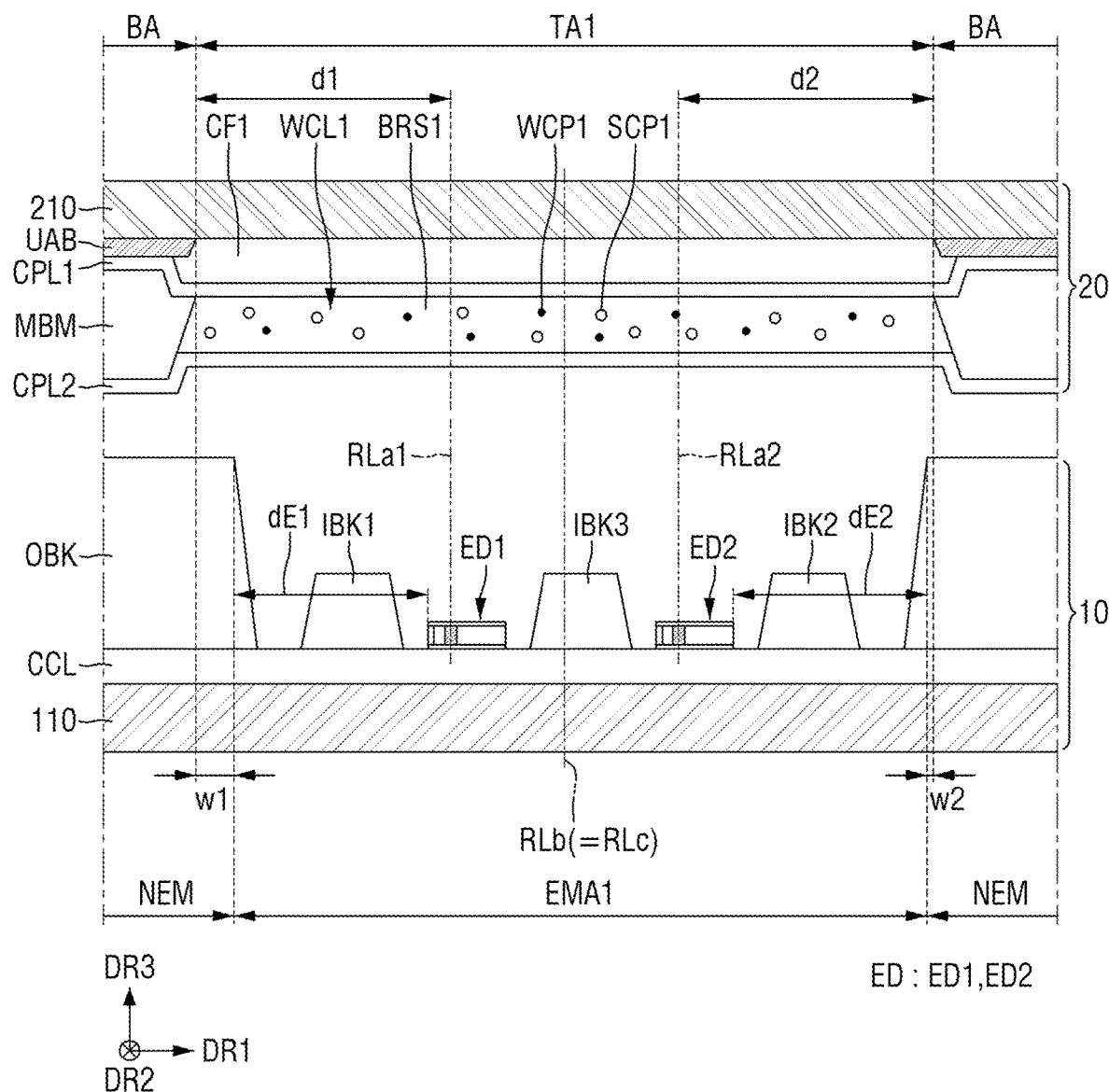
FIG. 30 is a cross-sectional view of the display device according to the embodiment of FIG. 29.

FIG. 29 is a plan view showing a layout of a light-emitting element layer according to another embodiment of the present disclosure. FIG. 30 is a cross-sectional view of the display device according to the embodiment of FIG. 29.

As described above with reference to FIG. 18, when a plurality of light-emitting elements ED is arranged in a plurality of columns in the emission area EMA, the elements of the display device may be aligned so that the fourth reference line RLc, which is the center line between the first reference lines RLa1 and RLa2 of the first and second light-emitting elements ED1 and ED2 disposed at the outermost positions overlaps with the second reference line RLb in order to increase the amount of light emitted from the light-emitting elements ED and incident on the central area of the color control layers WCL and TPL disposed thereabove.

Referring to FIGS. 20 and 30, the first light-emitting elements ED1 may be disposed on the left side in the emission area EMA when viewed from the top, and the second light-emitting elements ED2 may be spaced from the first light-emitting elements ED1 in the first direction DR1 and disposed on the right side in the emission area EMA when viewed from the top. According to this embodiment, the first light-emitting elements ED1 and the second light-emitting elements ED2 may be arranged symmetrically in the first direction DR1 in the emission area EMA. For example, a distance dE1 between the first ends of the first light-emitting elements ED1 facing the left side of the emission area EMA and the left side of the emission area EMA may be equal to a distance dE2 between the second ends of the second light-emitting elements ED2 facing the right side of the emission area EMA and the right side of the emission area EMA Because the light-emitting elements ED1 and ED2 are disposed in the emission area EMA defined by the opening partitioned by the outer bank OBK, the outer bank OBK disposed at the border of each of the sub-pixels SPX and forming the left side of the emission area EMA may be spaced from and face the first ends of the first light-emitting elements ED1 disposed adjacent to the outer bank OBK forming the left side of the outer bank OBK and the emission area EMA. As described above, the distance dE1 between the outer bank OBK forming the left side of the emission area EMA and the first ends of the first light-emitting elements ED1, and the distance dE1 between the left side of the emission area EMA and the first ends of the first light-emitting elements ED1 facing it may refer to the same distance. Similarly, the outer bank OBK forming the right side of the emission area EMA may be spaced from and face the second ends of the second light-emitting elements ED2 disposed adjacent to the outer bank OBK forming the right side of the emission area EMA. As described above, the distance dE2 between the outer bank OBK forming the right side of the emission area EMA and the second ends of the second light-emitting elements ED2 may refer to the same distance. Accordingly, the distance dE1 between the outer bank OBK forming the left side of the emission area EMA and the first ends of the first light-emitting elements ED1 may be equal to the distance dE2 between the outer bank OBK forming the right side of the emission area EMA and the second ends of the second light-emitting elements ED2.

In an embodiment where the first and second light-emitting elements ED1 and ED2 are arranged symmetrically in the emission areas EMA, by adjusting the alignment of the transmitting area TA with the emission area EMA so that the first horizontal distance d1 between the left side of the transmitting area TA and the first reference line RLa1 of the first light-emitting elements ED1 is equal to the second horizontal distance d2 between the right side of the transmitting areas TA and the first reference line RLa2 of the second light-emitting elements ED2, the emission area EMA may be shifted to one side in the transmitting areas TA. Accordingly, the first display substrate 10_1 and the second display substrate 20 may be shifted and aligned so that the distance W1 between the left side of the emission area EMA and the left side of the transmitting area TA is different from the distance W2 between the right side of the emission area EMA and the right side of the transmitting area TA.

According to this embodiment, although the first and second light-emitting elements ED1 and ED2 are arranged symmetrically in the first direction DR1 in the emission area EMA, the emission area EMA and the transmitting area TA are aligned so that they are shifted relative to each other in the first direction DR1, the fourth reference line RLc and the second reference line RLb overlap each other so that the first horizontal distance d1 between the left side of the transmitting area TA and the first reference line RLa1 of the first light-emitting elements ED1 is equal to the second horizontal distance d2 between the right side of the transmitting area TA and the first reference line RLa2 of the second light-emitting elements ED2, and the first and second light-emitting elements ED1 and ED2 are aligned with the color control layer. Accordingly, the light emitted from the plurality of light-emitting elements ED1 and ED2 may be symmetrically incident on the transmitting area TA thereabove. Accordingly, the light emitted from the emission area EMA is generally incident on the center of the transmitting area TA, and thus the area with the maximum amount of light can be aligned with the center of the transmitting area TA when viewed from the top, so that the leakage of light can be reduced. As a result, the emission efficiency of the display device 1 can be improved.

Figure 31:
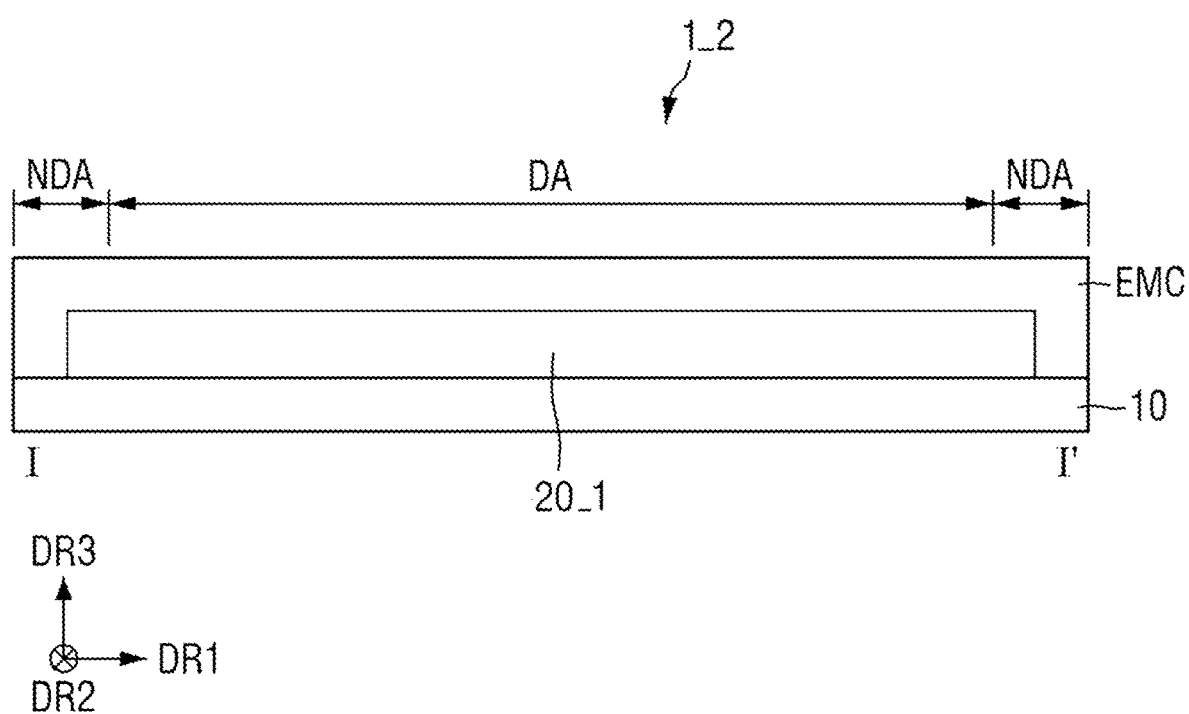
FIG. 31 is a cross-sectional view of another example of the display device, taken along the line I-I' of FIG. 1.
Figure 32:
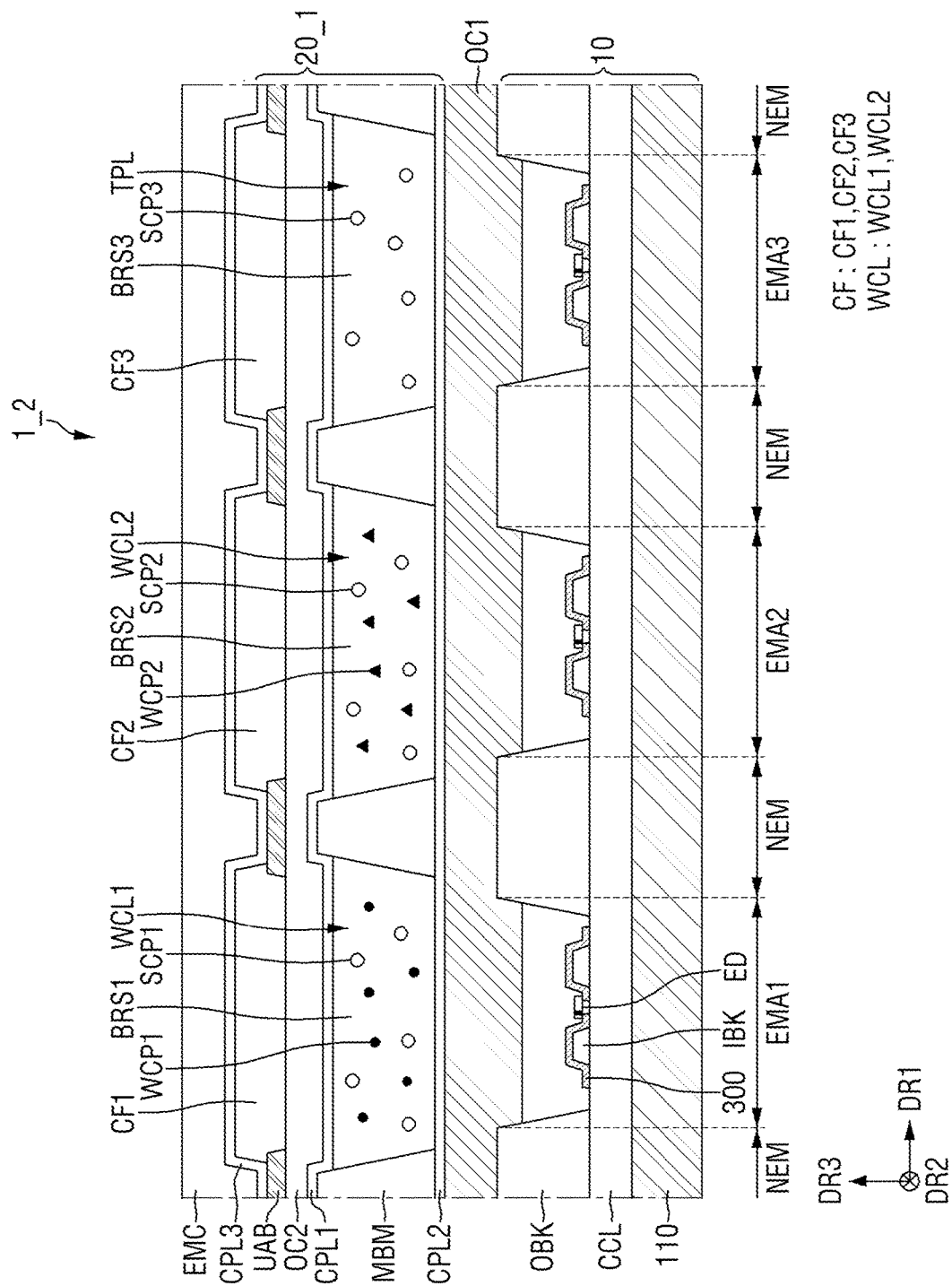
FIG. 32 is a cross-sectional view of the display device according to the embodiment of FIG. 31.

FIG. 31 is a cross-sectional view of another example of the display device, taken along the line I-I' of FIG. 1. FIG. 32 is a cross-sectional view of the display device according to the embodiment of FIG. 31.

A display device 1_2 according to the embodiment of FIGS. 31 and 32 is different from the embodiment of FIG. 6 in that a second display substrate 20_1 is stacked (e.g., sequentially stacked) over the first display substrate 10, and the filling layer 50 and the sealing member 70 disposed between the first display substrate 10 and the second display substrate 20 as shown in FIGS. 2 and 6 are eliminated, and that the display device 1_2 further comprises an encapsulation layer EMC disposed on the second display substrate 20_1. In addition, according to this embodiment, the second base substrate 210 may be eliminated from the second display substrate 20_1.

For example, a first planarization layer OC1 may be disposed on the first display substrate 10. The first planarization layer OC1 may be disposed on the first display substrate 10 and may provide a flat surface over a surface level difference of the first display substrate 10 formed by the elements of the first display substrate 10. The upper surface of the first planarization layer OC1 may be flat. The first planarization layer OC1 may include an organic material. For example, the first planarization layer OC1 may be at least one of an acrylic resin, an epoxy resin, a phenol resin, a polyamide resin, and a polyimide resin.

The second capping layer CPL2 may be disposed on the first planarization layer OC1. The second capping layer CPL2 may seal the lower surfaces of the wavelength conversion layers WCL and the transparent pattern TPL.

An color mixing prevention member MBM may be disposed on the second capping layer CPL2. Color control layers WCL and TPL, i.e., a first wavelength conversion pattern WCL1, a second wavelength conversion pattern WCL2, and a transparent pattern TPL may be disposed in regions partitioned by the color mixing prevention member MBM. A first capping layer CPL1 may be disposed on the color control layers WCL and TPL. The first capping layer CPL1 may be disposed over the color control layers WCL and TPL and the color mixing prevention member MBM to cover the color control layers WCL and TPL and the color mixing prevention member MBM.

A second planarization layer OC2 may be disposed on the first capping layer CPL1. The second planarization layer OC2 may be disposed on the first capping layer CPL1 and may provide a flat surface over the surface level difference created by the first and second wavelength conversion patterns WCL1 and WCL2, the transparent pattern TPL and the color mixing prevention member MBM. The second planarization layer OC2 may include an organic material. For example, the second planarization layer OC2 may be at least one of an acrylic resin, an epoxy resin, a phenol resin, a polyamide resin, and a polyimide resin.

The light-absorbing member UAB may be disposed on the second planarization layer OC2. The light-absorbing member UAB may overlap the color mixing prevention member MBM and the outer bank OBK in the third direction DR3. A color filter layer CF may be disposed on the second planarization layer OC2. The color filter layer CF may be disposed on one surface (e.g., the upper surface) of the second planarization layer OC2 on which the light-absorbing member UAB is disposed.

A third capping layer CPL3 may cover the color filter layer CF. The third capping layer CPL3 may be disposed over the color filter layer CF and the light-absorbing member UAB to protect the color filter layer CF and the light-absorbing member UAB.

The encapsulation layer EMC may be disposed on the second display substrate 20_1. The encapsulation layer EMC may be disposed in the display area DA as well as the non-display area NDA. For example, the encapsulation layer EMC may be disposed on the third capping layer CPL3 of the second display substrate 20_1. For example, the encapsulation layer ENC may include at least one inorganic film to prevent permeation of oxygen or moisture. In addition, the encapsulation layer EMC may include at least one organic film to protect the display device 1_2 from particles such as dust.

Figure 33:
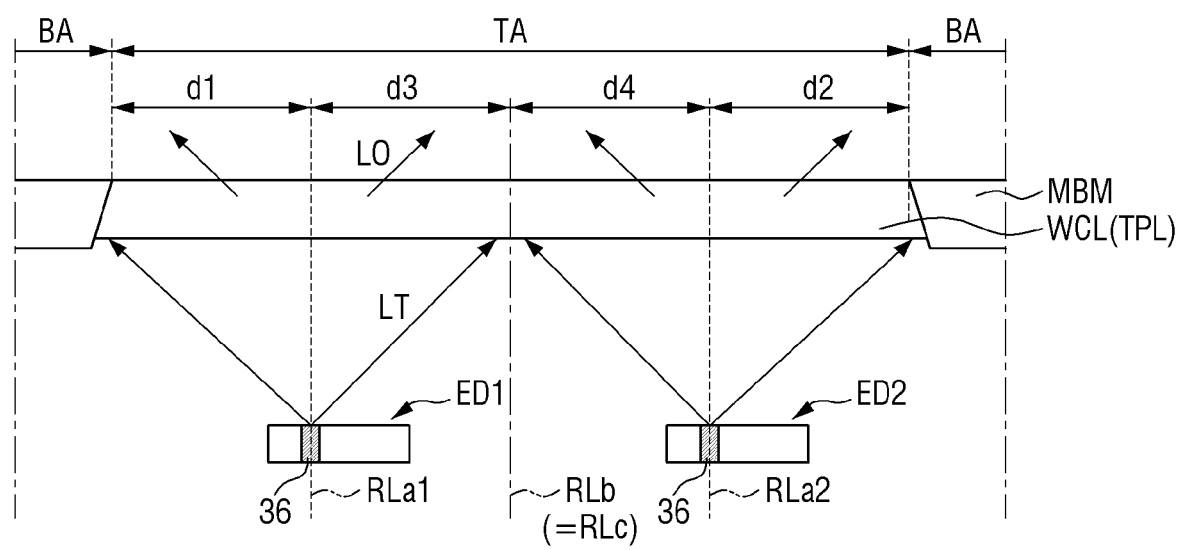
FIG. 33 is a conceptual diagram for illustrating a relative cross-sectional arrangement between active layers of a plurality of light-emitting elements and a color control layer according to another embodiment.

FIG. 33 is a conceptual diagram for illustrating a relative cross-sectional arrangement between active layers of a plurality of light-emitting elements and a color control layer according to another embodiment.

The embodiment of FIG. 33 is different from the embodiment of FIG. 18 in that the light-emitting elements ED disposed in each of the sub-pixels SPX may include a first light-emitting element ED1 and a second light-emitting element ED2, and that a first reference line RLa1 of the first light-emitting element ED1, a first reference line RLa2 of the second light-emitting element ED2 and a second reference line RLb equally divide the color control layer WCL or TPL into four parts in the direction parallel to the light-emitting elements ED, i.e., the first direction DR1.

For example, a first horizontal distance d1 between the edge of the transmitting area TA on one side (left side in the drawing) in the first direction DR1 (the left side of the transmitting area TA in FIG. 33) and the first reference line RLa1 of the first light-emitting element ED1 may be equal to a second horizontal distance d2 between the edge of the transmitting area TA on the opposite side (right side in the drawing) in the first direction DR1 (the right side of the transmitting area TA in FIG. 33) and the first reference line RLa2 of the second light-emitting element ED2. In addition, a third horizontal distance d3 between the first reference line RLa1 of the first light-emitting element ED1 and the second reference line RLb (or the fourth reference line RLc) may be equal to a fourth horizontal distance d4 between the first reference line RLa2 of the second light-emitting element ED2 and the second reference line RLb. In addition, the first to fourth horizontal distances d1, d2, d3, and d4 may be all equal. Accordingly, as described above, the first reference line RLa1 of the first light-emitting element ED1, the second reference line RLb and the first reference line RLa2 of the second light-emitting element ED2 may equally divide the color control layer WCL or TPL in the first direction DR1.

In the display device according to this embodiment, the alignment of the first and second light-emitting elements ED1 and ED2 with the color control layer WCL or TPL may be adjusted so that the distances d1 and d2 from the respective edges of the transmitting area TA, in the direction parallel to extension directions of the first and second light-emitting elements ED1 and ED2 disposed at the outermost positions, to the first reference lines RLa1 and RLa2, respectively, are equal to the distances d3 and d4 from the second reference line RLb to the first reference lines RLa1 and RLa2 of the first and second light-emitting elements ED1 and ED2, respectively. By doing so, the light LT emitted from the first and second light-emitting elements ED1 and ED2 and traveling upward toward the color control layer WCL or TPL can be uniformly incident on the color control layer WCL or TPL, so that the display quality of the display device can be improved.

In concluding the detailed description, those skilled in the art will appreciate that many variations and modifications can be made to the embodiments without substantially departing from the principles of the present disclosure. Therefore, the embodiments of the present disclosure are used in a generic and descriptive sense only and not for the purposes of limitation.

What is claimed is:

1. A display device comprising:
   a base substrate;
   an outer bank on the base substrate and having an opening defining at least one emission area;
   a light-emitting element comprising two semiconductor layers and at least an active layer between the two semiconductor layers and extending in a first direction in the emission area;
   a color mixing prevention member on the outer bank and having an opening defining a transmitting area; and
   a color control layer in the opening defined by the color mixing prevention member,
   wherein the transmitting area comprises a first side at one side in the first direction and a second side at an opposite side in the first direction when viewed from top, and
   wherein a first distance between a first reference line between the two semiconductor layers and passing through a center of the active layer of the light-emitting element in a second direction perpendicular to the first direction and the first side of the transmitting area is equal to a second distance between the second side of the transmitting area and the first reference line.

2. The display device of claim 1, wherein the emission area comprises a first side at the one side in the first direction and a second side at the opposite side in the first direction when viewed from the top, and
   wherein a distance between the first side of the emission area and the first side of the transmitting area is equal to a distance between the second side of the emission area and the second side of the transmitting area.

3. The display device of claim 2, wherein a distance between the first side of the emission area and the first reference line is equal to a distance between the second side of the emission area and the first reference line.

4. The display device of claim 2, wherein the active layer is located closer to the one side in the first direction from a center of the light-emitting element, and
   wherein a distance between the first side of the emission area and the light-emitting element is different from a distance between the second side of the emission area and the light-emitting element.

5. The display device of claim 1, wherein the emission area comprises a first side at the one side in the first direction and a second side at the opposite side in the first direction when viewed from the top, and
   wherein a distance between the first side of the emission area and the light-emitting element is equal to a distance between the second side of the emission area and the light-emitting element.

6. The display device of claim 5, wherein the active layer is located closer to the one side in the first direction from a center of the light-emitting element, and
   wherein a distance between the first side of the emission area and the first side of the transmitting area is different from a distance between the second side of the emission area and the second side of the transmitting area.

7. The display device of claim 1, wherein the first reference line overlaps with a second reference line that equally divides the transmitting area in the first direction.

8. A display device comprising:
   a base substrate;
   an outer bank on the base substrate and having an opening defining an emission area;
   first and second light-emitting elements each extending in a first direction in the emission area and comprising at least an active layer which is a layer that emits a light;
   a color mixing prevention member on the outer bank and having an opening defining a transmitting area; and
   a color control layer in the opening partitioned by the color mixing prevention member,
   wherein the transmitting area comprises a first side at one side in the first direction and a second side at an opposite side in the first direction when viewed from top,
   wherein the first light-emitting element is adjacent to the first side of the transmitting area, and the second light-emitting element is adjacent to the second side of the transmitting area,
   wherein the first light-emitting element and the second light-emitting element are spaced from each other,
   wherein a first reference line of the first light-emitting element passes through a center of the active layer of the first light-emitting element in a second direction perpendicular to the first direction, wherein a first reference line of the second light-emitting element passes through a center of the active layer of the second light-emitting element in the second direction, wherein a first distance between the first reference line of the first light-emitting element and the first side of the transmitting area is equal to a second distance between the first reference line of the second light-emitting element and the second side of the transmitting area, wherein the emission area comprises a first side at the one side in the first direction and a second side at the opposite side in the first direction when viewed from the top, and wherein a distance between the first side of the emission area and the first light-emitting element is different from a distance between the second side of the emission area and the second light-emitting element.

9. The display device of claim 8, wherein the first light-emitting element and the second light-emitting element are spaced from each other in the first direction.

10. The display device of claim 9,
wherein a distance between the first side of the emission area and the first side of the transmitting area is equal to a distance between the second side of the emission area and the second side of the transmitting area.

11. The display device of claim 10, wherein a distance between the first side of the emission area and the first reference line of the first light-emitting element is equal to a distance between the second side of the emission area and the first reference line of the second light-emitting element.

12. The display device of claim 10, wherein the active layer of the first light-emitting element is located closer to the one side in the first direction with respect to the center of the first light-emitting element, and
wherein the active layer of the second light-emitting element is located closer to the one side in the first direction with respect to the center of the second light-emitting element.

13. The display device of claim 8, wherein the first light-emitting element and the second light-emitting element are spaced from each other in the second direction perpendicular to the first direction.

14. The display device of claim 13, wherein the first light-emitting element and the first reference line of the second light-emitting element overlap each other, wherein each of the first reference line of the first light-emitting element and the first reference line of the second light-emitting element overlaps with a second reference line that equally divides the transmitting area in the first direction.

15. The display device of claim 9, wherein the active layer of the first light-emitting element is located closer to the one side in the first direction with respect to the center of the first light-emitting element,
wherein the active layer of the second light-emitting element is located closer to the one side in the first direction with respect to the center of the second light-emitting element,
wherein the active layers of the first and second light-emitting elements face in a same direction, and
wherein a distance between the first side of the emission area and the first side of the transmitting area is different from a distance between the second side of the emission area and the second side of the transmitting area.

16. A display device comprising:
a base substrate;
an outer bank on the base substrate and having an opening defining an emission area;
a light-emitting element extending in a first direction in the emission area and comprising two semiconductor layers and an active layer between the two semiconductor layers;
a color mixing prevention member on the outer bank and having an opening defining a transmitting area; and
a color control layer in the opening partitioned by the color mixing prevention member,
wherein a first reference line between the two semiconductor layers and passing through a center of the active layer in a second direction perpendicular to the first direction overlaps with a second reference line equally dividing the transmitting area in the first direction.

17. The display device of claim 16, wherein a distance between a first end of the light-emitting element and the first reference line is different from a distance between a second end of the light-emitting element and the first reference line.

18. The display device of claim 17, wherein a third reference line equally dividing the emission area in the first direction overlaps with the second reference line.

19. The display device of claim 18, wherein the emission area comprises a first side at one side in the first direction and a second side at an opposite side in the first direction when viewed from top,
wherein the first end of the light-emitting element is spaced from and faces the first side of the emission area,
wherein the second end of the light-emitting element is spaced from and faces the second side of the emission area, and
wherein a distance between the first side of the emission area and the first end of the light-emitting element is different from a distance between the second side of the emission area and the second end of the light-emitting element.

20. The display device of claim 17, wherein the emission area comprises a first side at one side in the first direction and a second side on at opposite side in the first direction when viewed from top,
wherein the first end of the light-emitting element is spaced from and faces the first side of the emission area,
wherein the second end of the light-emitting element is spaced from and faces the second side of the emission area, and
wherein a distance between the first side of the emission area and the first end of the light-emitting element is equal to a distance between the second side of the emission area and the second end of the light-emitting element.

21. The display device of claim 20, wherein the transmitting area comprises a first side at the one side in the first direction and a second side at the opposite side in the first direction when viewed from the top, and
wherein a distance between the first side of the emission area and the first side of the transmitting area is different from a distance between the second side of the emission area and the second side of the transmitting area.

* * * * *